(12) United States Patent
Koizumi et al.

(10) Patent No.: US 8,655,472 B2
(45) Date of Patent: Feb. 18, 2014

(54) SCHEDULER, SUBSTRATE PROCESSING APPARATUS, AND METHOD OF TRANSFERRING SUBSTRATES IN SUBSTRATE PROCESSING APPARATUS

(75) Inventors: Ryuya Koizumi, Tokyo (JP); Kunio Oishi, Tokyo (JP); Yoichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 410 days.

(21) Appl. No.: 13/004,208

(22) Filed: Jan. 11, 2011

(65) Prior Publication Data
US 2011/0172800 A1    Jul. 14, 2011

(30) Foreign Application Priority Data

Jan. 12, 2010 (JP) ................................. 2010-004449
May 19, 2010 (JP) ................................. 2010-115740

(51) Int. Cl.
*G06F 19/00* (2011.01)
*G06Q 10/06* (2012.01)

(52) U.S. Cl.
CPC ...... *G06Q 10/06* (2013.01); *G05B 2219/45031* (2013.01)
USPC .......................................... 700/121; 700/100

(58) Field of Classification Search
USPC .................. 700/100, 121, 149, 229
See application file for complete search history.

(56) References Cited

U.S. PATENT DOCUMENTS 5,943,230 A * 8/1999 Rinnen et al. ................... 700/18
6,519,498 B1 2/2003 Jevtic et al.
6,690,985 B2 * 2/2004 Haller et al. .................. 700/108
6,772,029 B2 8/2004 Kobayashi et al.
6,813,534 B2 * 11/2004 Sui et al. ....................... 700/121

(Continued)

FOREIGN PATENT DOCUMENTS

JP    2001-319842    11/2001
JP    2002-511193    4/2002

(Continued)

OTHER PUBLICATIONS

Inoue, M. and Koyanagawa, T., "Thermal Simulation for Predicting Substrate Temperature During Reflow Soldering Process", May/Jun. 2005, Proceedings of the 55th Electronic Components and Technology Conference, vol. 1, pp. 1021-1026.*

(Continued)

*Primary Examiner* — Mohammad Ali
*Assistant Examiner* — Kelvin Booker
(74) *Attorney, Agent, or Firm* — Wenderoth, Lind & Ponack, L.L.P.

(57) ABSTRACT

A scheduler generates not only normal substrate transferring schedules for substrates newly supplied to a substrate processing apparatus, but also substrate transferring schedules for keeping a high production quantity in the event of a failure. The scheduler is used in a substrate processing apparatus including a plurality of substrate processing sections for processing substrates, a transfer device for transferring the substrates, and a controller for controlling the substrate processing units to process the substrates and controlling the transfer device to transfer the substrates. The scheduler is incorporated in the controller for calculating a substrate transferring schedule and has a function to successively calculate substrate transferring schedules for substrates which are newly supplied to the substrate processing apparatus, and, in the event of a fault occurring in the substrate processing apparatus, to recalculate the substrate transferring schedules with an initial state represented by a state including the fault.

14 Claims, 46 Drawing Sheets

(56) References Cited

U.S. PATENT DOCUMENTS

| | | | |
|---|---|---|---|
| 6,883,158 B1* | 4/2005 | Sandstrom et al. | 700/121 |
| 6,889,105 B2* | 5/2005 | Mukuta et al. | 700/100 |
| 6,980,873 B2* | 12/2005 | Shen | 700/108 |
| 7,123,980 B2* | 10/2006 | Funk et al. | 700/121 |
| 7,280,883 B2* | 10/2007 | Kitamoto et al. | 700/121 |
| 7,304,001 B2* | 12/2007 | Miyazaki et al. | 438/758 |
| 7,449,349 B2* | 11/2008 | Wada et al. | 438/14 |
| 7,469,195 B2* | 12/2008 | Huang et al. | 702/117 |
| 7,477,960 B2* | 1/2009 | Willis et al. | 700/121 |
| 7,630,653 B2* | 12/2009 | Bonino | 399/15 |
| 7,698,107 B2* | 4/2010 | Kitamoto et al. | 700/121 |
| 7,720,559 B1* | 5/2010 | Stewart | 700/121 |
| 7,729,798 B2* | 6/2010 | Hayashida et al. | 700/218 |
| 7,769,482 B2* | 8/2010 | Pannese et al. | 700/121 |
| 7,937,175 B2* | 5/2011 | de Kleer et al. | 700/99 |
| 8,079,797 B2* | 12/2011 | Tanaka et al. | 700/228 |
| 8,145,334 B2* | 3/2012 | Do et al. | 700/103 |
| 8,165,705 B2* | 4/2012 | de Kleer et al. | 700/108 |
| 8,219,437 B2* | 7/2012 | Kuhn et al. | 700/110 |
| 8,229,585 B2* | 7/2012 | Flitsch | 700/112 |
| 8,352,069 B2* | 1/2013 | Kawasaki | 700/228 |
| 8,396,582 B2* | 3/2013 | Kaushal et al. | 700/104 |
| 2002/0165623 A1* | 11/2002 | Haller et al. | 700/31 |
| 2002/0171815 A1* | 11/2002 | Matsuyama et al. | 355/55 |
| 2003/0046034 A1* | 3/2003 | Kitamoto et al. | 702/188 |
| 2004/0012775 A1* | 1/2004 | Kinney et al. | 356/237.2 |
| 2004/0181768 A1* | 9/2004 | Krukar | 716/19 |
| 2004/0268289 A1* | 12/2004 | Sandstrom et al. | 716/19 |
| 2005/0084988 A1* | 4/2005 | Huang et al. | 700/81 |
| 2005/0251276 A1* | 11/2005 | Shen | 700/108 |
| 2007/0219660 A1* | 9/2007 | Kaneko et al. | 700/100 |
| 2007/0293974 A1* | 12/2007 | Kitamoto et al. | 700/121 |
| 2007/0294058 A1* | 12/2007 | Kitamoto et al. | 702/188 |
| 2008/0167890 A1* | 7/2008 | Pannese et al. | 705/1 |
| 2008/0216077 A1 | 9/2008 | Emani et al. | |
| 2009/0104549 A1* | 4/2009 | Sandstrom et al. | 430/30 |
| 2010/0010654 A1* | 1/2010 | de Kleer et al. | 700/97 |
| 2010/0010657 A1* | 1/2010 | Do et al. | 700/103 |
| 2010/0010845 A1* | 1/2010 | Kuhn et al. | 705/7 |
| 2010/0010952 A1* | 1/2010 | Kuhn et al. | 706/47 |
| 2010/0241251 A1* | 9/2010 | Kuhn et al. | 700/31 |
| 2012/0214396 A1* | 8/2012 | Flitsch | 454/187 |

FOREIGN PATENT DOCUMENTS

| | | |
|---|---|---|
| JP | 2002-246377 | 8/2002 |
| JP | 3995478 | 8/2007 |
| JP | 2008-263177 | 10/2008 |
| WO | 98/57358 | 12/1998 |

OTHER PUBLICATIONS

Liu J.-H.; Liao, C.-H.; Lin, R.; Ramasubramanian, V.; Yang, C. and Mullen, B., "Correlating and Simulating Substrate Parasitics in RFIC's", Jul. 2008, EE Times.*

Nakamura, S.; Hashimoto, C. and Mori, O., "Precise and Flexible Modeling for Semiconductor Wafer Fabrication", 1993, Proceedings of the 1993 Winter Simulation Conference.*

Simpson, M.L.; Cox, C.D.; Peterson, G.D. and Sayler, G.S., "Engineering in the Biological Substrate: Information Processing in Genetic Circuits", May 2004, Proceedings of the IEEE, vol. 92, No. 5.*

\* cited by examiner

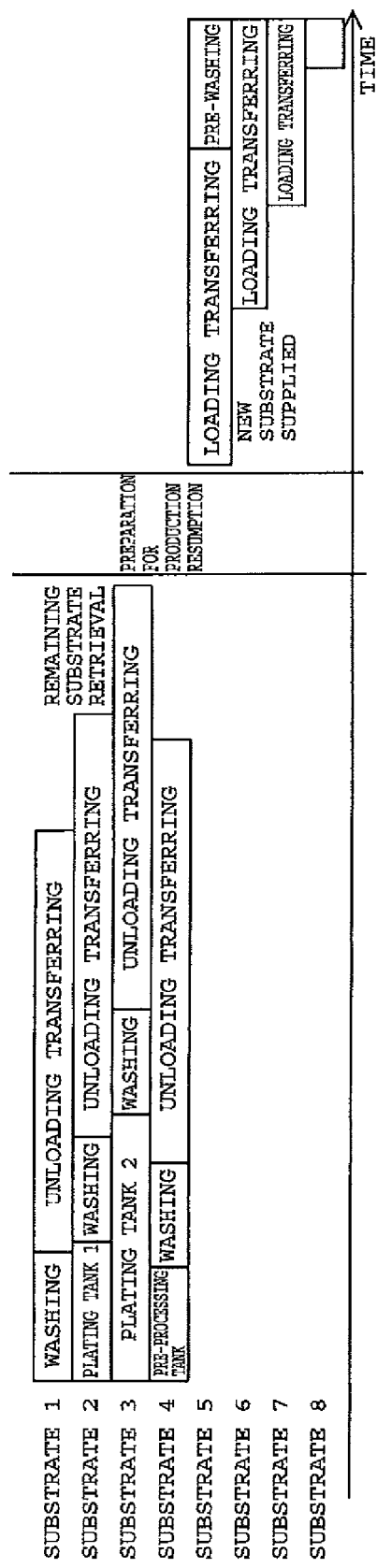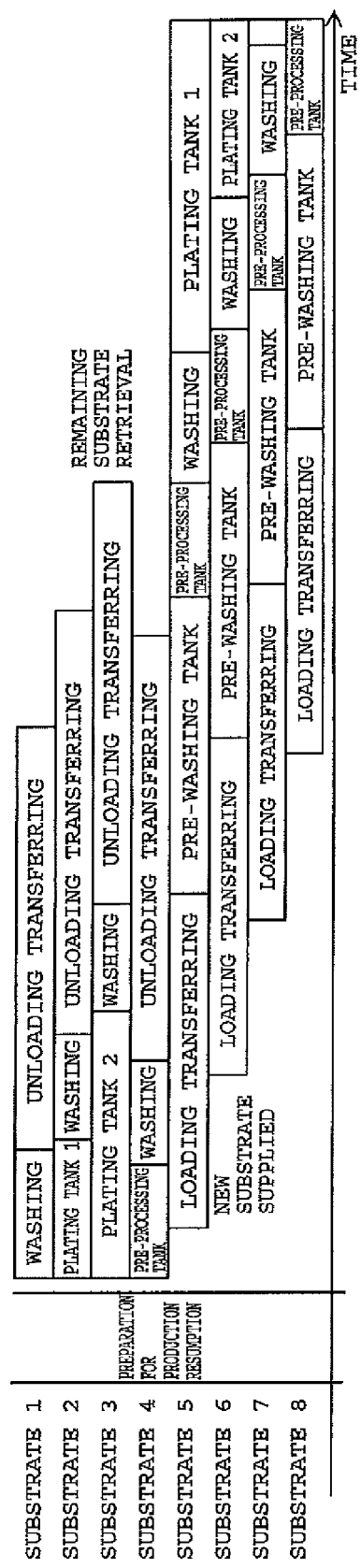

SCHEDULER, SUBSTRATE PROCESSING APPARATUS, AND METHOD OF TRANSFERRING SUBSTRATES IN SUBSTRATE PROCESSING APPARATUS

BACKGROUND OF THE INVENTION

1. Field of the Invention

The present invention relates to a scheduler installed in a controller of a substrate processing apparatus having a plurality of processing sections and a plurality of substrate transfer devices which transfer substrates that are introduced into the substrate processing apparatus successively to the processing sections to process the substrates, a substrate processing apparatus, and a method of transferring substrates in a substrate processing apparatus.

2. Description of the Related Art

Various types of substrate processing apparatus are known in the art. According to one type of substrate processing apparatus which is widely used, a plurality of substrates are successively carried out of a substrate cassette into the substrate processing apparatus and then transferred between a plurality of processing units (processing sections) by a plurality of transfer devices to process the substrates parallel to each other, after which the fully processed substrates are retrieved by the substrate cassette. Another type of substrate processing apparatus includes a plurality of substrate cassettes which can be mounted in place and replaced with other substrate cassettes. When any substrate cassette has retrieved processed substrates, it is replaced with a substrate cassette containing unprocessed substrates, so that the substrate processing apparatus can be operated continuously for processing substrates uninterruptedly.

Some substrate processing apparatuses, typically substrate plating apparatuses for forming bumps or TSVs (Through Silicon Vias) or plating re-interconnect films, are required to achieve a high production quantity, i.e., a large number of substrates processed per unit time including a recovery time from a fault, while at the same time satisfying a strict process limiting condition, i.e., a predetermined process time interval after the end of a process until the start of a next process. To meet such strict requirements, there have been proposed various scheduling schemes, e.g., a linear programming scheduler and a simulation process scheduler, for making a substrate transferring plan that is optimum for substrate transferring control in substrate plating apparatus (see Japanese laid-open patent publication No. 2001-319842 and Japanese patent 3995478).

A linear programming scheduler based on a linear programming process is an excellent scheduling process for achieving a maximum throughput while satisfying a strict process limiting condition. The linear programming scheduler is required to produce a substrate transferring schedule according to a linear programming process by formulating, in advance, a process limiting condition and a nonnegative condition such as transferring pause so that the substrate processing apparatus will finish its process on a plurality of substrates supplied thereto at the fastest rate. Therefore, the linear programming scheduler needs to maximize a regular transferring capability for transferring the substrates without fail.

On the other hand, a simulation process scheduler based on a simulation process does not guarantee a maximum throughput unlike the linear programming scheduler. However, the simulation process scheduler is advantageous in that it can flexibly produce a substrate transferring schedule for, e.g., retrieving substrates while satisfying a process limiting condition at events including a production resumption, a dynamic switching between the use and nonuse of a unit, and a substrate process failure.

SUMMARY OF THE INVENTION

When an unsteady event such as a fault or the like occurs, it is complex and difficult for the linear programming scheduler to formulate a process limiting condition and a nonnegative condition according to the linear programming process. Therefore, it is necessary to retrieve all the substrates in the substrate processing apparatus into the substrate cassette, and start transferring the substrates again. During such a substrate retrieval process, the production quantity of the substrate processing apparatus drops greatly because new substrates cannot be supplied to the substrate processing apparatus. Plating apparatuses in which a plurality of substrates are simultaneously present in operation, such as plating apparatus for forming bumps, take a long time, e.g., two hours, to retrieve the substrates.

If a rectifier fault or the like occurs in a plating processing section during a substrate process performed on a substrate in the above plating apparatus, then in order to save the substrate, it is necessary that the substrate process be interrupted and the substrate be either transferred to another plating processing section of the same type for continuing a substrate process on the substrate, or retrieved into the substrate cassette. However, the presently available scheduler does not have any scheduling means to meet such requirements. If no defective substrates are to be produced in such an occasion, therefore, it is necessary to stop starting to process subsequent new substrates, retrieve the substrate being processed into the substrate cassette under the control of an apparatus controller, and supply subsequent new substrates to the substrate processing apparatus after all substrates have been removed from the substrate processing apparatus. As a result, the throughput of the substrate processing apparatus is greatly reduced.

If a plating processing section suffers a failure while it is processing a substrate and cannot subsequently be used, then the presently available scheduler is unable to dynamically change settings for the use and nonuse of the plating processing section to continue the processing of the substrate. As a result, for changing the settings of the plating processing section, the supply of new substrates to the substrate processing apparatus needs to be temporarily stopped and the substrate processing apparatus needs to be shut down. Accordingly, the throughput of the substrate processing apparatus, i.e., the number of plated substrates, is greatly reduced.

It is an object of the present invention to provide a scheduler which is capable of generating not only a substrate transferring schedule for performing an ordinary process on substrates that are newly supplied to a substrate processing apparatus, but also a substrate transferring schedule for keeping a high throughput easily in the event of a failure, a substrate processing apparatus which incorporates such a scheduler, and a method of transferring substrates in such a substrate processing apparatus.

Another object of the present invention is to provide a scheduler which is capable of controlling a new substrate supplying schedule according to a linear programming scheduler for operation control for a maximum throughput as long as a substrate processing apparatus continues to operate normally after it has started to operate, and switching to a simulation process scheduler for flexibly producing a substrate transferring schedule for substrate retrieval or the like while meeting a process limiting condition at events including a production resumption after the substrate processing apparatus has shut down due to a processing section failure, a dynamic switching between the use and nonuse of a unit, and a substrate process failure, a substrate processing apparatus which incorporates such a scheduler, and a method of transferring substrates in such a substrate processing apparatus.

To achieve the above objects, the present invention provides a scheduler for use in a substrate processing apparatus including a plurality of substrate processing sections for processing substrates, a transfer section for transferring the substrates, and a controller for controlling the substrate processing sections to process the substrates and controlling the transfer section to transfer the substrates, the scheduler being adapted to be incorporated in the controller for calculating a substrate transferring schedule, the scheduler comprising: a function to successively calculate substrate transferring schedules for substrates which are newly supplied to the substrate processing apparatus, and, in the event of a fault occurring in the substrate processing apparatus, to recalculate the substrate transferring schedules with an initial state represented by a state including the fault.

In a preferred aspect of the present invention, the substrate transferring schedules are calculated by a transferring simulation process.

In a preferred aspect of the present invention, the substrate transferring schedules are calculated to carry out a process under conditions set respectively for the substrates to achieve at least a target processing throughput while satisfying a prescribed process limiting condition when the substrates are applied to the substrate processing apparatus.

In a preferred aspect of the present invention, the transferring simulation process generates a substrate transferring schedules to achieve a target throughput by using setting values optimized when the substrate processing apparatus has been designed, with respect to parameters representing priority of the substrate transferring schedules of the newly supplied substrates over supplied substrates which are transferred according to substrate transferring schedules generated by a previous transferring scheduling sequence, and also representing allowable delay times for delays caused in the transferring of supplied substrates by interrupts caused by the newly supplied substrates.

In a preferred aspect of the present invention, if one of the substrate processing sections suffers a fault, the substrate transferring schedules are recalculated into substrate transferring schedules for making said one of the substrate processing sections unusable and directing a supplied substrate and unprocessed substrates which are planning to use the unusable processing section to another one of processing sections which is usable.

In a preferred aspect of the present invention, the substrate transferring schedules remove a substrate from one of the substrate processing sections which suffers a fault, transfer the removed substrate to another one of the processing sections which is normal and usable to continuously process the substrate, or retrieve the removed substrate into a substrate cassette after the removed substrate is washed with water and dried.

In a preferred aspect of the present invention, the substrate transferring schedules supply the new substrates to the substrate processing apparatus while concurrently retrieving a substrate suffering a fault or a substrate remaining in one of the substrate processing sections due to a shutdown of the substrate processing apparatus which is caused by the fault of the processing sections.

In a preferred aspect of the present invention, the substrate transferring schedules supply new substrates to the substrate processing apparatus while concurrently recalculating the substrate transferring schedules to direct the supplied substrate and unprocessed substrates to the other one of processing sections which is usable.

In a preferred aspect of the present invention, the substrate transferring schedules supply new substrates to the substrate processing apparatus while concurrently removing the substrate from one of the substrate processing sections which suffers the fault and transferring the removed substrate to the other one of the processing units which is normal and usable to continuously process the substrate.

In a preferred aspect of the present invention, the substrate transferring schedules are scheduled to satisfy a process limiting condition with respect to all processes on the substrates newly supplied to the substrate processing apparatus, processes downstream of one of the substrate processing sections which start retrieving the substrate to be retrieved, and all processes on substrates whose substrate transferring schedules have been generated by a previous or earlier substrate supplying scheduling sequence.

In a preferred aspect of the present invention, the substrate transferring schedules are calculated by a transferring simulation process which has switched from a linear programming process or a linear programming process which has switched from a transferring simulation process.

In a preferred aspect of the present invention, a substrate transferring schedule for supplying a new substrate is generated by the linear programming process, and a substrate transferring schedule for retrieving a substrate to be retrieved is generated by the transferring simulation process when malfunctions of substrate processing apparatus or continuing a process on a substrate.

In a preferred aspect of the present invention, the malfunctions of substrate processing apparatus include a production resumption after the substrate processing apparatus has shut down, a dynamic switching process of unit use and nonuse, or process failure occurrence.

In a preferred aspect of the present invention, a substrate is transferred by a substrate transferring schedule generated by the transferring simulation process after the substrate processing apparatus suffers a malfunction, and thereafter when the substrate processing apparatus recovers a normal state from the malfunction, a substrate is transferred again by a substrate transferring schedule generated by the linear programming process.

In a preferred aspect of the present invention, when a transferring simulation process switches from a linear programming process or a linear programming process switches from a transferring simulation process, a substrate transferring schedule which has been scheduled and substrate process condition data at the time of switching are transferred to a scheduler in which the transferring simulation process or the linear programming process has switched.

The present invention provides a substrate transferring method for a substrate processing apparatus including a plurality of substrate processing sections for processing substrates, a transfer section for transferring the substrates, and a controller for controlling the substrate processing sections to process the substrates and controlling the transfer section to transfer the substrates, the method comprising: successively calculating substrate transferring schedules for substrates which are newly supplied to the substrate processing apparatus; and in the event of a fault occurring in the substrate processing apparatus, recalculating the substrate transferring schedules with an initial state represented by a state including the fault.

In a preferred aspect of the present invention, the substrate transferring schedules are calculated by a transferring simulation process which has switched from a linear programming process or a linear programming process which has switched from a transferring simulation process.

In a preferred aspect of the present invention, a substrate transferring schedule for supplying a new substrate is generated by the linear programming process and a substrate is transferred by the generated substrate transferring schedule, and wherein when a malfunction of the substrate processing apparatus is detected, the generated substrate transferring schedule switches to a substrate transferring schedule generated by the transferring simulation process, and a substrate transferring schedule for retrieving a substrate to be retrieved or continuing a process on a substrate and transferring a supplied substrate is generated, and a substrate is transferred by the generated substrate transferring schedule.

In a preferred aspect of the present invention, after a malfunction of the substrate processing apparatus is detected, a substrate is transferred by a substrate transferring schedule generated by the transferring simulation process, and when the substrate processing apparatus recovers a normal state from the malfunction, a substrate is transferred again by a substrate transferring schedule generated by the linear programming process.

The present invention provides a substrate processing apparatus comprising a plurality of substrate processing sections for processing substrates, a transfer section for transferring the substrates, a controller for controlling the substrate processing sections to process the substrates and controlling the transfer section to transfer the substrates, and the scheduler described above which is incorporated in the controller.

According to the present invention, a transferring simulation process is used to calculate substrate transferring schedules each for transferring one or some substrates. Therefore, it is possible to generate not only normal substrate transferring schedules for substrates newly supplied to a substrate processing apparatus, but also substrate transferring schedules for keeping a high production quantity in the event of a failure.

Particularly, upon recovery from a fault, a substrate transferring scheduling sequence is carried out to supply new substrates to the substrate processing apparatus while retrieving substrates that remain in the substrate processing apparatus. As a result, the time required to retrieve the substrates is reduced for an increased production quantity.

Furthermore, if a substrate processing unit, which is processing a substrate, suffers a fault and cannot be used any longer, then a substrate transferring scheduling sequence is carried out to automatically make the substrate processing unit unusable and make it possible to continuously process subsequent substrates. Consequently, the time to shut down the substrate processing apparatus and retrieve substrates is reduced for an increased production quantity.

In the event of a process failure occurring at a certain substrate processing section, a substrate transferring scheduling sequence is carried out to move another substrate in the substrate processing apparatus preferentially to another substrate processing section of the same type which is capable of continuously processing the substrate, while satisfying a process limiting condition (an allowable value for a process time interval after the end of the process until the start of a next process) of the substrate, or to retrieve the substrate into a substrate cassette. In this manner, any process damage to the substrate is minimized to avoid the production of defective substrates, and the production quantity is increased.

According to the present invention, substrate transferring schedules are generated by a transferring simulation process which has switched from a linear programming process or a linear programming process which has switched from a transferring simulation process. For example, a substrate transferring schedule for supplying one or some new substrates are generated by the linear programming process and one or some new substrates are transferred by the generated substrate transferring schedule, and when a malfunction of the substrate processing apparatus is detected, the generated substrate transferring schedule switches to a substrate transferring schedule generated by the transferring simulation process, and a substrate transferring schedule for retrieving a substrate to be retrieved or continuing a process on a substrate and transferring a supplied substrate is generated, and a substrate is transferred by the generated substrate transferring schedule. As long as the substrate processing apparatus continues its operation after it has started operating, the substrate processing apparatus is controlled to operate for a maximum throughput. In the event of a process failure such as a unit fault of a substrate processing unit which is processing a substrate, a substrate transferring scheduling sequence is carried out to move another substrate in the substrate processing apparatus preferentially to another substrate processing unit of the same type which is capable of continuously processing the substrate, while satisfying a process limiting condition (an allowable value for a process time interval after the end of the process until the start of a next process) of the substrate, or to retrieve the substrate into a substrate cassette. In this manner, any process damage to the substrate is minimized to avoid the production of defective substrates, and the production quantity (the number of processed substrates) is increased.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 35A is a conceptual diagram showing a production resumption from an apparatus shutdown according to the related art;

FIG. 35B is a conceptual diagram showing a production resumption from an apparatus shutdown according to the present embodiment;

DETAILED DESCRIPTION OF THE INVENTION

Preferred embodiments of the present invention will be described below. In the embodiments of the present invention, a plating apparatus for plating a semiconductor substrate will be described below as a substrate processing apparatus. However, a substrate processing apparatus according to the present invention is not limited to a plating apparatus, but may be any of various substrate processing apparatus such as a substrate processing apparatus for performing an LCD fabrication process on a glass substrate, for example.

Figure 1:
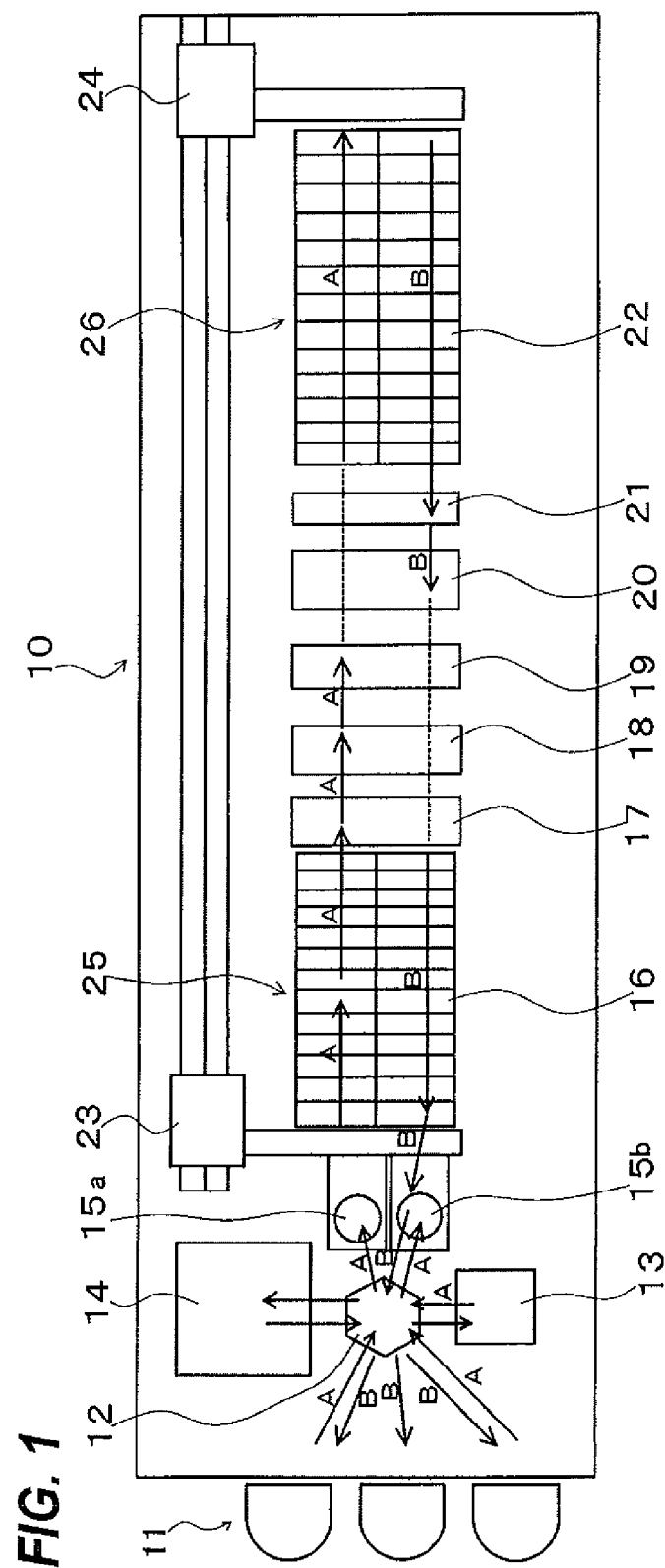
FIG. 1 is a schematic plan view of a plating apparatus to which the present invention is applied.

FIG. 1 is a schematic plan view of a plating apparatus 10 to which the present invention is applied. As shown in FIG. 1, the plating apparatus 10 includes a loading port 11, a loading robot 12, a substrate positioning table 13, a spin drier 14, fastening stages 15a, 15b, a substrate holder storage area 25 having a plurality of stockers 16, a pre-water-washing tank 17, a pre-processing tank 18, a water-washing tank 19, a crude drying tank (blowing tank) 20, a water-washing tank 21, a plating area 26 having a plurality of plating tanks 22, and two transfer devices 23, 24. In FIG. 1, substrates are loaded through successive processing stages along a substrate loading path indicated by the arrows A, and unloaded through successive processing stages along a substrate unloading path indicated by the arrows B. The loading port 11 has a substrate cassette for housing a plurality of unprocessed substrates and a substrate cassette for housing a plurality of processed substrates.

The plating apparatus 10 generally operates as follows: The loading robot 12 removes an unprocessed substrate from one of the substrate cassettes at the loading port 11 and places the removed substrate on the substrate positioning table 13, which positions the substrate based on a notch, an orientation flat, or the like thereof. Then, the loading robot 12 transfers the substrate to the fastening stage 15a or 15b. On the fastening stage 15a or 15b, the substrate is placed on a substrate holder removed from one of the stockers 16 in the substrate holder storage area 25. In an actual process, two substrates are placed on respective two substrate holders on the fastening stages 15a, 15b, and the two substrate holders are subsequently transferred as one set. The substrate held by the substrate holder is transferred successively to the pre-water-washing tank 17, the pre-processing tank 18, and the water-washing tank 19 by the transfer device 23. Specifically, the substrate is pre-washed by water, i.e., pre-wetted in the pre-water-washing tank 17, and then pre-processed, i.e., pre-soaked in the pre-processing tank 18, after which the substrate is washed by water, i.e., rinsed in the water-washing tank 19.

The substrate washed by water in the water-washing tank 19 is transferred to either one of the plating tanks 22 in the plating area 26 by the transfer device 24, and is immersed in a plating solution in the plating tank 22. In the plating tank 22, the substrate is plated with a metal film. Then, the plated substrate is transferred to the water-washing tank 21 by the transfer device 24. After washed by water in the water-washing tank 21, the substrate is transferred to the crude drying tank (blowing tank) 20, in which the substrate is crudely dried. The substrate is then transferred by the transfer device 23 to the fastening stage 15a or 15b, on which the substrate is removed from the substrate holder. The substrate is then transferred by the loading robot 12 to the spin drier 14, which dries the substrate. Thereafter, the substrate is stored in a given position in a substrate cassette at the loading port 11, i.e., a position in a substrate cassette from which an unprocessed substrate has been removed or a position in a substrate cassette which is dedicated to storing processed substrates.

Substrates are transferred along the substrate loading path A and also along the substrate unloading path B by the loading robot 12 and by the transfer devices 23, 24 under the control of a controller to be described below.

Figure 2:
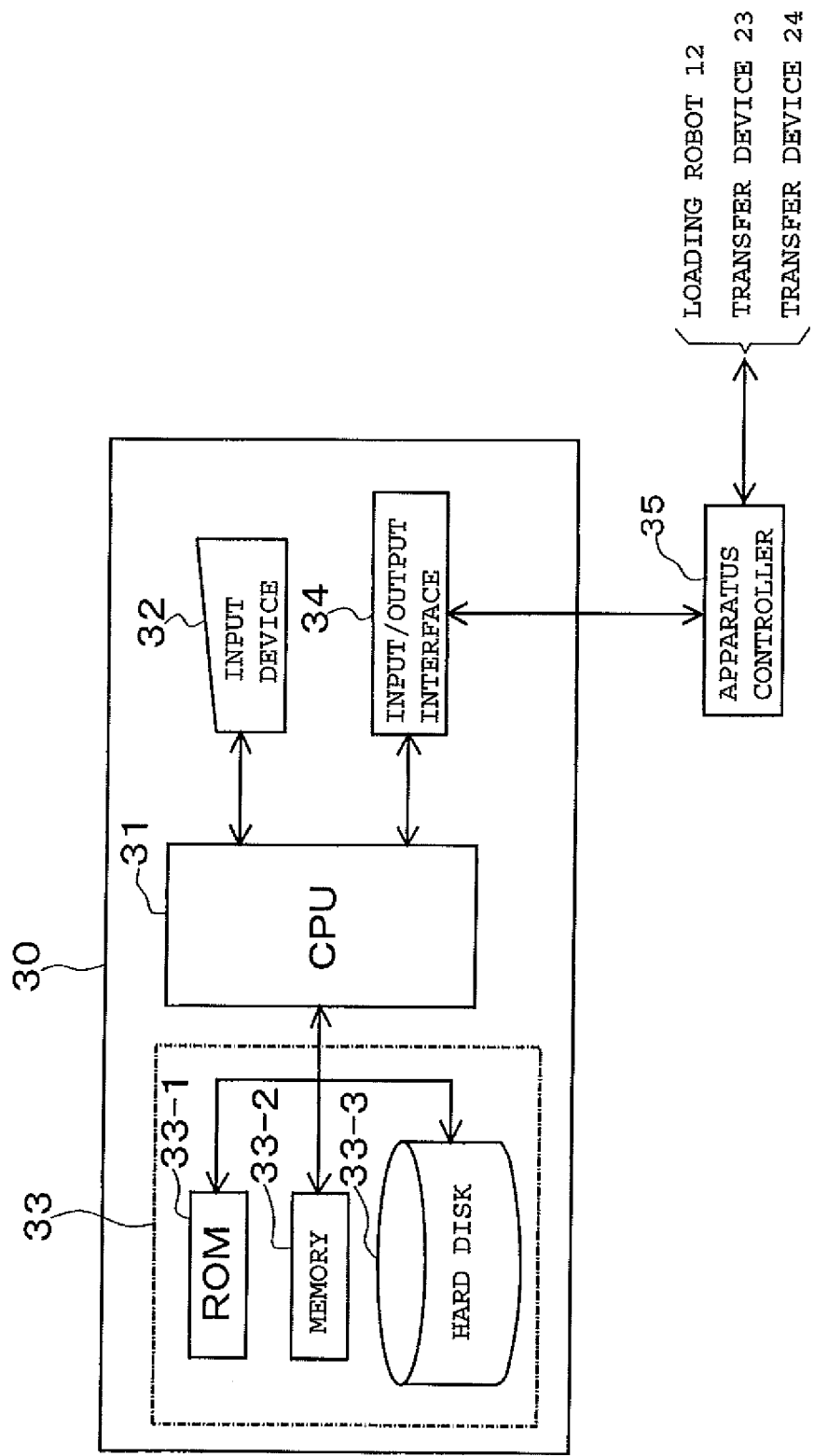
FIG. 2 is a block diagram of a hardware configuration of a controller of the plating apparatus shown in FIG. 1.

FIG. 2 is a block diagram of a hardware configuration of a controller 30 of the plating apparatus 10 shown in FIG. 1. As shown in FIG. 2, the controller 30 includes a central processing unit (CPU) 31, an input device 32 such as a pointing device which may be a keyboard, a mouse, or the like and a communication device for reading data stored in another computer, and a shared storage device 33. The shared storage device 33 comprises a ROM 33-1, a memory 33-2, and a hard disk 33-3. The controller 30 is connected via an input/output interface 34 to the loading robot 12, the transfer devices 23, 24, and an apparatus controller 35. Control signals from the CPU 31 are sent via the input/output interface 34 to the apparatus controller 35 for controlling the loading robot 12 and the transfer devices 23, 24.

If an event "new substrate supply", "transfer device/processing device malfunction", "substrate holder failure", or "plating tank rectifier malfunction" occurs in the plating apparatus 10, then a process such as "new substrate supplying and transferring simulation process", "transfer device/processing device malfunction process", "substrate holder failure process", or "plating tank rectifier malfunction process" is carried out as described below.

[Transferring Simulation for New Substrates that are Supplied]

A transferring simulation process for new substrates that are supplied is performed according to process details 1) through 4) shown below to regenerate a substrate transferring schedule (substrate transferring execution timetable).

1) A transferring simulation is carried out to supply a single new substrate or a set of new substrates (a set of two substrates in the embodiment) at a time to the substrate processing apparatus.

2) A transferring simulation generates a hypothetical apparatus model in the controller 30. The transferring simulation transfers a supplied substrate according to a substrate transferring schedule that has been generated by a previous new substrate supply scheduling process. For a substrate to be newly supplied, the transferring simulation is carried out to satisfy unit processing ending conditions and transferring conditions, and generates a new substrate transferring schedule (substrate transferring execution timetable).

3) A transferring simulation is based on the premise that a substrate to be newly supplied is supplied from a substrate cassette to the substrate processing apparatus and then returns to a designated substrate cassette after the process on the substrate is ended.

4) A transferring simulation transfers each supplied substrate according to process recipe conditions that have been set in advance by the controller 30. The transferring simulation also transfers a substrate so as to skip any unit whose recipe time setting is 0.

[Transfer Device/Processing Device (Motor, Pump, Isothermal Unit, Sensor, Etc) Malfunction]

In the event of a transfer device/processing device malfunction, the supply of new substrates to the substrate processing apparatus is interrupted, and the substrate processing apparatus is shut down after it has continued as long as possible to process any substrates being processed. Thereafter, when the operator presses a production resumption button on a control panel of the substrate processing apparatus, a transferring simulation generates a substrate transferring schedule for supplying new substrates to the substrate processing apparatus while retrieving any substrates remaining in the plating tanks 22 in the plating area 26, for normal production (hereinafter referred to as "production resuming process from apparatus shutdown"). In the transferring simulation, calculations are made to satisfy a process limiting condition for all retrieved substrates in processes downstream of the plating tanks 22 where the substrates have remained.

[Substrate Holder Failure]

If a plating current supply failure occurs frequently and a substrate holder is judged as suffering a substrate holder failure, then the judged substrate holder is regarded as unusable and returned to one of the stockers 16 in the substrate holder storage area 25. The returned substrate holder is subsequently prohibited from use until the substrate processing apparatus is shut down. Supplied substrates, which have been to use the unusable substrate holder, and unprocessed substrates are assigned to a usable substrate holder, and a substrate transferring schedule is regenerated (hereinafter referred to as "unit (substrate processing section) unusability setting changing process". If there is a subsequent request for the supply of a new substrate from the controller 30, the transferring simulation generates a substrate transferring schedule (substrate transferring execution timetable).

[Plating Tank Rectifier Malfunction]

In the event of a plating tank rectifier malfunction, a transferring simulation generates a substrate transferring schedule for interrupting the plating current supply process and transferring substrates from the plating tank 22, which is suffering the plating tank rectifier malfunction, to another normal plating tank 22 wherein the substrates are plated, or retrieving the substrates into a substrate cassette at the loading port 11 after the substrates have been washed and dried in the water-washing tank 21, the crude drying tank 20, and the spin drier 14 (hereinafter referred to as "process failure substrate retrieving process"). In this transferring simulation, calculations are made to satisfy a process limiting condition without disturbing the substrate transferring schedule for other substrates that are being normally processed. A row of plating tanks 22 including the plating tank 22, which is suffering the plating tank rectifier malfunction, is changed to an "unusable" setting, prohibiting subsequent substrates from being supplied to those plating tanks 22. Supplied substrates, which have been to use the unusable plating tank 22, and unprocessed substrates are assigned to a usable plating tank 22, and a substrate transferring schedule is regenerated, i.e., the unit (substrate processing section) unusability setting changing process is carried out. If there is a subsequent request for the supply of a new substrate from the controller 30, the transferring simulation generates a substrate transferring schedule (hereafter referred to as "new substrate supplying process").

Figure 3:
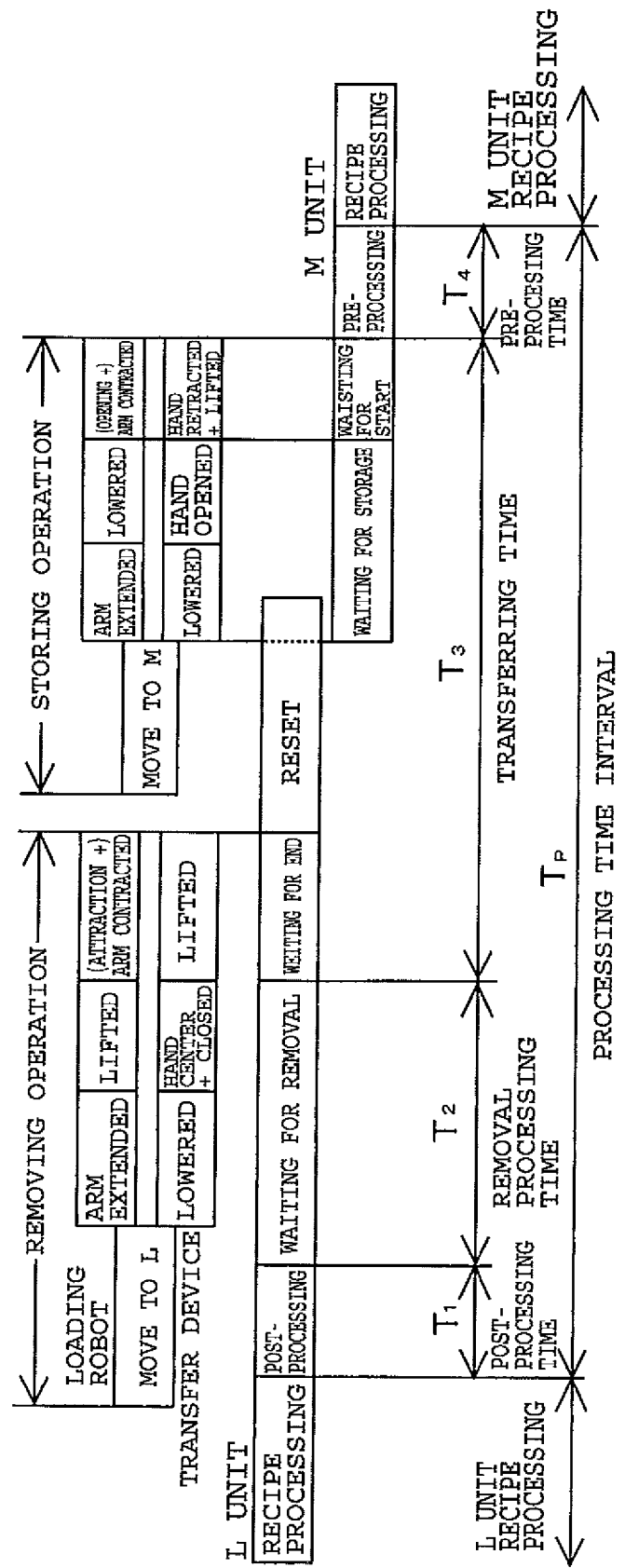
FIG. 3 is a diagram illustrative the definition of a process limiting condition.

According to this embodiment, a transferring simulation process is employed instead of a linear programming process, and in order to achieve a high production quantity while satisfying a strict process limiting condition, solutions (1) through (3) shown below are carried out. The strict process limiting condition refers to a process time interval after a process is ended until a next process is started. As shown in FIG. 3, a process time interval $T_P$ extending from an L unit recipe process to an M unit recipe process is expressed by:

$$T_P = T_1 + T_2 + T_3 + T_4$$

where $T_1$ represents a post-processing time, $T_2$ a removal waiting time, $T_3$ a transferring time, and $T_4$ a pre-processing time. In a plating process, usually, the post-processing time $T_1$ and the pre-processing time $T_4$ are 0 ($T_1=0$, $T_4=0$), and the transferring time $T_3$ differs depending on which row of plating tanks 22 a substrate is to be removed from. The removal waiting time $T_2$ is adjusted so as not to exceed the process time interval $T_P$ for scheduling.

Figure 4:
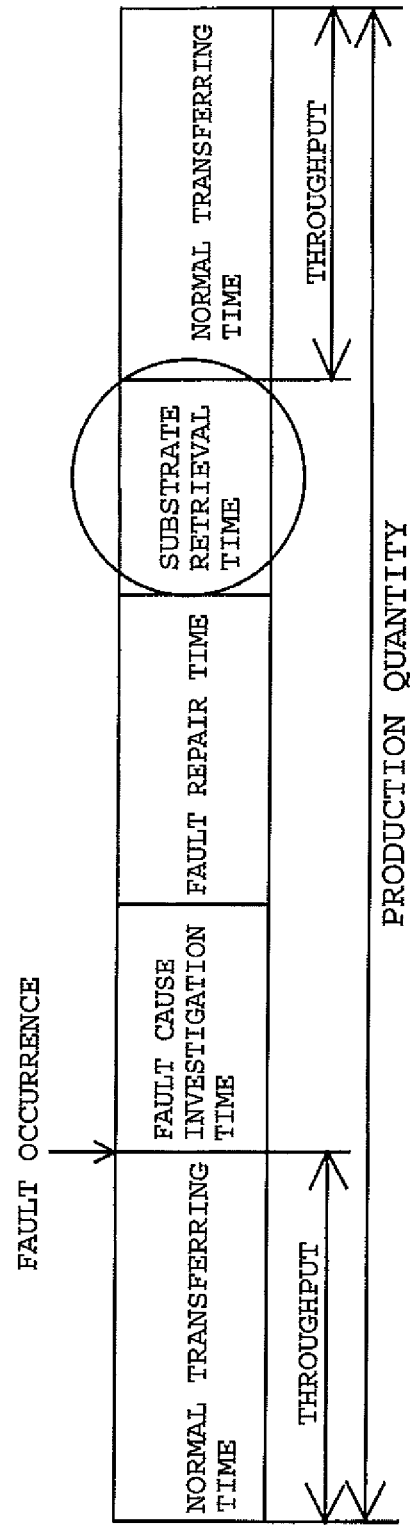
FIG. 4 is a diagram illustrative the definition of a production quantity.

In a narrow sense, the production quantity refers to the number of substrates that can be processed in a unit time while they are being transfer normally, and is called a throughput. In the present embodiment, as shown in FIG. 4, the production quantity refers, in a wide sense, to the number of substrates processed in a unit time including a recovery time (fault cause investigation time+fault repair time+substrate retrieval time) from the occurrence of a fault.

(1) After the recovery from a fault, a transferring schedule is performed to supply new substrates to the substrate processing apparatus while retrieving substrates remaining in the substrate processing apparatus, thereby reducing the time required to retrieve the substrates for an increased substrate production quantity.

(2) If a fault occurs while a substrate is being plated in a processing unit (plating tank 22) and the processing unit (plating tank 22) cannot be used subsequently, then a transferring schedule is performed to dynamically make the processing unit unusability and allow subsequent substrates to be continuously plated in other processing units. Accordingly, the time required to shut down the plating area 26 and retrieve substrates is reduced for an increased substrate production quantity.

(3) In the event of a plating process failure in a processing unit (plating tank 22), a transferring schedule is performed to transfer the substrate from the processing unit (plating tank 22) preferentially to another processing unit which is capable of continuing a plating process or retrieve the substrate into a substrate cassette, while satisfying a process limiting condition for other substrates in the plating area 26. In this manner, any process damage to the substrate is minimized to avoid the production of defective substrates.

As described later, the controller 30 has functions to perform the "new substrate supplying process", the "production resuming process from apparatus shutdown", the "unit (substrate processing section) unusability setting changing process", and the "process failure substrate retrieving process", and performs respective substrate transferring simulations to generate substrate transferring schedules.

Figure 5:
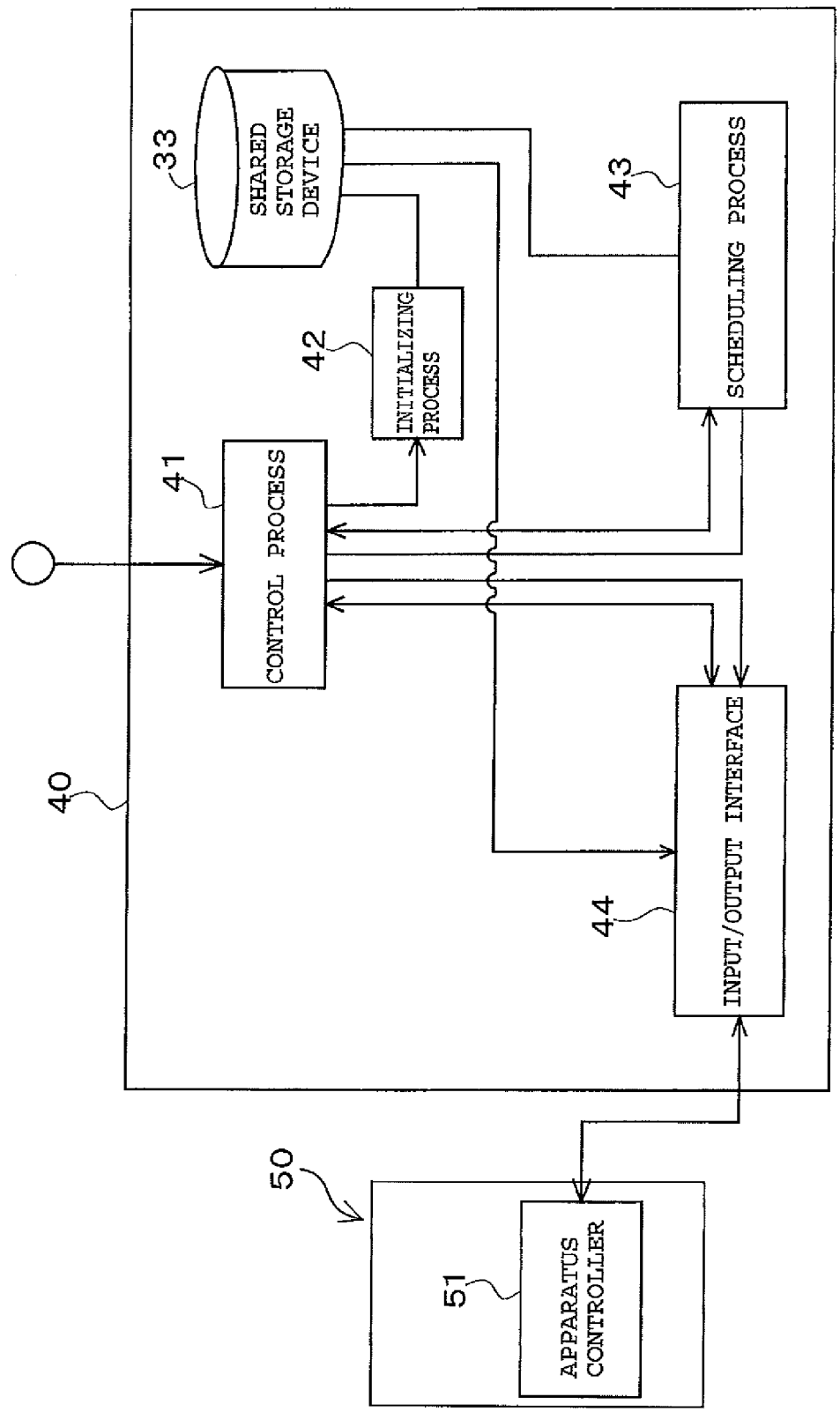
FIG. 5 is a block diagram showing a configuration of a scheduler according to an embodiment of the present invention.

FIG. 5 is a block diagram showing a configuration of a scheduler 40 according to an embodiment of the present invention which generates substrate transferring schedules. As shown in FIG. 5, the scheduler 40 comprises a control process 41, an initializing process 42, a scheduling process 43, and an input/output interface 44. The control process 41 activates the scheduling process 43 and the input/output interface 44, and transmits data sent and received (read and written) between the scheduling process 43 and the input/output interface 44 by way of handshakes. The initializing process 42 initializes the shared storage device 33. The input/output interface 44 communicates with an apparatus controller system 50 having an apparatus controller 51, indicates events to the scheduling process 43, and sends and receives substrate transferring schedules. The scheduling process 43 receives events from the input/output interface 44, makes calculations to generate transferring schedules, and sends the generated transferring schedules. The shared storage device 33 sends and receives various data of parameter settings, recipe settings, and substrate transferring schedules to and from the input/output interface 44 and the scheduling process 43.

Figure 6:
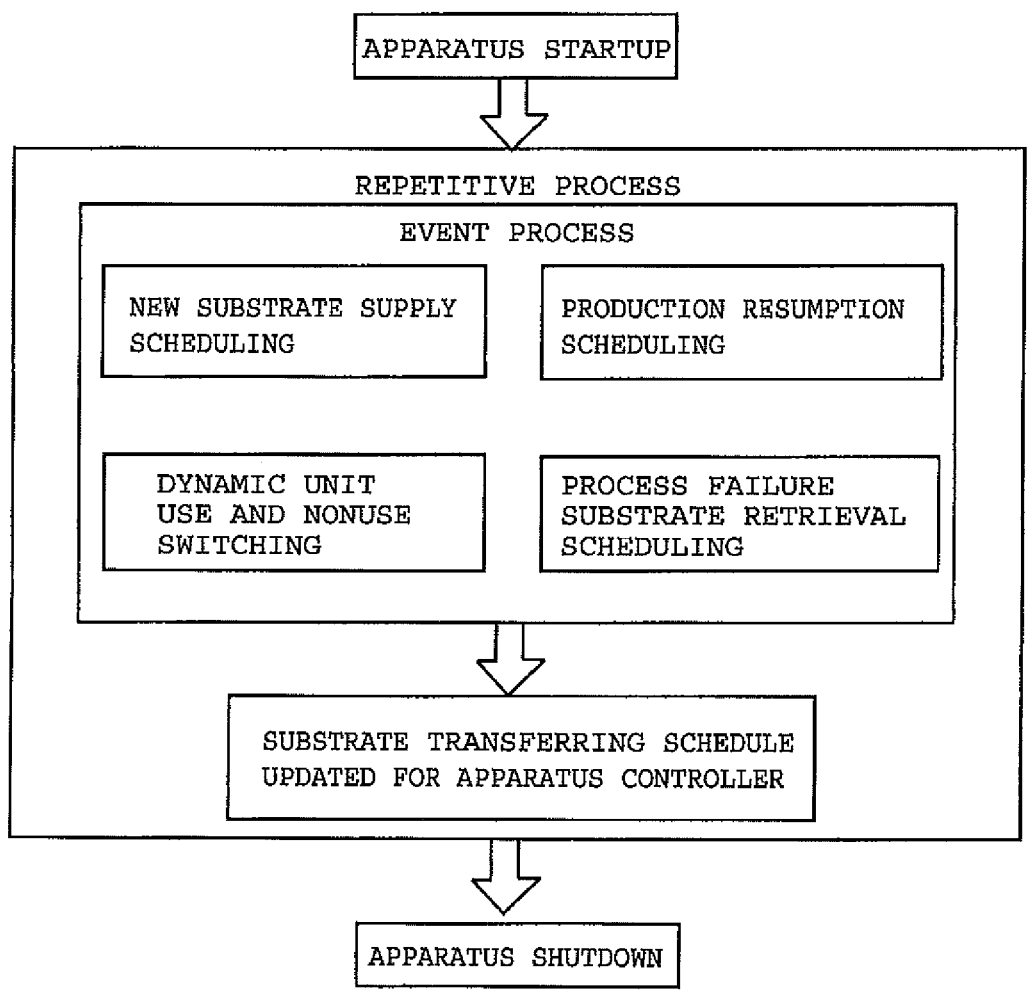
FIG. 6 is a block diagram showing a module configuration of a substrate transferring scheduler.

FIG. 6 is a block diagram showing a module configuration of a substrate transferring scheduler. The substrate transferring scheduler performs substrate transferring simulations depending on events in the substrate processing apparatus, and realizes functions a) through d) shown below.

a) A new substrate supply scheduling function, i.e., a function to generate substrate transferring schedules corresponding to process recipe conditions of new substrates.

b) A production resumption scheduling function, i.e., a function to generate a substrate transferring schedule for retrieving all substrates that remains in the substrate processing apparatus after the substrate processing apparatus is shut down due to a fault.

c) A dynamic switching function of unit use and nonuse, i.e., a function to generate a substrate transferring schedule for changing settings of a unit (substrate processing section) and at the same time changing to a unit to be used by supplied substrates which have been to use the unit whose settings are changed and by unprocessed substrates.

d) A retrieval scheduling function for retrieving a process failure substrate, i.e., a function to generate a substrate transferring schedule for moving a substrate which is judged to suffer from a (plating) process failure quickly to another processing unit of the same type which is capable of continuing the process, or retrieving the substrate into a substrate cassette after it is washed and dried, while continuing processes performed on other normal substrates.

The unit unusability setting changing process and the dynamic switching process of unit use and nonuse are synonymous with each other, and the unit unusability setting changing process is included in the dynamic switching process of unit use and nonuse.

Figure 7:
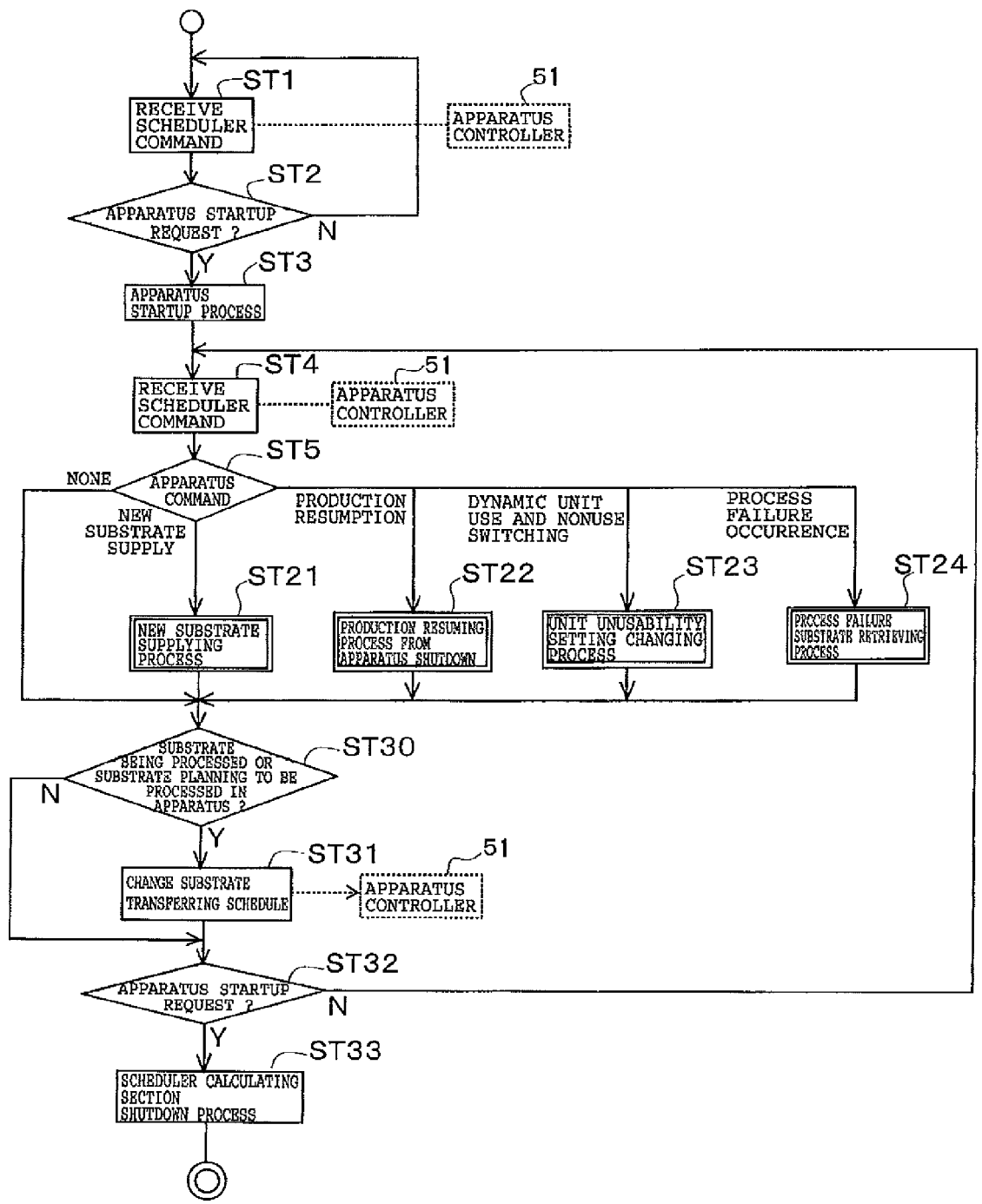
FIG. 7 is a flowchart of a main processing sequence of a scheduling process of the scheduler according to the embodiment of the present invention.

FIG. 7 is a flowchart of a main processing sequence of a scheduling process of the scheduler 40 according to an embodiment of the present invention. In step ST1, the scheduler 40 receives a scheduler command from the apparatus controller 51 of the apparatus controller system 50. Then, control goes to step ST2. In step ST2, the scheduler 40 determines whether there is an apparatus startup request or not. If there is an apparatus startup request (Y), then control goes to step ST3. If there is no apparatus startup request (N), then control goes back to step ST1. In step ST3, the scheduler 40 performs an apparatus startup process to enter a planned operation time, a unit use and nonuse setting, and a process limiting time. Then, control goes to step ST4. In step ST4, the scheduler 40 receives a scheduler command from the apparatus controller 51 and simultaneously receives planned processing times for respective processes. Then, control goes to step ST5.

In step ST5, the scheduler 40 determines whether it has received an apparatus command or not, and ascertains the type of an apparatus command if received. If the received apparatus command represents "new substrate supply", "apparatus production resumption", "dynamic unit use and nonuse switching", or "process failure occurrence", then the scheduler 40 carries out a new substrate supplying process in step ST21, a production resuming process from an apparatus shutdown in step ST22, a unit unusability setting changing process in step ST23, or a process failure substrate retrieving process in step ST24, respectively, after which control goes to step ST30. If there is no apparatus command received in step ST5, then control jumps to step ST30.

In step ST30, the scheduler 40 determines whether there is a substrate being processed or a substrate to be processed in the substrate processing apparatus. If there is a substrate being processed or a substrate to be processed in the substrate processing apparatus (Y), then control goes to step ST31. If there is neither a substrate being processed nor a substrate to be processed in the substrate processing apparatus (N), then control goes to step ST32. In step ST31, the scheduler 40 sends a changed substrate transferring schedule to the apparatus controller 51 of the apparatus controller system 50, then control goes to step ST31. In step ST32, the scheduler 40 determines whether there is an apparatus startup request or not. If there is an apparatus startup request (Y), then control goes to step ST33 in which the scheduling process 43 of the scheduler 40 performs a scheduler calculating section shutdown process. If there is no apparatus startup request (N), then control goes back to step ST4.

The "new substrate supplying process", the "production resuming process from an apparatus shutdown", the "unit unusability setting changing process", and the "process failure substrate retrieving process" will be described in detail below.

Figure 8:
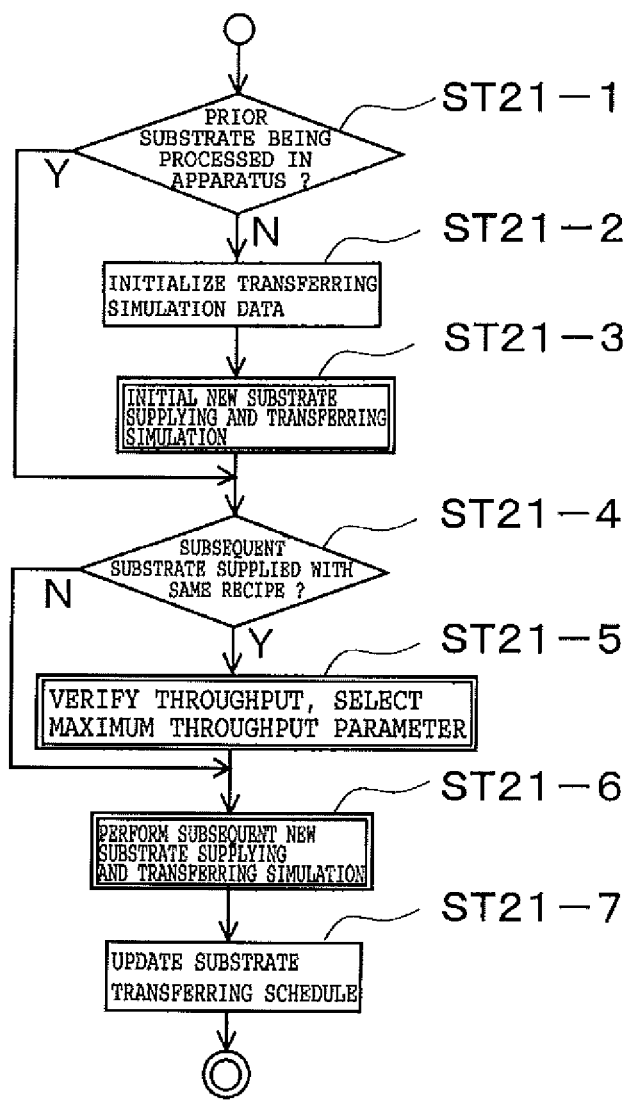
FIG. 8 is a flowchart of a processing sequence of a new substrate supplying process (step ST21 shown in FIG. 7)

FIG. 8 is a flowchart of a processing sequence of a simulation process for a new substrate supplying process (step ST21 shown in FIG. 7). As shown in FIG. 8, in step ST21-1, the scheduler 40 checks if there is a prior substrate being processed in the substrate processing apparatus or not. If there is no prior substrate being processed in the substrate processing apparatus (N), then control goes to step ST21-2. If there is a prior substrate being processed in the substrate processing apparatus (Y), then control jumps to step ST-4. In step ST21-2, the scheduler 40 initializes transferring simulation data, after which control goes to step ST21-3. In step ST21-3, the scheduler 40 performs an initial new substrate supplying and transferring simulation. Then, control goes to step ST21-4.

In step ST21-4, the scheduler 40 determines whether a subsequent substrate is supplied with the same recipe or not. If a subsequent substrate is supplied with the same recipe (Y), then control goes to step ST21-5. If a subsequent substrate is not supplied with the same recipe (N), then control goes to step ST21-6. In step ST21-5, the scheduler 40 verifies a throughput and selects a maximum throughput parameter, after which control goes to step ST21-6. In step ST21-6, the scheduler 40 performs a subsequent new substrate supplying and transferring simulation. Then, control goes to step ST21-7 in which the scheduler 40 updates the substrate transferring schedule.

Figure 9:
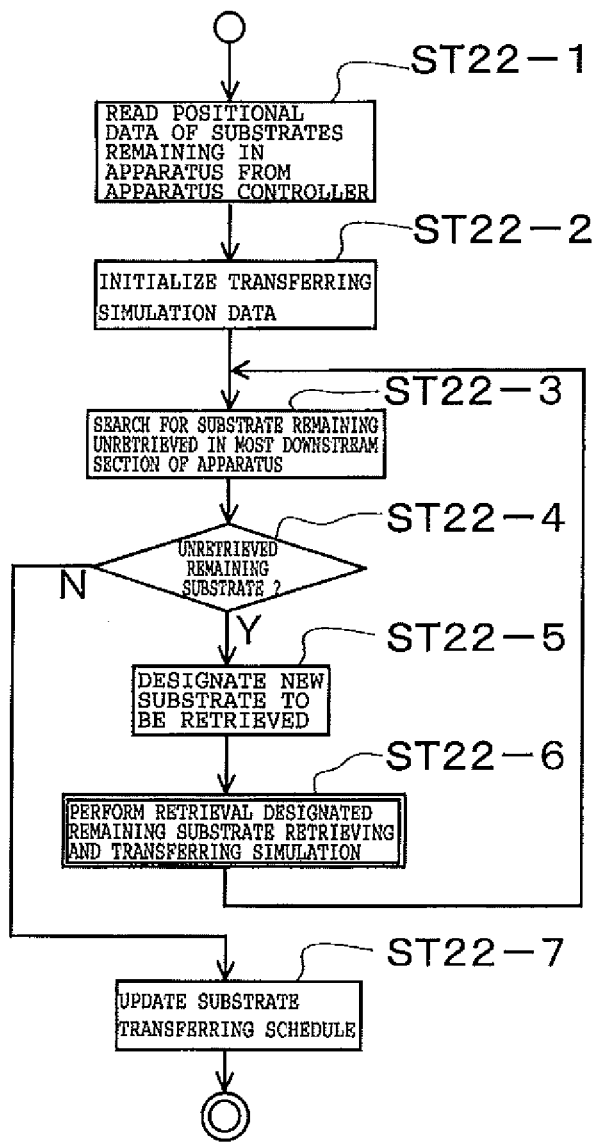
FIG. 9 is a flowchart of a processing sequence of a production resuming process (step ST22 shown in FIG. 7) from an apparatus shutdown.

FIG. 9 is a flowchart of a processing sequence of the production resuming process (step ST22 shown in FIG. 7) from an apparatus shutdown. In the production resuming process from an apparatus shutdown, the scheduler 40 reads positional data of substrates remaining in the substrate processing apparatus from the apparatus controller 51 in step ST22-1. Then, control goes to step ST22-2. In step ST22-2, the scheduler 40 initializes transferring simulation data. Then, control goes to step ST22-3. In step ST22-3, the scheduler 40 searches for a substrate that remains unretrieved in a most downstream section of the substrate processing apparatus. Then, control goes to step ST22-4. In step ST22-4, the scheduler 40 determines whether there is a substrate that remains unretrieved or not. If there is a substrate that remains unretrieved (Y), then control goes to step ST22-5. If there is no substrate that remains unretrieved (N), then control jumps to step ST22-7. In step ST22-5, the scheduler 40 designates a new substrate to be retrieved. Then, control goes to step ST22-6. In step ST22-6, the scheduler 40 performs a retrieval designated remaining substrate retrieving and transferring simulation. Then, control goes back to step ST22-3. In step ST22-7, the scheduler 40 updates the substrate transferring schedule.

Figure 10:
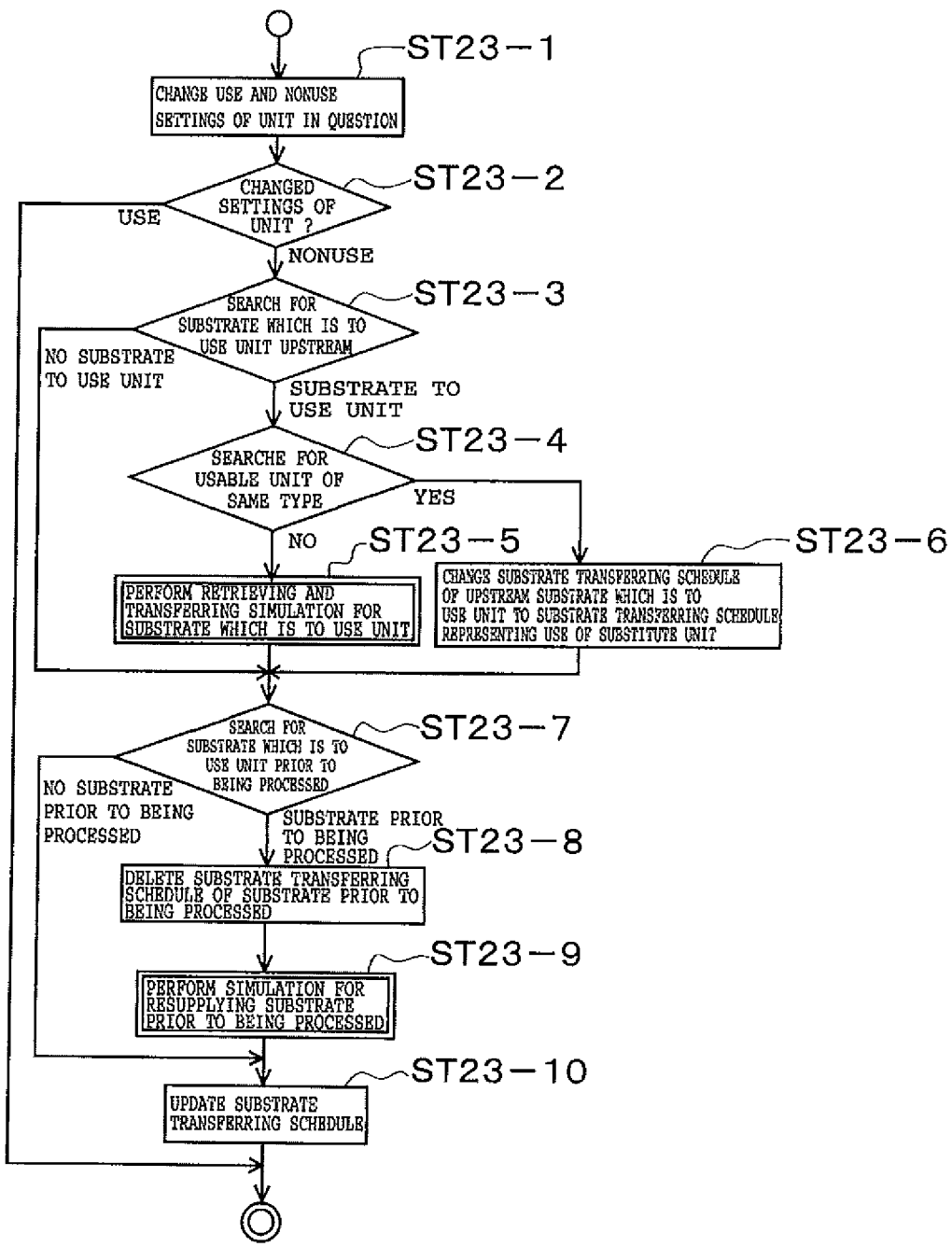
FIG. 10 is a flowchart of a processing sequence of a unit unusability setting changing process (step ST23 shown in FIG. 7)

FIG. 10 is a flowchart of a processing sequence of the unit unusability setting changing process (dynamic unit use and nonuse switching process) (step ST23 shown in FIG. 7). In the unit unusability setting changing process, the scheduler 40 changes the use and nonuse settings of a unit in question in step ST23-1. Then, control goes to step ST23-2. In step ST23-2, the scheduler 40 determines whether the changed settings represent the use or nonuse of the unit. If the changed settings represent the nonuse of the unit, then control goes to step ST23-3. In step ST23-3, the scheduler 40 searches for a substrate which is to use the unit upstream thereof. If there is a substrate which is to use the unit, then control goes to step ST23-4. If there is no substrate which is to use the unit, then control jumps to step ST23-7. In step ST23-4, the scheduler 40 searches for a usable unit of the same type. If there is no usable unit of the same type, then control goes to step ST23-5. If there is a usable unit of the same type, then control goes to step ST23-6.

In step ST23-5, the scheduler 40 performs a retrieving and transferring simulation for a substrate which is to use the unit. Then, control goes to step ST23-7. In step ST23-6, the scheduler 40 changes the substrate transferring schedule of the upstream substrate, which is to use the unit, to a substrate transferring schedule representing the use of a substitute unit, after which control goes to step ST23-7. In step ST23-7, the scheduler 40 searches for a substrate, which is to use the unit, prior to being processed. If there is a substrate prior to being processed, then control goes to step ST23-8. If there is no substrate prior to being processed, then control jumps to step ST23-10. In step ST23-8, the scheduler 40 deletes the substrate transferring schedule of the substrate prior to being processed. Then, control goes to step ST23-9. In step ST23-9, the scheduler 40 performs a simulation for re-supplying the substrate prior to being processed. Then, control goes to step ST23-10. In step ST23-10, the scheduler 40 updates the substrate transferring schedule.

Figure 11:
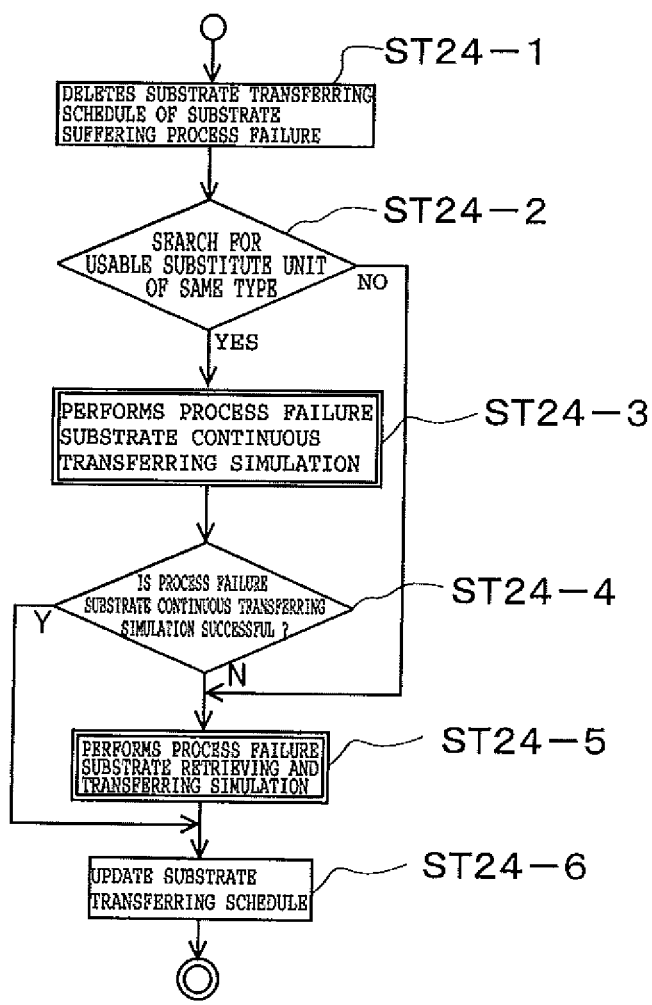
FIG. 11 is a flowchart of a processing sequence of a process failure substrate retrieving process (step ST24 shown in FIG. 7)

FIG. 11 is a flowchart of a processing sequence of the process failure substrate retrieving process (step ST24 shown in FIG. 7). In the process failure substrate retrieving process, the scheduler 40 deletes the substrate transferring schedule of a substrate which is suffering a process failure caused by a processing unit in step ST24-1. Then, control goes to step ST24-2. In step ST24-2, the scheduler 40 searches for a usable substitute unit of the same type. If there is a usable substitute unit of the same type as the processing unit which has caused the process failure, then control goes to step ST24-3. If there is no usable substitute unit of the same type, then control goes to step ST24-5. Specifically, the scheduler 40 judges that there is a usable substitute unit of the same type if a normal substrate, which is to use the substitute unit, is not present upstream of the substitute unit or in a substrate cassette or if the process of the substitute unit is finished before a normal substrate, which is to use the substitute unit, arrives at the substitute unit.

In step ST24-3, the scheduler 40 performs a process failure substrate continuous transferring simulation. Then, control goes to step ST24-4. In the process failure substrate continuous transferring simulation, the process failure substrate is transferred from the processing unit which has caused the process failure to the substitute unit within a process limiting time, and the scheduler 40 performs the transferring simulation for normally returning all the substrates including the process failure substrate to substrate cassettes while satisfying the process limiting condition of the other substrates. The details of the process failure substrate continuous transferring simulation are the same as those of the "retrieval designated remaining substrate retrieving and transferring simulation" in the production resuming process.

In step ST24-4, the scheduler 40 determines whether the process failure substrate continuous transferring simulation is successful or not. If the process failure substrate continuous transferring simulation is successful (Y), then control jumps to step ST24-6. If the process failure substrate continuous transferring simulation is not successful (N), then control goes to step ST24-5. In step ST24-4, specifically, the scheduler 40 determines whether all the substrates including the process failure substrate are normally returned to the loading port while satisfying the process limiting condition or not.

In step ST24-5, the scheduler 40 performs a process failure substrate retrieving and transferring simulation. Then, control goes to step ST24-6. In the process failure substrate retrieving and transferring simulation, the process failure substrate is removed from the processing unit which has caused the process failure, and returned through washing and drying processes to the loading port. The other normal substrates are continuously processed. The details of the process failure substrate retrieving and transferring simulation are the same as those of the retrieval designated remaining substrate retrieving and transferring simulation in the production resuming process. In step ST24-6, the scheduler 40 updates the substrate transferring schedule.

Figure 12:
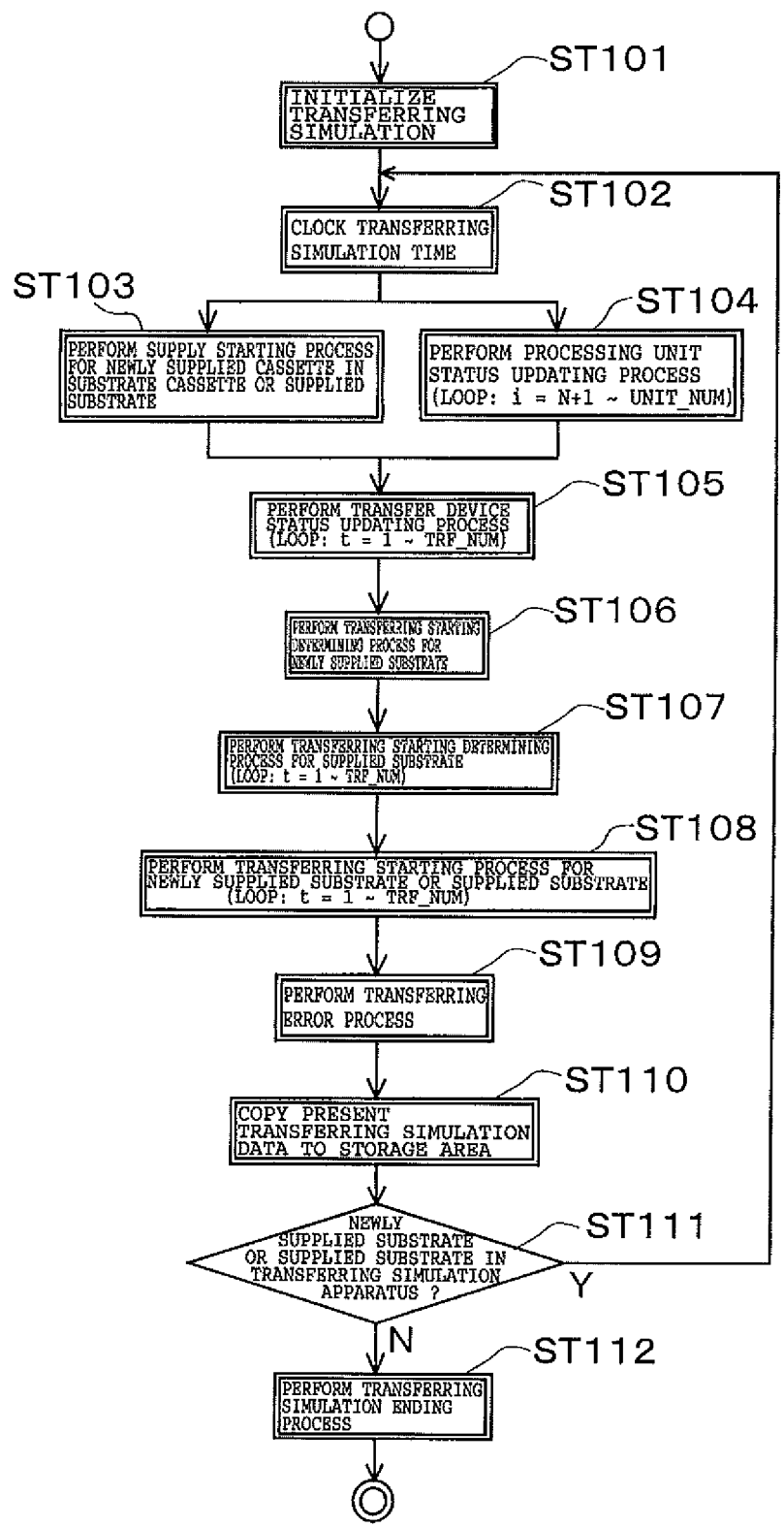
FIG. 12 is a flowchart of a processing sequence of a new substrate supplying and transferring simulation process (steps ST21-3 and ST21-6 shown in FIG. 8, and step ST23-9 shown in FIG. 10)

Some of the steps describe above will be described in greater detail below. FIG. 12 is a flowchart of a processing sequence of a new substrate supplying and transferring simulation process (steps ST21-3, ST21-6 shown in FIG. 8 and step ST23-9 shown in FIG. 10). In FIG. 12, N represents the number of substrate cassettes (the loading ports 11), UNIT_NUM the total number of processing units, i.e., the total number of processing tanks including the plating tanks 22, and TRF_NUM the number of transfer devices.

In step ST101, prior to the transferring simulation, the scheduler 40 initializes it by initializing pointers for referring to information about the processing units, i.e., the plating tanks 22, information about transfer devices, i.e., the loading robot 12 and the transfer devices 23, 24, and a supplied substrate transferring schedule. Then, control goes to step ST102 for a transferring simulation time clocking process. In the transferring simulation time clocking process, the scheduler 40 searches for and clocks a minimum remaining time up to a status transition event next to the transfer device or unit processing. Then, control goes to step ST103 or ST104.

In step ST103, the scheduler 40 performs a supply starting process for a newly supplied cassette in a substrate cassette or a supplied cassette. In step ST104, the scheduler 40 performs a processing unit status updating process for updating processing statuses of all processing units. Then, control goes to step ST105. In step ST105, the scheduler 40 performs a transfer device status updating process for updating transferring statuses of all the transfer devices. Then, control goes to step ST106. In step ST106, the scheduler 40 performs a transferring starting determining process for a newly supplied substrate in the processing units or the transfer devices. Then, control goes to step ST107. In step ST107, the scheduler 40 performs a transferring starting determining process for a supplied substrate to which a reference pointer in the substrate transferring schedule refers. Then, control goes to step ST108.

In step ST108, the scheduler 40 performs a transferring starting process for a newly supplied substrate or a supplied substrate which has been required to start to be transferred by the transferring starting determining process. Then, control goes to step ST109. In step ST109, if an error has occurred due to a failure to satisfy the process limiting condition in the processing unit status updating process in step ST104 or in the transfer device status updating process in step ST105, then the scheduler 40 performs a transferring error process for restoring the transferring simulation data to an initial state and delaying a load starting time. Then, control goes to step ST110. In step ST110, if a request is made to store transferring simulation data in a state prior to loading after a processing starting request is turned on at the loading port 11, then the scheduler 40 copies the present transferring simulation data to a storage area for storing data prior to loading. Then, control goes to step ST111.

In step ST111, the scheduler 40 determines whether a newly supplied substrate or a supplied substrate in a process is present in a transferring simulation apparatus or not. If a newly supplied substrate or a supplied substrate in a process is present in a transferring simulation apparatus (Y), then control goes back to step ST102. If a newly supplied substrate or a supplied substrate in a process is not present in a transferring simulation apparatus, i.e., if it is confirmed that a newly supplied substrate or a supplied substrate has been normally returned to a designated substrate cassette while satisfying the process limiting condition, then control goes to step S112. In step S112, the scheduler 40 performs a transferring simulation ending process. In the transferring simulation ending process, the scheduler 40 copies a newly generated substrate transferring schedule to a supplied substrate transferring schedule variable area in an overwrite mode.

Figure 13:
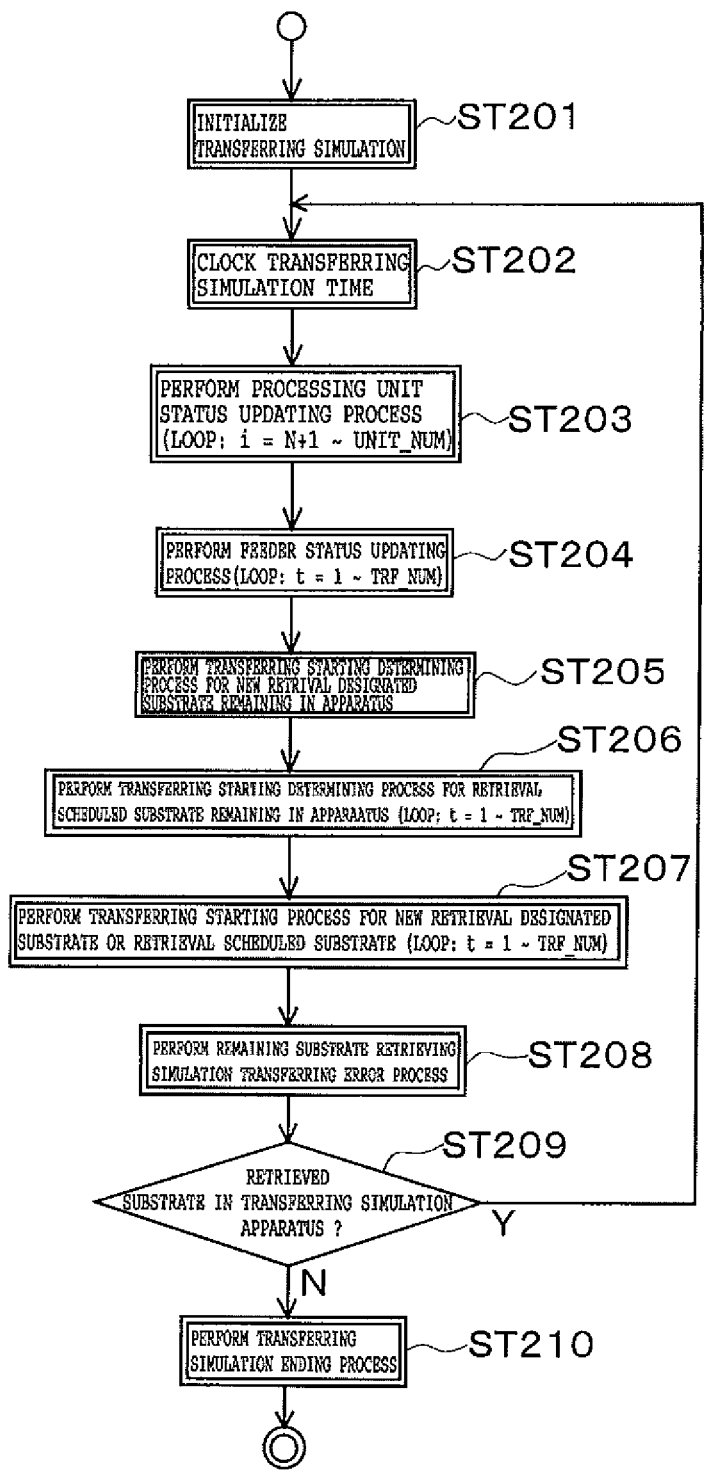
FIG. 13 is a flowchart of a processing sequence of a production resumption substrate retrieving and transferring simulation process (step ST22-6 shown in FIG. 9)

FIG. 13 is a flowchart of a processing sequence of the retrieval designated remaining substrate retrieving and transferring simulation (step ST22-6 shown in FIG. 9). In step ST201, the scheduler 40 initializes the transferring simulation. Then, control goes to step ST202. In step S202, the scheduler 40 searches for and clocks a minimum remaining time up to a status transition event next to the transfer device or unit processing. Then, control goes to step ST203. In step ST203, the scheduler 40 performs a processing unit status updating process for updating processing statuses of all processing units. Then, control goes to step ST204. In step ST204, the scheduler 40 performs a transfer device status updating process for updating transferring statuses of all the transfer devices. Then, control goes to step ST205.

In step ST205, the scheduler 40 performs a transferring starting determining process for a new retrieval designated substrate that remains in the substrate processing apparatus. Then, control goes to step ST206. In step ST206, the scheduler 40 performs a transferring starting determining process for a retrieval scheduled substrate that remains in the substrate processing apparatus. Then, control goes to step ST207. In step ST207, the scheduler 40 performs a transferring starting determining process with respect to a new retrieval designated substrate or a retrieval scheduled substrate. Then, control goes to step ST208.

In step ST208, the scheduler 40 performs a remaining substrate retrieving simulation transferring error process. Then, control goes to step ST209. In step ST209, the scheduler 40 determines whether a retrieved substrate is present in the transferring simulation apparatus or not. If a retrieved substrate is present in the transferring simulation apparatus (Y), then control goes back to step ST202. If no retrieved substrate is present in the transferring simulation apparatus (N), then control goes to step ST210 in which the scheduler 40 performs a transferring simulation ending process.

Figure 14:
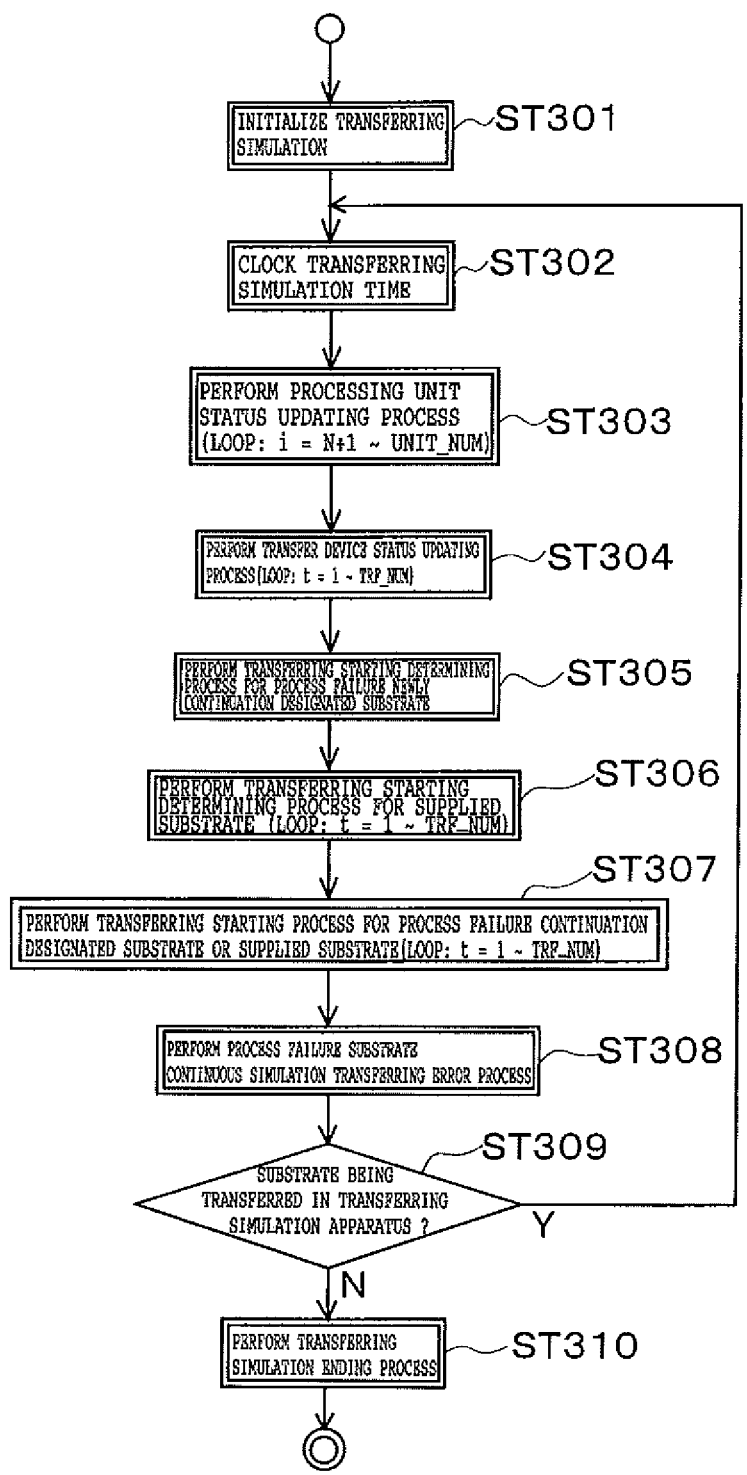
FIG. 14 is a flowchart of a processing sequence of a process failure substrate continuous transferring simulation process (step ST24-3 shown in FIG. 11)

FIG. 14 is a flowchart of a processing sequence of the process failure substrate continuous transferring simulation (step ST24-3 shown in FIG. 11). In step ST301, the scheduler 40 initializes the transferring simulation. Then, control goes to step ST302. In step S302, the scheduler 40 clocks a transferring simulation time. Then, control goes to step ST303. In step ST303, the scheduler 40 performs a processing unit status updating process. Then, control goes to step ST304. In step ST304, the scheduler 40 performs a transfer device status updating process. Then, control goes to step ST305. In step S305, the scheduler 40 performs a process failure newly continuation designated substrate transferring starting determining process. Then, control goes to step ST306.

In step S306, the scheduler 40 performs a supplied substrate transferring starting determining process. Then, control goes to step ST307. In step ST307, the scheduler 40 performs a process failure continuation designated substrate or supplied substrate transferring starting process. Then, control goes to step ST308. In this process, the "supplied substrate" refers to all substrates that have been scheduled as newly supplied substrates or retrieval designated substrates. In step ST308, the scheduler 40 performs a process failure substrate continuous simulation transferring error process. Then, control goes to step ST309. In step ST309, the scheduler 40 determines whether a substrate, which is being transferred, is present in the transferring simulation apparatus or not. If a substrate, which is being transferred, is present in the transferring simulation apparatus (Y), then control goes back to step ST302. If no substrate, which is being transferred, is present in the transferring simulation apparatus (N), then control goes to step ST310, in which the scheduler 40 performs a transferring simulation ending process.

Figure 15:
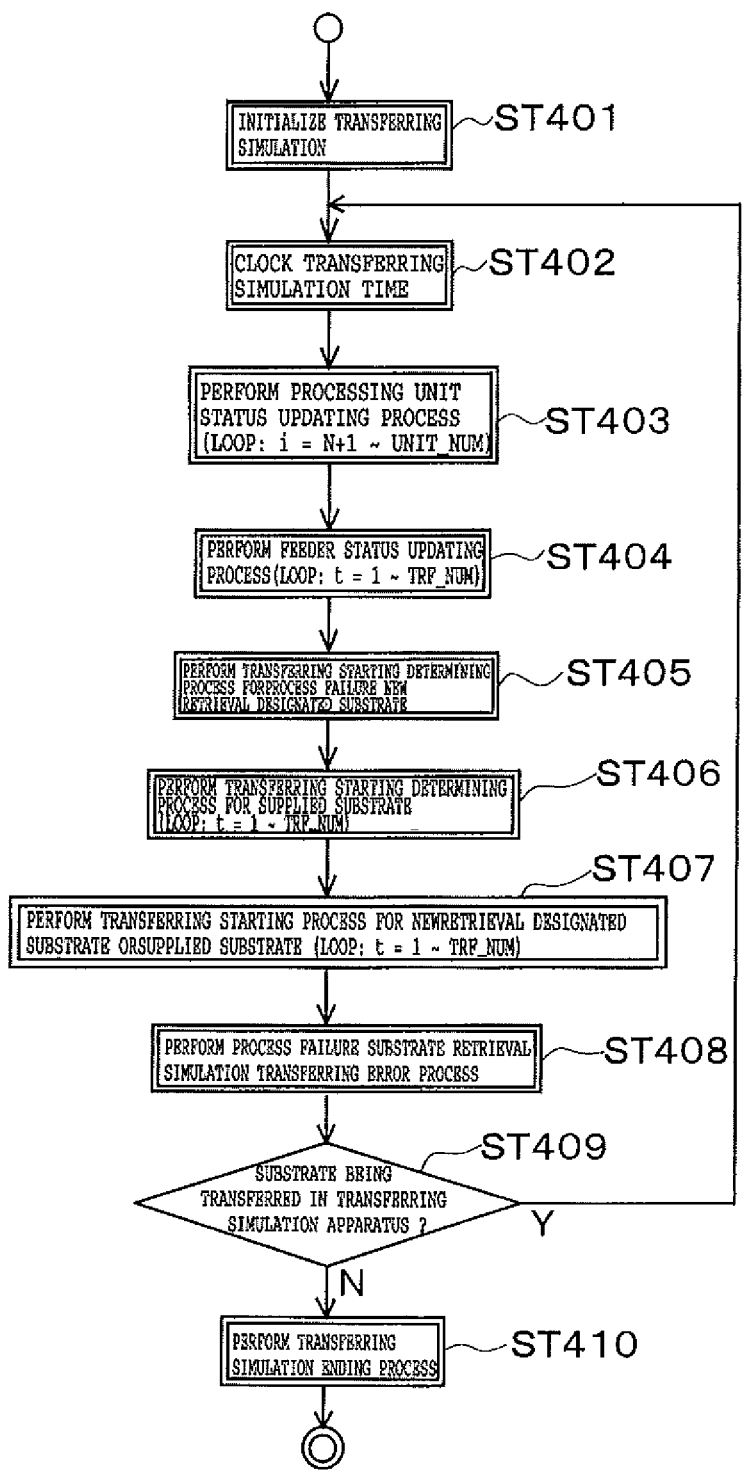
FIG. 15 is a flowchart of a processing sequence of a process failure substrate retrieving and transferring simulation process (step ST23-5 shown in FIG. 10 and step ST24-5 shown in FIG. 11)

FIG. 15 is a flowchart of a processing sequence of the process failure substrate retrieving and transferring simulation (step ST24-5 shown in FIG. 11). In step ST401, the scheduler 40 initializes the transferring simulation. Then, control goes to step ST402. In step S402, the scheduler 40 clocks a transferring simulation time. Then, control goes to step ST403. In step ST403, the scheduler 40 performs a processing unit status updating process. Then, control goes to step ST404. In step ST404, the scheduler 40 performs a transfer device status updating process. Then, control goes to step ST405. In step S405, the scheduler 40 performs a process failure new retrieval designated substrate transferring starting determining process. Then, control goes to step ST406.

In step ST406, the scheduler 40 performs a supplied substrate transferring starting determining process. Then, control goes to step ST407. In step ST407, the scheduler 40 performs a new retrieval designated substrate or supplied substrate transferring starting process. Then, control goes to step ST408. In this process, the "supplied substrate" refers to all substrates that have been scheduled as newly supplied substrates or retrieval designated substrates. In step ST408, the scheduler 40 performs a process failure substrate retrieval simulation transferring error process. Then, control goes to step ST409. In step ST409, the scheduler 40 determines whether a substrate, which is being processed, is present in the transferring simulation apparatus or not. If a substrate, which is being processed is present, in the transferring simulation apparatus (Y), then control goes back to step ST402. If no substrate, which is being processed, is present in the transferring simulation apparatus (N), then control goes to step ST410, in which the scheduler 40 performs a transferring simulation ending process.

Figure 16:
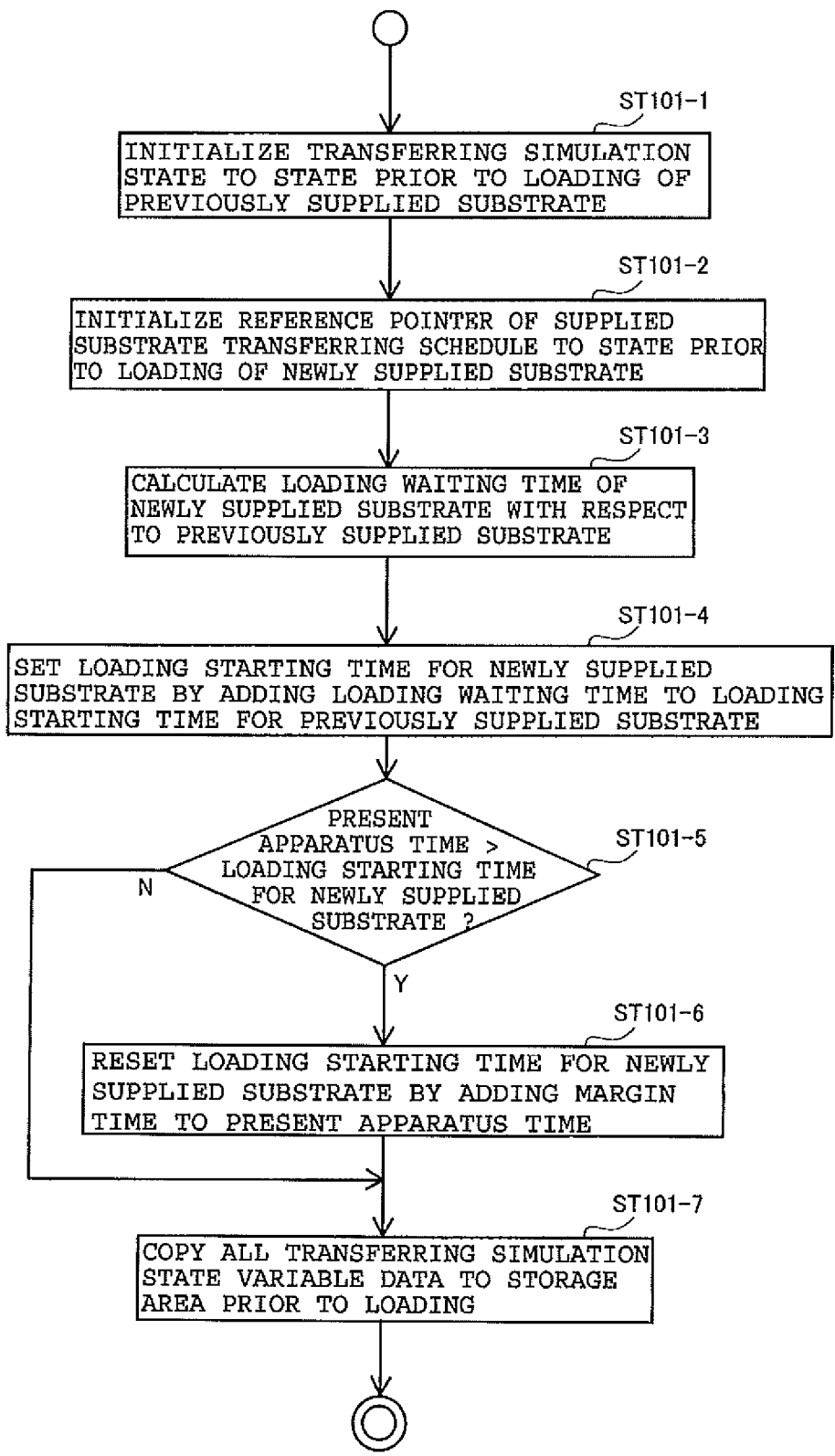
FIG. 16 is a flowchart of a processing sequence of a transferring simulation initializing process (step ST101 shown in FIG. 12)

FIG. 16 is a flowchart of a processing sequence of the transferring simulation initializing process (step ST101 shown in FIG. 12). In step ST101-1, the scheduler 40 initializes the transferring simulation state to a state prior to loading of a previously supplied substrate. Then, control goes to step ST101-2. The transferring simulation state includes all unit information data, transfer device information data, and data required for the transferring simulation. Specifically, the scheduler 40 initializes the transferring simulation state by copying a data set, which has been copied to a storage area at the time when the transferring simulation for a previously supplied substrate has started (step ST101-7), to a transferring simulation variable area in an overwrite mode.

In step ST101-2, the scheduler 40 initializes a reference pointer of the supplied substrate transferring schedule to a state prior to the loading of a newly supplied substrate. Then, control goes to step ST101-3. The reference pointer is used to refer successively to the existing substrate transferring schedule before the supplied substrate starts to be transferred. In step STE101-3, the scheduler 40 calculates a loading waiting time of the newly supplied substrate with respect to the previously supplied substrate. Then, control goes to step ST101-4. A lower limit of the loading waiting time is set to a default value or a value produced as a result of the verification of the throughput. If all the processing units of the substrate processing apparatus are in use, then the scheduler 40 searches for one of the processing units which will be available at the earliest, and calculates a loading waiting time for introducing the newly supplied substrate smoothly into the processing unit which is found. The calculated loading waiting time is equal to or greater than the lower limit referred to above. In step ST101-4, the scheduler 40 sets a loading starting time for the newly supplied substrate by adding the loading waiting time to the loading starting time for the previously supplied substrate. Then, control goes to step ST101-5.

In step ST101-5, the scheduler 40 determines whether the present apparatus time exceeds the loading starting time for the newly supplied substrate (present apparatus time>loading starting time for the newly supplied substrate) or not. If the present apparatus time exceeds the loading starting time for the newly supplied substrate (Y), then control goes to step ST101-6. If the present apparatus time does not exceed the loading starting time for the newly supplied substrate (N), then control goes to step ST101-7. In step ST101-6, the scheduler 40 resets a loading starting time for the newly supplied substrate by adding a margin time to the present apparatus time. Then, control goes to step ST101-7. The margin time is a constant time preset as a time required after scheduling is started until it is ended.

The present apparatus time is read from the apparatus controller 51. In step ST101-7, the scheduler 40 copies all transferring simulation state variable data to the storage area prior to loading.

Figure 17:
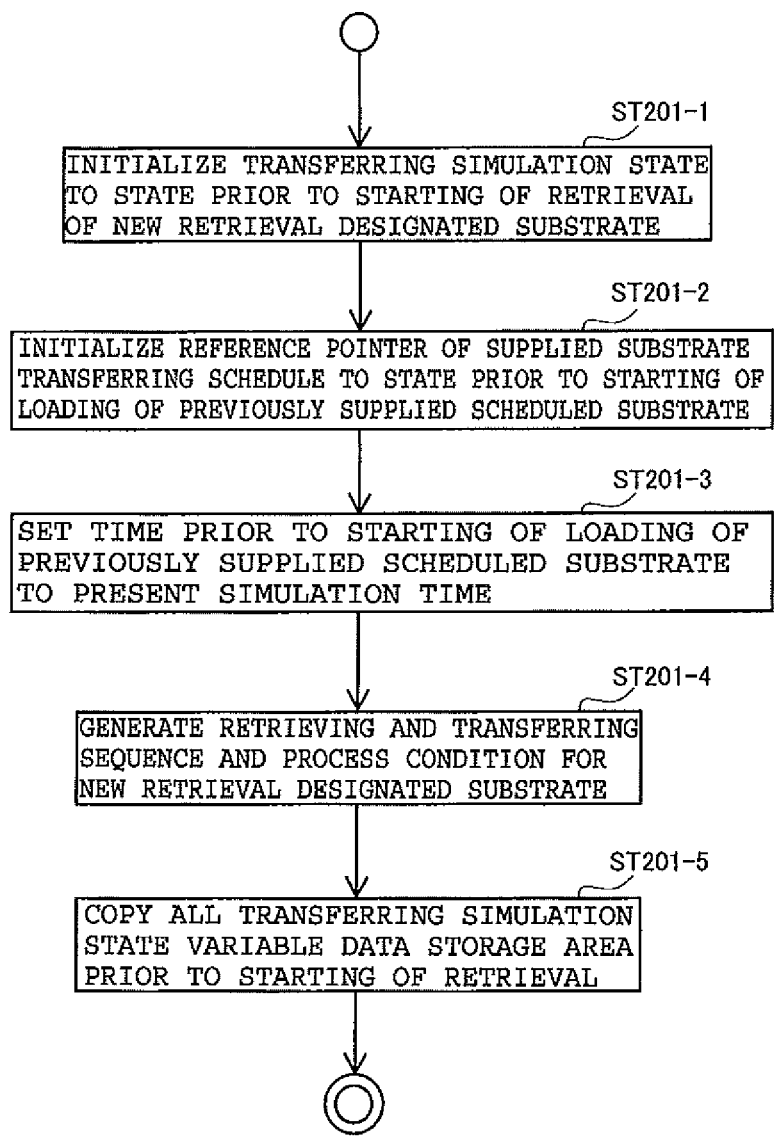
FIG. 17 is a flowchart of a processing sequence of a production resumption remaining substrate retrieving and transferring simulation initializing process (step ST201 shown in FIG. 13 and step ST401 shown in FIG. 15)

FIG. 17 is a flowchart of a processing sequence of the production resumption remaining substrate retrieving and transferring simulation initializing process and the process failure substrate retrieving and transferring simulation initializing process (step ST201 shown in FIG. 13 and step ST401 shown in FIG. 15). In step ST201-1, the scheduler 40 initializes the transferring simulation state to a state prior to the starting of retrieval of a new retrieval designated substrate. Then, control goes to step ST201-2. In step ST201-2, the scheduler 40 initializes a reference pointer of the supplied substrate transferring schedule to a state prior to the starting of loading of a previously supplied scheduled substrate. Then, control goes to step ST201-3. In step ST201-3, the scheduler 40 sets a time prior to the starting of loading of the previously supplied scheduled substrate to a present simulation time. Then, control goes to step ST201-4. In step ST201-4, the scheduler 40 generates a retrieving and transferring sequence and a process condition for the new retrieval designated substrate. Then, control goes to step ST201-5. In step ST201-5, the scheduler 40 copies all transferring simulation state variable data to a storage area prior to the starting of retrieval.

Figure 18:
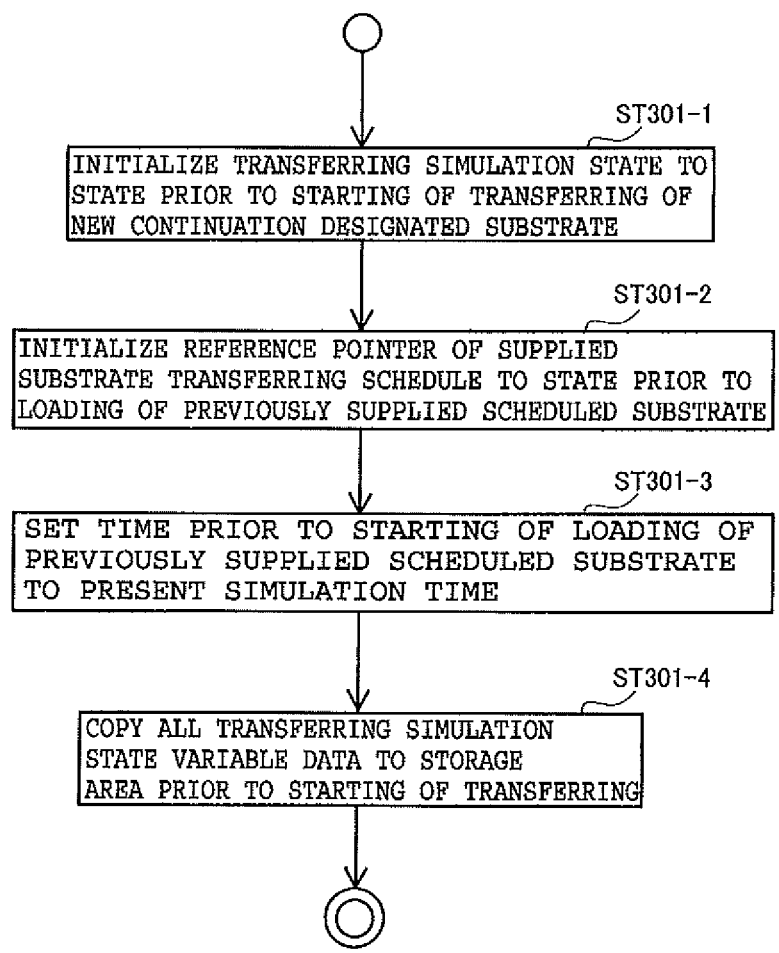
FIG. 18 is a flowchart of a processing sequence of a process failure substrate continuous transferring simulation initializing process (step ST301 shown in FIG. 14)

FIG. 18 is a flowchart of a processing sequence of the process failure substrate continuous transferring simulation initializing process (step ST301 shown in FIG. 14). In step ST301-1, the scheduler 40 initializes the transferring simulation state to a state prior to the starting of transferring of a new continuation designated substrate. Then, control goes to step ST301-2. The transferring simulation state includes all unit information data, transfer device information data, and data required for the transferring simulation. Specifically, the scheduler 40 initializes the transferring simulation state by copying a data set, which has been copied to a storage area at the time when the transferring simulation for a previously supplied scheduled substrate has started (step ST201-5 shown in FIG. 17), to a transferring simulation variable area in an overwrite mode. In step ST301-2, the scheduler 40 initializes a reference pointer of the supplied substrate transferring schedule to a state prior to the loading of a previously supplied scheduled substrate. Then, control goes to step ST301-3. The reference pointer is used to refer successively to the existing substrate transferring schedule in order to start transferring the supplied substrate according to the sequence of the existing substrate transferring schedule.

In step ST301-3, the scheduler 40 sets a time prior to the starting of loading of the previously supplied scheduled substrate to a present simulation time. Then, control goes to step ST301-4. In the process failure substrate continuous transferring simulation, since the transferring sequence and the process condition for the new continuation designated substrate are already present, they do not need to be generated. In step ST301-4, the scheduler 40 copies all transferring simulation state variable data to a storage area prior to the starting of transferring.

Figure 19:
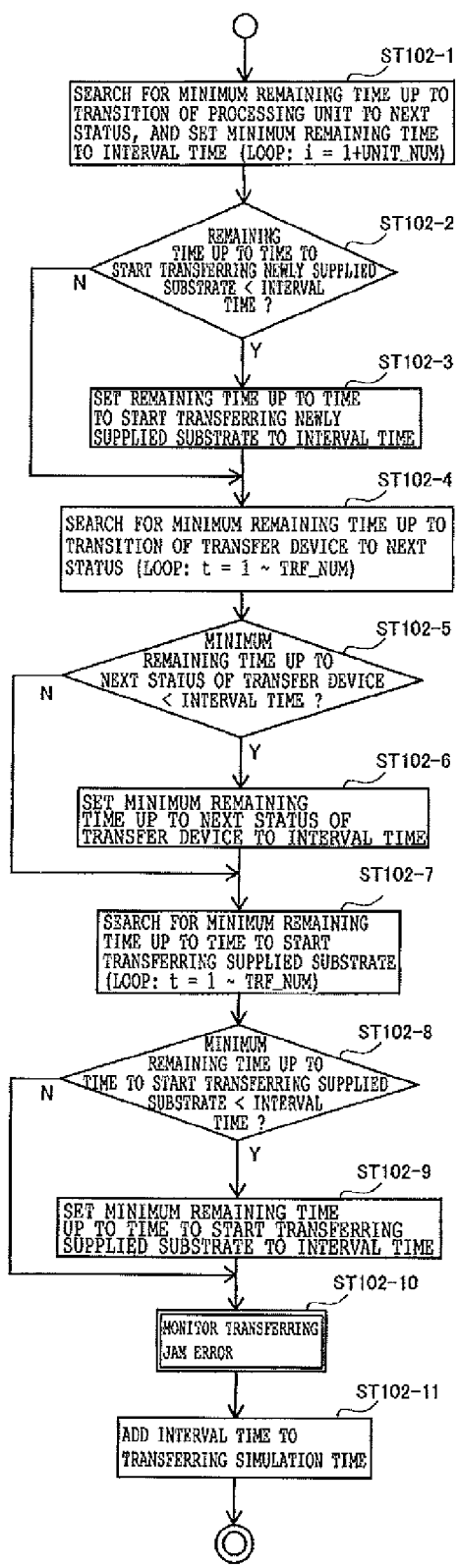
FIG. 19 is a flowchart of a processing sequence of a transferring simulation time clocking process (step ST102 shown in FIG. 12, step ST202 shown in FIG. 13, step ST302 shown in FIG. 14, and step ST402 shown in FIG. 15)

FIG. 19 is a flowchart of a processing sequence of the transferring simulation time clocking process (step ST102 shown in FIG. 12, step ST202 shown in FIG. 13, step ST302 shown in FIG. 14, and step ST402 shown in FIG. 15). In step ST102-1, the scheduler 40 searches for a minimum remaining time up to the transition of a processing unit to a next status, and sets the minimum remaining time to an interval time. Then, control goes to step ST102-2. In step ST102-2, the scheduler 40 determines whether the remaining time up to a time to start transferring a newly supplied substrate is smaller than the interval time (remaining time<interval time) or not. If the remaining time is smaller than the interval time (Y), then control goes to step ST102-3. If the remaining time is not smaller than the interval time (N), then control goes to step ST102-4. In step ST102-3, the scheduler 40 sets the remaining time up to a time to start transferring a newly supplied substrate to the interval time. Then, control goes to step ST102-4. In step ST102-4, the scheduler 40 searches for a minimum remaining time up to the transition of a transfer device to a next status. Then, control goes to step ST102-5.

In step ST102-5, the scheduler 40 determines whether the minimum remaining time up to a next status of the transfer device is smaller than the interval time (minimum remaining time<interval time) or not. If the minimum remaining time is smaller than the interval time (Y), then control goes to step ST102-6. If the minimum remaining time is not smaller than the interval time (N), then control goes to step ST102-7. In step ST102-6, the scheduler 40 sets the minimum remaining time up to a next status of the transfer device to the interval time. Then, control goes to step ST102-7. In step ST102-7, the scheduler 40 searches for a minimum remaining time up to a time to start transferring a supplied substrate. Then, control goes to step ST102-8.

In step ST102-8, the scheduler 40 determines whether the minimum remaining time up to a time to start transferring a supplied substrate is smaller than the interval time (minimum remaining time<interval time) or not. If the minimum remaining time is smaller than the interval time (Y), then control goes to step ST102-9. If the minimum remaining time is not smaller than the interval time (N), then control goes to step ST102-10.

In step ST102-9, the scheduler 40 sets the minimum remaining time up to a time to start transferring a supplied substrate to the interval time. In step ST102-10, the scheduler 40 monitors a transferring jam error. Then, control goes to step ST102-11. The scheduler 40 monitors a transferring jam error by detecting a situation wherein the interval time becomes zero a certain number of times or more. If the scheduler 40 detects such a situation, then the scheduler 40 sets a new substrate supplying time to a constant value as representing a transferring error. In step ST102-11, the scheduler 40 adds the interval time to the transferring simulation time.

Figure 20:
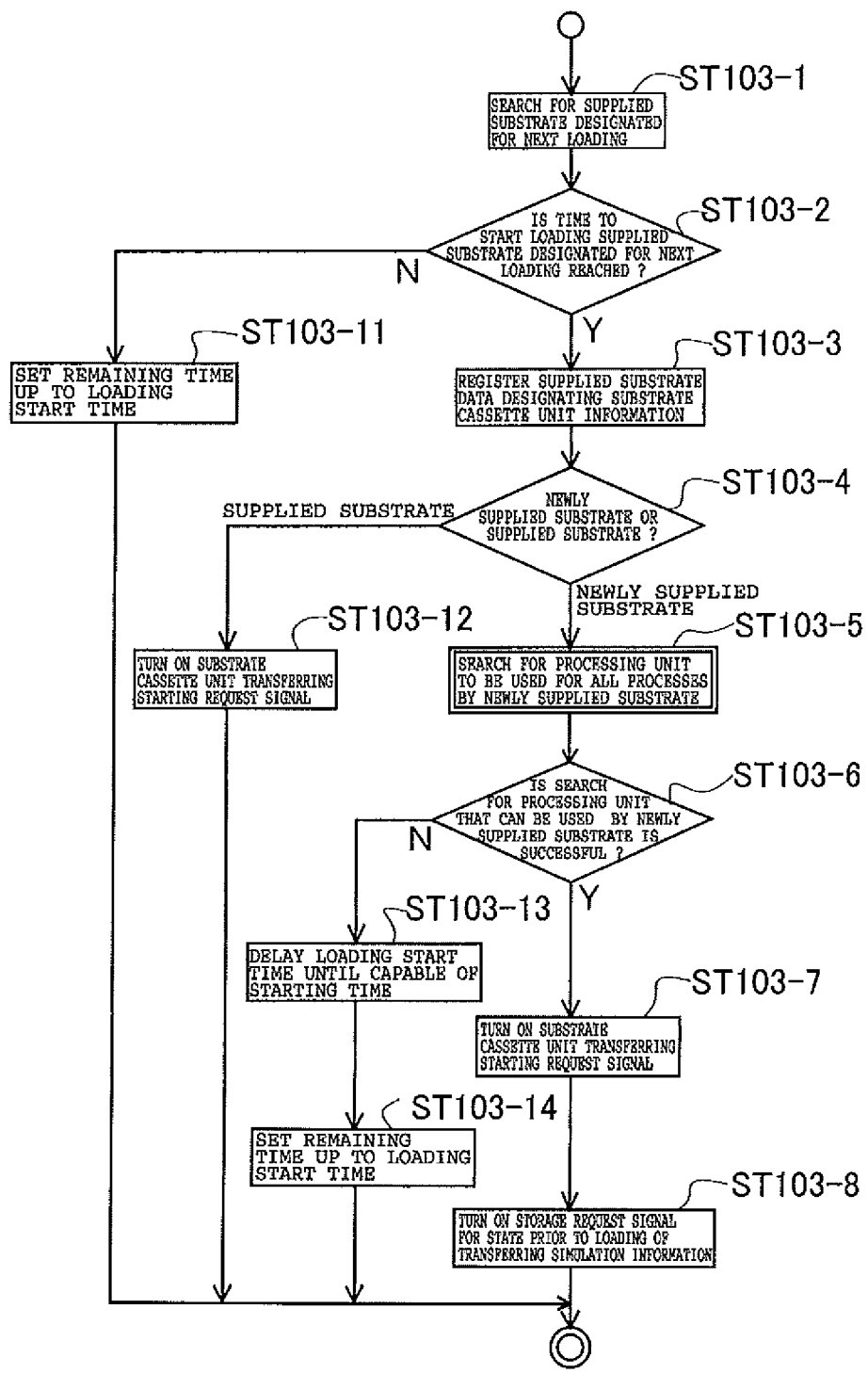
FIG. 20 is a flowchart of a processing sequence of a supply starting process for a newly supplied substrate in a substrate cassette or a supplied substrate (step ST103 shown in FIG. 12)

FIG. 20 is a flowchart of a processing sequence of the supply starting process for a newly supplied substrate in a substrate cassette or a supplied cassette (step ST103 shown in FIG. 12). In step ST103-1, the scheduler 40 searches for a supplied substrate designated for next loading. Then, control goes to step ST103-2. Specifically, the scheduler 40 searches for a supplied substrate designated for next loading by searching for and designating substrates for next loading according to the sequence of processed substrates which have been scheduled, and designating a newly supplied substrate for next loading at the final end of the sequence. In step ST103-2, the scheduler 40 determines whether a time to start loading a supplied substrate designated for next loading has been reached or not. If the time has been reached (Y), then control goes to step ST103-3. If the time has not been reached (N), then control goes to step ST103-11.

In step ST103-3, the scheduler 40 registers supplied substrate data designating substrate cassette unit information. Then, control goes to step ST103-4. In step ST103-4, the scheduler 40 determines whether the substrate is a newly supplied substrate or a supplied substrate. If the substrate is a newly supplied substrate, then control goes to step ST103-5. If the substrate is a supplied substrate, then control goes to step ST103-12.

In step ST103-5, the scheduler 40 searches for a processing unit to be used for all processes by the newly supplied substrate. Then, control goes to step ST103-6. Specifically, the scheduler 40 searches, in advance, for a processing unit to be used for all processes after the substrate starts being newly supplied until it returns to a substrate cassette. If there are a plurality of processing units for the types of the processes and all of the processing units are being used, then a loading start time is adjusted depending on the processing unit which finishes its process at the earliest. In step ST103-6, the scheduler 40 determines whether the search for an idle processing unit that can be used for all processes by the newly supplied substrate is successful or not. If the search is successful (Y), then control goes to step ST103-7. If the search is not successful (N), then control goes to step ST103-13.

In step ST103-7, the scheduler 40 turns on a substrate cassette unit transferring starting request signal. Then, control goes to step ST103-8. In step ST103-8, the scheduler 40 turns on a storage request signal for a state prior to loading of transferring simulation information. When the storage request signal for a state prior to loading of transferring simulation information is turned on, transferring simulation information is copied to a designated storage area behind a transferring simulation loop.

In step ST103-11, the scheduler 40 sets a remaining time up to the loading start time. In step ST103-12, the scheduler 40 turns on the substrate cassette unit transferring starting request signal. In step ST103-13, the scheduler 40 delays the loading start time until a capable-of-starting time. Then, control goes to step ST103-14, in which the scheduler 40 sets a remaining time up to the loading start time.

Figure 21:
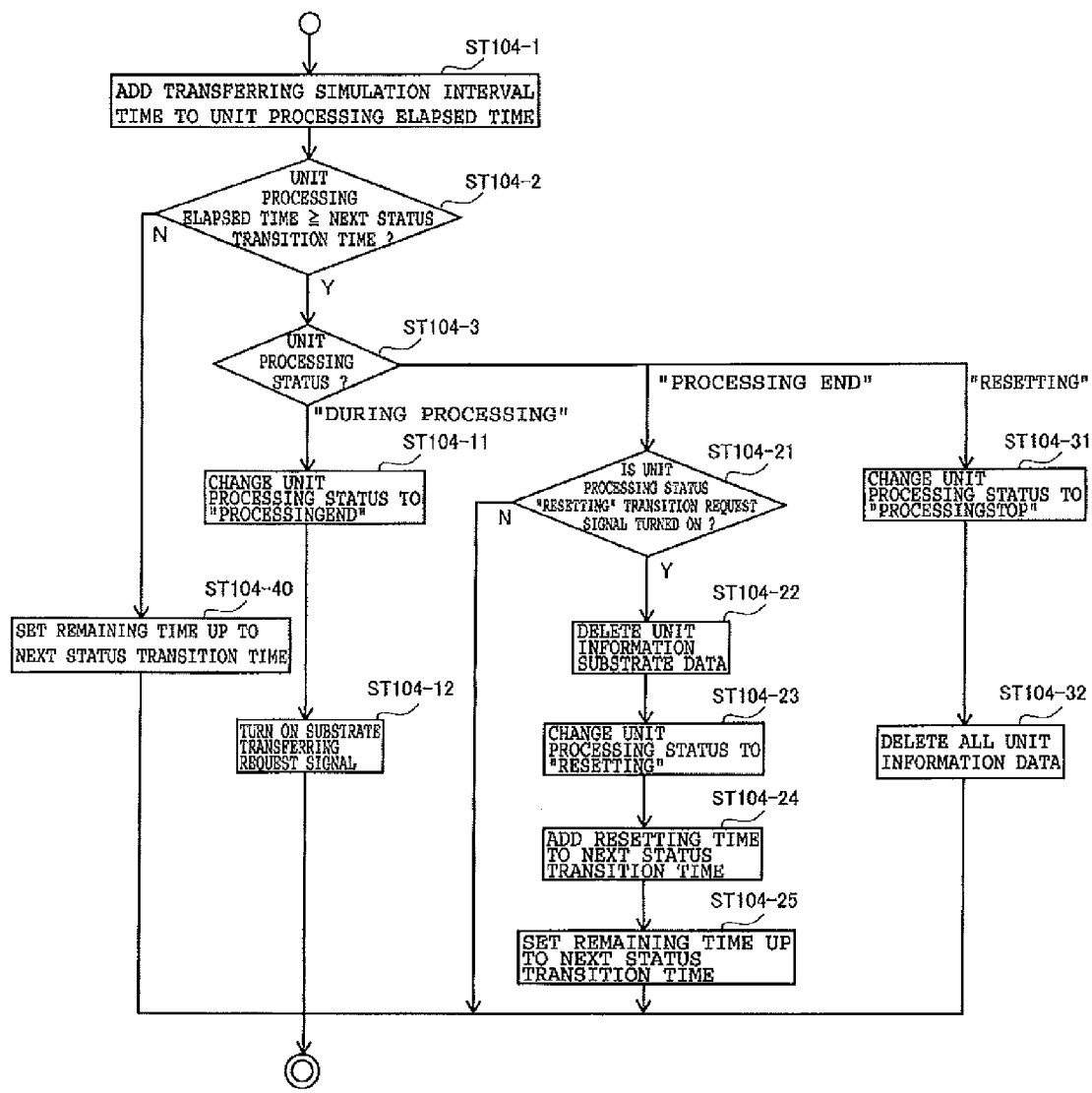
FIG. 21 is a flowchart of a processing sequence of a unit status updating process (step ST104 shown in FIG. 12, step ST203 shown in FIG. 13, step ST303 shown in FIG. 14, and step ST403 shown in FIG. 15)

FIG. 21 is a flowchart of a processing sequence of the unit status updating process (step ST104 shown in FIG. 12, step ST203 shown in FIG. 13, step ST303 shown in FIG. 14, and step ST403 shown in FIG. 15). In step ST104-1, the scheduler 40 adds a transferring simulation interval time to a unit processing elapsed time. Then, control goes to step ST104-2. In step ST104-2, the scheduler 40 determines whether the unit processing elapsed time has reached or exceeded a next status transition time (unit processing elapsed time≥next status transition time) or not. If the unit processing elapsed time has reached or exceeded a next status transition time (Y), then control goes to step ST104-3. If the unit processing elapsed time has not reached or exceeded a next status transition time (N), then control goes to step ST104-40. In step ST104-3, the scheduler 40 checks a unit processing status. If the unit processing status represents "during processing", then control goes to step ST104-11. If the unit processing status represents "processing end", then control goes to step ST104-21. If the unit processing status represents "resetting", then control goes to step ST104-31.

In step ST104-11, the scheduler 40 changes the unit processing status to "processing end". In step ST104-12, the scheduler 40 turns on a substrate transferring request signal. In step ST104-21, the scheduler 40 determines whether a unit processing status "resetting" transition request signal is turned on or not. If a unit processing status "resetting" transition request signal is turned on (Y), then control goes to step ST104-22. In step ST104-22, the scheduler 40 deletes unit information substrate data. Then, control goes to step ST104-23.

In step ST104-23, the scheduler 40 changes the unit processing status to "resetting". Then, control goes to step ST104-24. In step ST104-24, the scheduler 40 adds a resetting time to the next status transition time. Then, control goes to step ST104-25. In step ST104-25, the scheduler 40 sets a remaining time up to the next status transition time. In step ST104-31, the scheduler 40 changes the unit processing status to "processing stop". Then, control goes to step ST104-32. In step ST104-32, the scheduler 40 deletes all unit information data. In step ST104-40, the scheduler 40 sets a remaining time up to the next status transition time.

Figure 22:
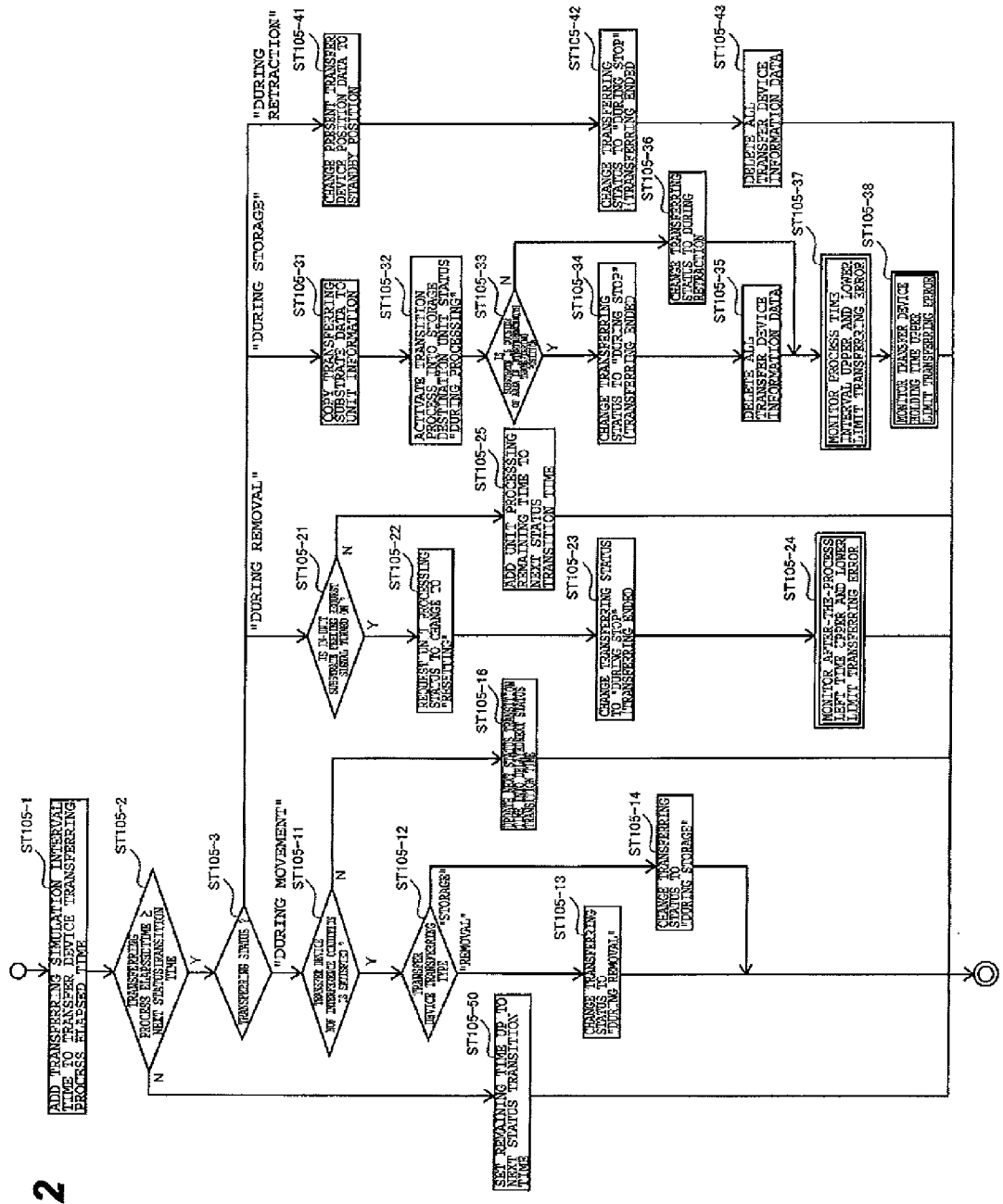
FIG. 22 is a flowchart of a processing sequence of a transfer device status updating process (step ST105 shown in FIG. 12, step ST204 shown in FIG. 13, and step ST304 shown in FIG. 14)

FIG. 22 is a flowchart of a processing sequence of the transfer device status updating process (step ST105 shown in FIG. 12, step ST204 shown in FIG. 13, and step ST304 shown in FIG. 14). In step ST105-1, the scheduler 40 adds a transferring simulation interval time to a transfer device transferring process elapsed time. Then, control goes to step ST105-2, in which the scheduler 40 determines whether the transferring process elapsed time has reached or exceeded a next status transition time (transferring process elapsed time≥next status transition time) or not. If the transferring process elapsed time has reached or exceeded a next status transition time (Y), then control goes to step ST105-3. If the transferring process elapsed time has not reached or exceeded a next status transition time (N), then control goes to step ST105-50. In step ST105-3, the scheduler 40 checks a transferring status. If the transferring status represents "during movement", then control goes to step ST105-11. If the transferring status represents "during removal", then control goes to step ST105-21. If the transferring status represents "during storage", then control goes to step ST105-31. If the transferring status represents "during retraction", then control goes to step ST105-41.

In step ST105-11, the scheduler 40 determines whether a transfer device non-interference condition is satisfied or not. If a transfer device non-interference condition is satisfied (Y), then control goes to step ST105-12. If a transfer device non-interference condition is not satisfied, then control goes to step ST105-16. In step ST105-12, the scheduler 40 checks a transfer device transferring type. If the transfer device transferring type represents "removal", then control goes to step ST105-13, in which the scheduler 40 changes the transferring status to "during removal". If the transfer device transferring type represents "storage", then control goes to step ST105-14, in which the scheduler 40 changes the transferring status to "during storage". In step ST105-16, the scheduler 40 updates the next status transition time into a delayed next status transition time.

In step ST105-21, the scheduler 40 determines whether an in-unit substrate transferring request signal is turned on or not. If an in-unit substrate transferring request signal is turned on (Y), then control goes to step ST105-22. If an in-unit substrate transferring request signal is not turned on (N), then control goes to step ST105-25. In step ST105-22, the scheduler 40 requests the unit processing status to change to "resetting". In step ST105-23, the scheduler 40 changes the transferring status to "during stop" (transferring ended). In step ST105-24, the scheduler 40 monitors a post-process left time upper and lower limit transferring error. In step ST105-25, the scheduler 40 adds a unit processing remaining time to the next status transition time.

In step ST105-31, the scheduler 40 copies the transferring substrate data to unit information. In step ST105-32, the scheduler 40 activates a transition process into a storage destination unit status "during processing". Then, control goes to step ST105-33. In step ST105-33, the scheduler 40 determines whether the substrate is outside of an area in interference with the transfer device position or not. If the substrate is outside of an area in interference with the transfer device position (Y), then control goes to step ST105-34. If the substrate is not outside of an area in interference with the transfer device position (N), then control goes to step ST105-36. In step ST105-34, the scheduler 40 changes the transferring status to "during stop" (transferring ended). In step ST105-35, the scheduler 40 deletes all transfer device information data. Then, control goes to step ST105-37. In step ST105-36, the scheduler 40 changes the transferring status to "during retraction". Then, control goes to step ST105-37. In step ST105-37, the scheduler 40 monitors a process time interval upper and lower limit transferring error. In step ST105-38, the scheduler 40 monitors a transfer device holding time upper limit transferring error.

In step ST105-41, the scheduler 40 changes present transfer device position data to a standby position. Then, control goes to step ST105-42. In step ST105-42, the scheduler 40 changes the transferring status to "during stop" (transferring ended). Then, control goes to step ST105-43. In step ST105-43, the scheduler 40 deletes all transfer device information data. In step ST105-50, the scheduler 40 sets a remaining time up to the next status transition time.

Figure 23:
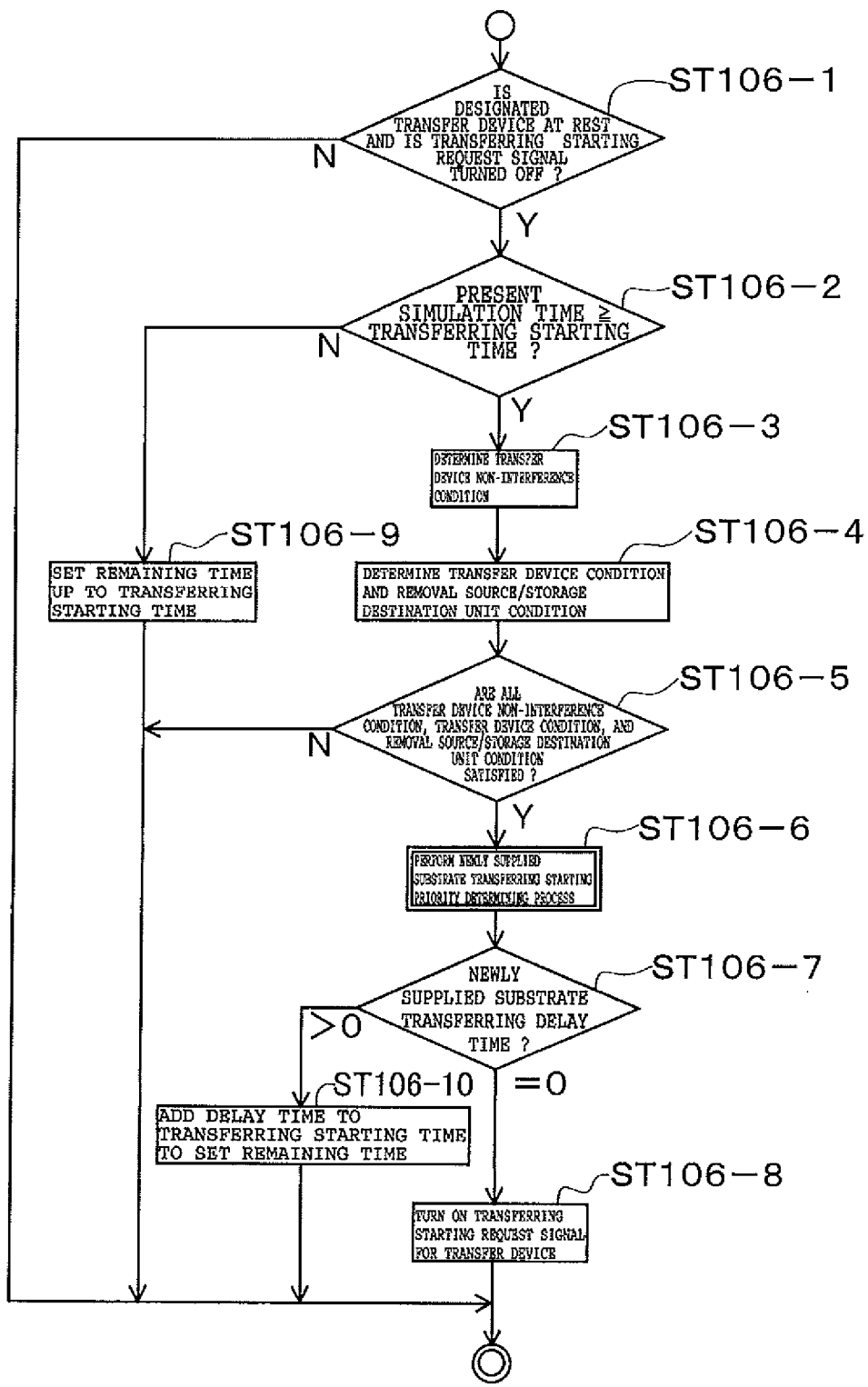
FIG. 23 is a flowchart of a processing sequence of a newly supplied substrate transferring starting determining process (step ST106 shown in FIG. 12)

FIG. 23 is a flowchart of a processing sequence of the newly supplied substrate transferring starting determining process (step ST106 shown in FIG. 12). Since the newly supplied substrate transferring starting determining process is performed while a designated transfer device is at rest, the scheduler 40 determines whether the designated transfer device is at rest and a transferring starting request signal is turned off or not, in step ST106-1. If the designated transfer device is at rest and a transferring starting request signal is turned off (Y), then control goes to step ST106-2. In step ST106-2, the scheduler 40 determines whether the present simulation time has reached or exceeded a transferring starting time (present simulation time≥transferring starting time) or not. If the present simulation time has reached or exceeded a transferring starting time (Y), then control goes to step ST106-3. If the present simulation time has not reached or exceeded a transferring starting time (N), then control goes to step ST106-9. For substrate removal, the transferring starting time refers to a time set by subtracting a prescribed time for the arrival to a transfer device from a process recipe setting time with respect to unit information. For substrate storage, the transferring starting time refers to the present simulation time itself.

In step ST106-3, the scheduler 40 determines a transfer device non-interference condition. In step ST106-4, the scheduler 40 determines a transfer device condition and a removal source/storage destination unit condition. Then, control goes to step ST106-5. To determine the transfer device condition, the scheduler 40 determines whether a transfer device hand is not carrying a substrate or not to see if the transfer device condition represents substrate removal, and determines whether a transfer device hand is carrying a substrate or not to see if the transfer device condition represents substrate storage. To determine the removal source/storage destination unit condition, the scheduler 40 determines whether a substrate is present in a removal source and another substrate is not present in a storage destination.

In step ST106-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST106-6. In step ST106-6, the scheduler 40 performs a newly supplied substrate transferring starting priority determining process. Then, control goes to step ST106-7. In the newly supplied substrate transferring starting priority determining process, if a delay time with respect to the time to start transferring a supplied substrate exceeds a set allowable value providing a newly supplied substrate immediately starts being transferred, then the scheduler 40 determines whether the transferring of the newly substrate has priority over the transferring of the supplied substrate or not, using a priority parameter.

In step ST106-7, the scheduler 40 determines whether a transferring delay time of the newly supplied substrate is equal to 0 (=0) or of a positive numerical value (>0). If the transferring delay time is equal to 0, then control goes to step ST106-8, in which the scheduler 40 turns on a transferring starting request signal for the transfer device. If the transferring delay time is of a positive numerical value, then control goes to step ST106-10, in which the scheduler 40 adds the delay time to the transferring starting time to set a remaining time. The remaining time is used to calculate an interval time for clocking the transferring simulation time. In step ST106-9, the scheduler 40 sets a remaining time up to a planned transferring starting time.

Figure 24:
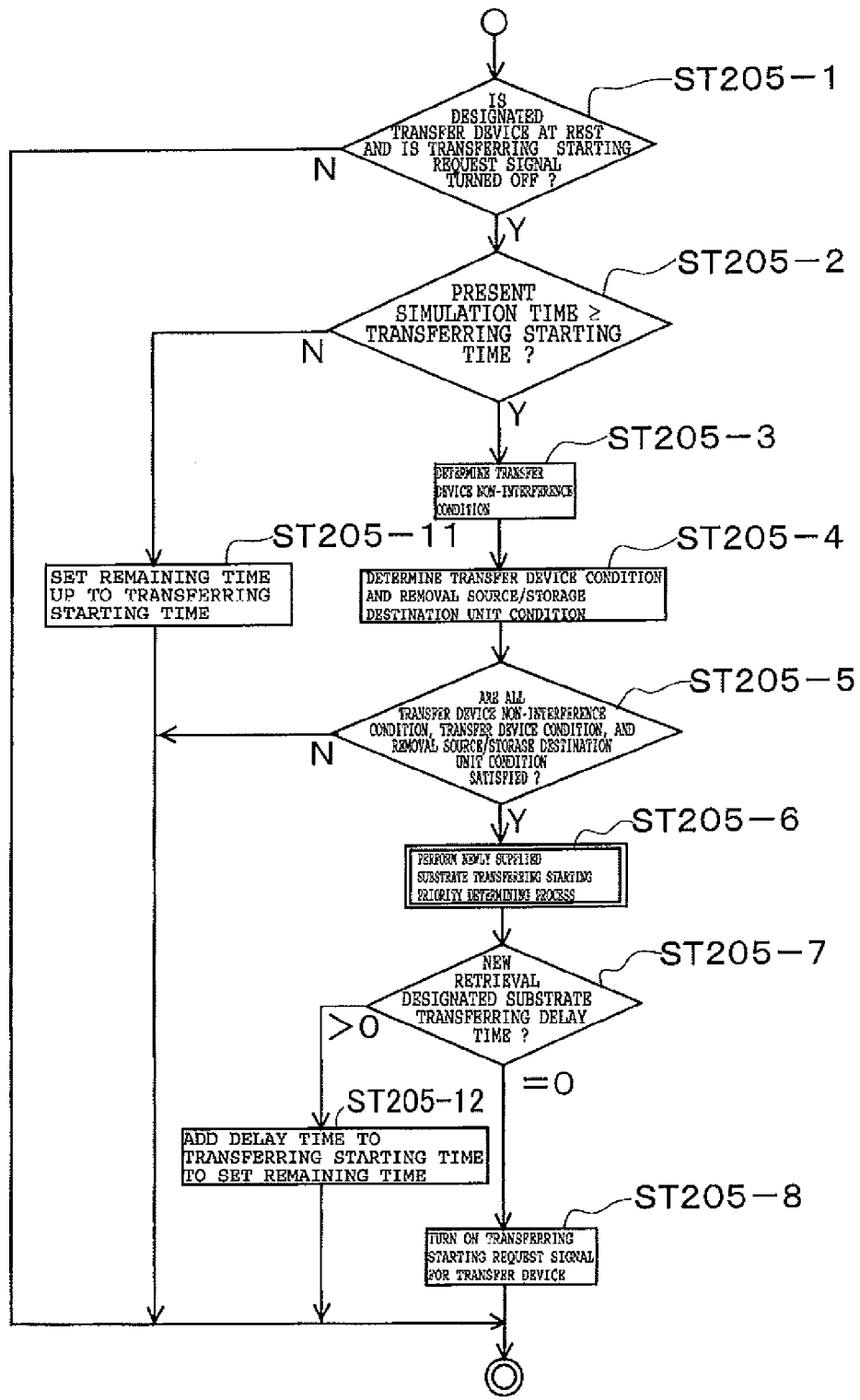
FIG. 24 is a flowchart of a processing sequence of a new retrieval designated substrate transferring starting determining process (step ST205 shown in FIG. 13 and step ST405 shown in FIG. 15)

FIG. 24 is a flowchart of a processing sequence of the new retrieval designated substrate transferring starting determining process (step ST205 shown in FIG. 13 and step ST405 shown in FIG. 15) for a new retrieval designated substrate that remains in the substrate processing apparatus. Since the new retrieval designated substrate transferring starting determining process is performed while a designated transfer device is at rest, the scheduler 40 determines whether the designated transfer device is at rest and a transferring starting request signal is turned off or not, in step ST205-1. If the designated transfer device is at rest and a transferring starting request signal is turned off (Y), then control goes to step ST205-2. In step ST205-2, the scheduler 40 determines whether the present simulation time has reached or exceeded a transferring starting time (present simulation time≥transferring starting time) or not. If the present simulation time has reached or exceeded a transferring starting time (Y), then control goes to step ST205-3. If the present simulation time has not reached or exceeded a transferring starting time (N), then control goes to step ST205-11. For substrate removal, the transferring starting time refers to a time set by subtracting a prescribed time for the arrival of a transfer device from a process recipe setting time with respect to unit information. For substrate storage, the transferring starting time refers to the present simulation time itself.

In step ST205-3, the scheduler 40 determines a transfer device non-interference condition. In step ST205-4, the scheduler 40 determines a transfer device condition and a removal source/storage destination unit condition. Then, control goes to step ST205-5. In step ST205-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST205-6. In step ST205-6, the scheduler 40 performs a newly supplied substrate transferring starting priority determining process. Then, control goes to step ST205-7. In the newly supplied substrate transferring starting priority determining process, if a delay time with respect to the time to start transferring a retrieval scheduled substrate exceeds a set allowable value providing a new retrieval designated substrate immediately starts being transferred, then the scheduler 40 determines whether the transferring of the new retrieval designated substrate has priority over the transferring of the retrieval scheduled substrate or not, using a priority parameter.

In step ST205-7, the scheduler 40 determines whether a transferring delay time of the new retrieval designated substrate is equal to 0 (=0) or of a positive numerical value (>0). If the transferring delay time is equal to 0, then control goes to step ST205-8, in which the scheduler 40 turns on a transferring starting request signal for the transfer device. If the transferring delay time is of a positive numerical value, then control goes to step ST205-12, in which the scheduler 40 adds the delay time to the transferring starting time to set a remaining time. In step ST205-11, the scheduler 40 sets a remaining time up to the transferring starting time.

Figure 25:
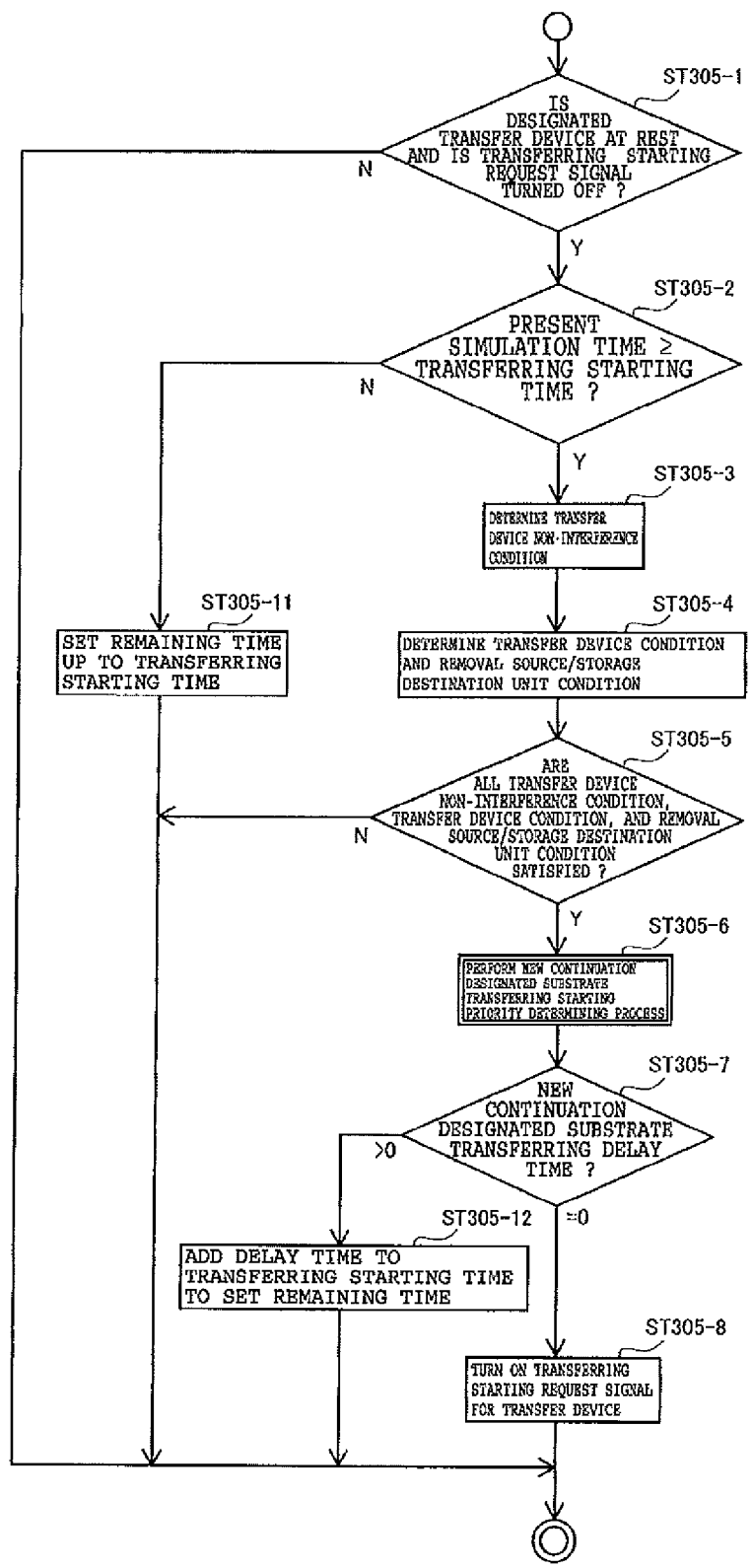
FIG. 25 is a flowchart of a processing sequence of a new continuation designated substrate transferring starting determining process (step ST305 shown in FIG. 14)

FIG. 25 is a flowchart of a processing sequence of the new continuation designated substrate transferring starting determining process (step ST305 shown in FIG. 14). In step ST305-1, the scheduler 40 determines whether the designated transfer device is at rest and a transferring starting request signal is turned off or not, in step ST305-1. If the designated transfer device is at rest and a transferring starting request signal is turned off (Y), then control goes to step ST305-2. In step ST305-2, the scheduler 40 determines whether the present simulation time has reached or exceeded a transferring starting time (present simulation time≥transferring starting time) or not. If the present simulation time has reached or exceeded a transferring starting time (Y), then control goes to step ST305-3. If the present simulation time has not reached or exceeded a transferring starting time (N), then control goes to step ST305-11, in which the scheduler 40 sets a remaining time up to the transferring stating time. For substrate removal, the transferring starting time refers to a time set by subtracting a prescribed time for the arrival to the transfer device from a process recipe setting time with respect to unit information. For substrate storage, the transferring starting time refers to the present simulation time itself.

In step ST305-3, the scheduler 40 determines a transfer device non-interference condition. Then, control goes to step ST305-4. If the designated transfer device enters an area in interference with an adjacent transfer device, then the scheduler 40 determines whether the adjacent transfer device accesses the interference area or not, or if the adjacent transfer device is planning to access the interference area, then the scheduler 40 determines whether the designated transfer device has reserved the interference area or not. In step S305-4, the scheduler 40 determines a transfer device condition and a removal source/storage destination unit condition. Then, control goes to step ST305-5. To determine the transfer device condition, the scheduler 40 determines whether a transfer device hand is not carrying a substrate or not to see if the transfer device condition represents substrate removal, and determines whether a transfer device hand is carrying a substrate or not to see if the transfer device condition represents substrate storage. To determine the removal source/storage destination unit condition, the scheduler 40 determines whether a substrate is present in a removal source and another substrate is not present in a storage destination.

In step ST305-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST305-6. In step ST305-6, the scheduler 40 performs a new continuation designated substrate transferring starting priority determining process. Then, control goes to step ST305-7. In the new continuation designated substrate transferring starting priority determining process, if a delay time with respect to the time to start transferring a retrieval scheduled substrate exceeds a set allowable value providing a new continuation designated substrate immediately starts being transferred then the scheduler 40 determines whether the transferring of the new continuation designated substrate has priority over the transferring of the retrieval scheduled substrate or not, using a priority parameter. In step ST305-7, the scheduler 40 determines whether a transferring delay time of the new continuation designated substrate is equal to 0 (=0) or of a positive numerical value (>0). If the transferring delay time is equal to 0, then control goes to step ST305-8, in which the scheduler 40 turns on a transferring starting request signal for the transfer device. If the transferring delay time is of a positive numerical value, then control goes to step ST305-12, in which the scheduler 40 adds the delay time to the transferring starting time to set a remaining time. The remaining time is used to calculate an interval time for clocking the transferring simulation time.

Figure 26:
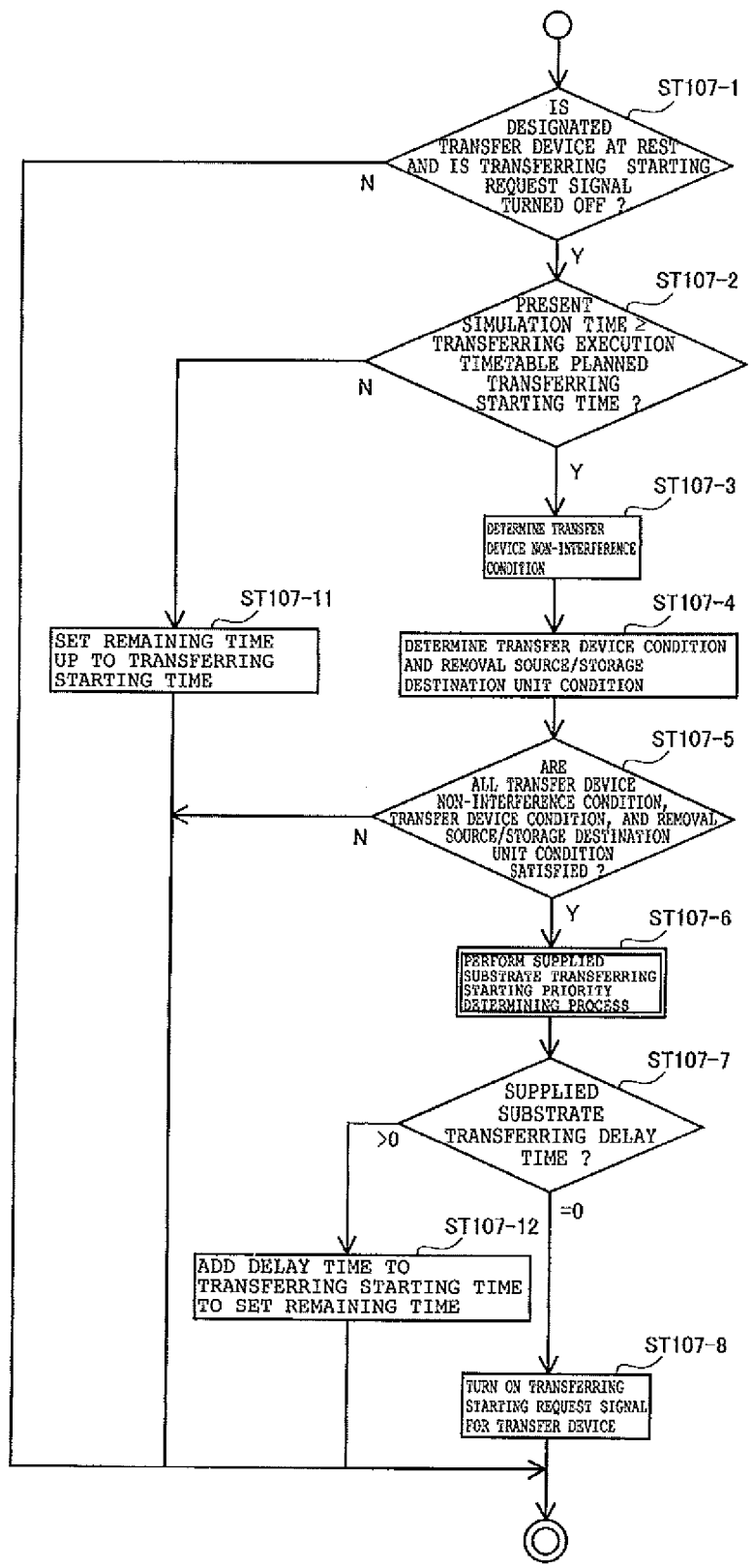
FIG. 26 is a flowchart of a processing sequence of a supplied substrate transferring starting determining process (step ST107 shown in FIG. 12)

FIG. 26 is a flowchart of a processing sequence of the supplied substrate transferring starting determining process (step ST107 shown in FIG. 12). In step ST107-1, the scheduler 40 determines whether the designated transfer device is at rest and a transferring starting request signal is turned off or not. If the designated transfer device is at rest and a transferring starting request signal is turned off (Y), then control goes to step ST107-2. In step ST107-2, the scheduler 40 determines whether the present simulation time has reached or exceeded a transferring execution timetable planned transferring starting time (present simulation time≥transferring execution timetable planned transferring starting time) or not. If the present simulation time has reached or exceeded a transferring execution timetable planned transferring starting time (Y), then control goes to step ST107-3. If the present simulation time has not reached or exceeded a transferring execution timetable planned transferring starting time (N), then control goes to step ST107-11. The planned transferring starting time refers to a time in a row which is referred to by a pointer of the substrate transferring schedule.

In step ST107-3, the scheduler 40 determines a transfer device non-interference condition. Then, control goes to step ST107-4. If the designated transfer device enters an area in interference with an adjacent transfer device, then the scheduler 40 determines whether the adjacent transfer device accesses the interference area or not, or if the adjacent transfer device is planning to access the interference area, then the scheduler 40 determines whether the designated transfer device has reserved the interference area or not. In step ST107-4, the scheduler 40 determines a transfer device condition and a removal source/storage destination unit condition. Then, control goes to step ST107-5. To determine the transfer device condition, the scheduler 40 determines whether a transfer device hand is not carrying a substrate or not to see if the transfer device condition represents substrate removal, and determines whether a transfer device hand is carrying a substrate or not to see if the transfer device condition represents substrate storage. To determine the removal source/storage destination unit condition, the scheduler 40 determines whether another substrate is not present in a removal source. In step ST107-11, the scheduler 40 sets a remaining time up to a planned time for the transferring starting time.

In step ST107-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST107-6. In step ST107-6, the scheduler 40 performs a supplied substrate transferring starting priority determining process. Then, control goes to step ST107-7. In the supplied substrate transferring starting priority determining process, if a delay time with respect to the planned transferring time exceeds a set allowable value providing a supplied substrate immediately starts being transferred, then the scheduler 40 determines whether the transferring of the new substrate has priority over the transferring of the supplied substrate or not, using a priority parameter.

In step ST107-7, the scheduler 40 determines whether a transferring delay time of the supplied substrate is equal to 0 (=0) or of a positive numerical value (>0). If the transferring delay time is equal to 0, then control goes to step ST107-8, in which the scheduler 40 turns on a transferring starting request signal for the transfer device. If the transferring delay time is of a positive numerical value, then control goes to step ST107-12, in which the scheduler 40 adds the delay time to the planned transferring starting time to set a remaining time. The remaining time is used to calculate an interval time for clocking the transferring simulation time.

Figure 27:
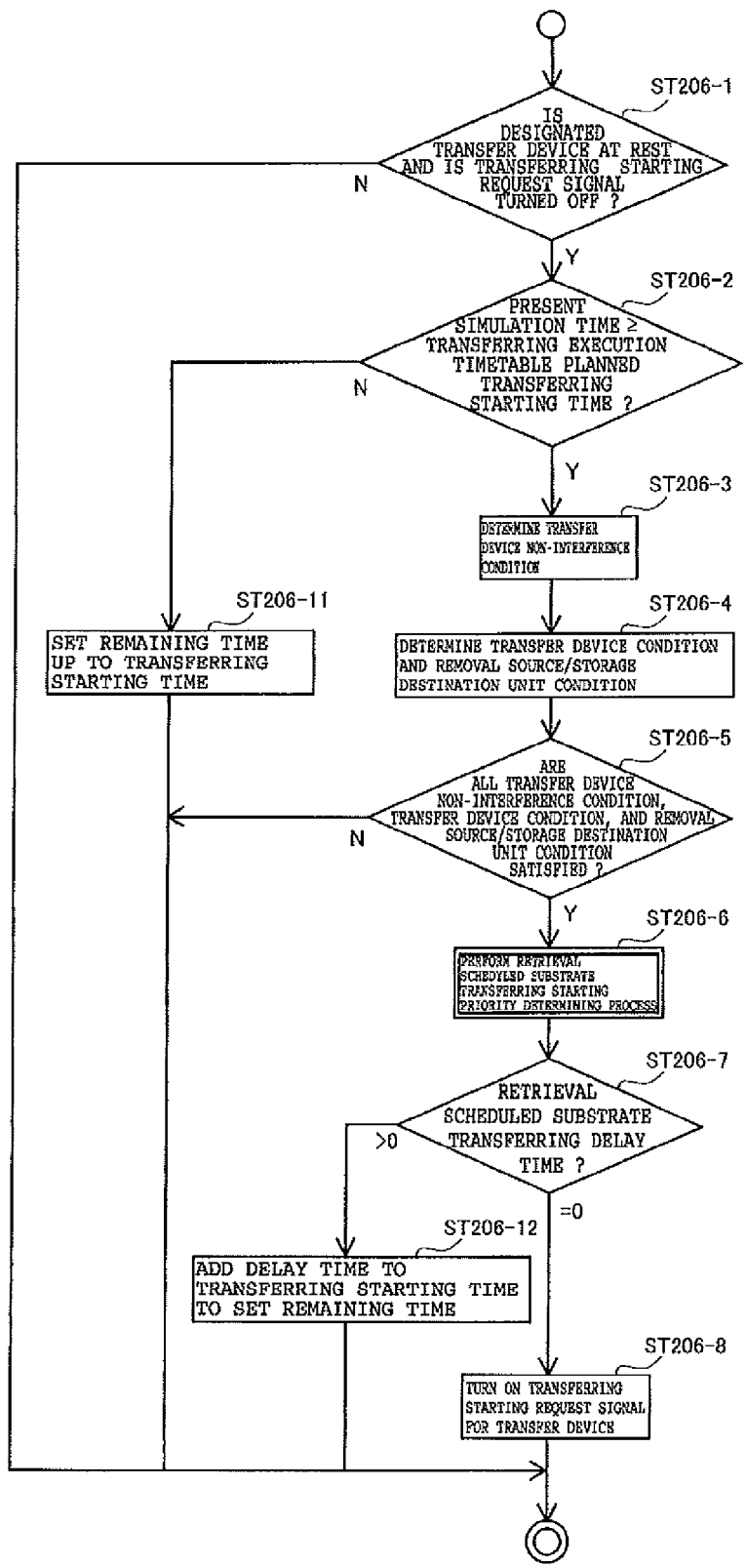
FIG. 27 is a flowchart of a processing sequence of a retrieval scheduled substrate transferring starting determining process (step ST206 shown in FIG. 13)

FIG. 27 is a flowchart of a processing sequence of the retrieval scheduled substrate transferring starting determining process (step ST206 shown in FIG. 13) for a retrieval scheduled substrate that remains in the substrate processing apparatus. In step ST206-1, the scheduler 40 determines whether the designated transfer device is at rest and a transferring starting request signal is turned off or not. If the designated transfer device is at rest and a transferring starting request signal is turned off (Y), then control goes to step ST206-2. In step ST206-2, the scheduler 40 determines whether the present simulation time has reached or exceeded a transferring execution timetable planned transferring starting time (present simulation time≥transferring execution timetable planned transferring starting time) or not. If the present simulation time has reached or exceeded a transferring execution timetable planned transferring starting time (Y), then control goes to step ST206-3. If the present simulation time has not reached or exceeded a transferring execution timetable planned transferring starting time (N), then control goes to step ST206-11. The planned transferring starting time refers to a time in a row which is referred to by a pointer of the substrate transferring schedule.

In step ST206-3, the scheduler 40 determines a transfer device non-interference condition. In step ST206-4, the scheduler 40 determines a transfer device condition and a removal source/storage destination unit condition. Then, control goes to step ST206-5. To determine the transfer device condition, the scheduler 40 determines whether a transfer device hand is not carrying a substrate or not to see if the transfer device condition represents substrate removal, and determines whether a transfer device hand is carrying a substrate or not to see if the transfer device condition represents substrate storage. To determine the removal source/storage destination unit condition, the scheduler 40 determines whether a substrate is present in a removal source and another substrate is not present in a removal source. In step ST206-11, the scheduler 40 sets a remaining time up to a planned transferring starting time.

In step ST206-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST206-6. In step ST206-6, the scheduler 40 performs a retrieval scheduled substrate transferring starting priority determining process. Then, control goes to step ST206-7. In the retrieval scheduled substrate transferring starting priority determining process, if a delay time beyond a planned transferring time exceeds a set allowable value providing a retrieval scheduled substrate immediately starts being transferred, then the scheduler 40 determines whether the transferring of the retrieval scheduled substrate has priority over the transferring of the new retrieval designated substrate or not, using a priority parameter.

In step ST206-7, the scheduler 40 determines whether a transferring delay time of the retrieval scheduled substrate is equal to 0 (=0) or of a positive numerical value (>0). If the transferring delay time is equal to 0, then control goes to step ST206-8, in which the scheduler 40 turns on a transferring starting request signal for the transfer device. If the transferring delay time is of a positive numerical value, then control goes to step ST206-12, in which the scheduler 40 adds the delay time to the planned transferring starting time to set a remaining time. The remaining time is used to calculate an interval time for clocking the transferring simulation time.

Figure 28:
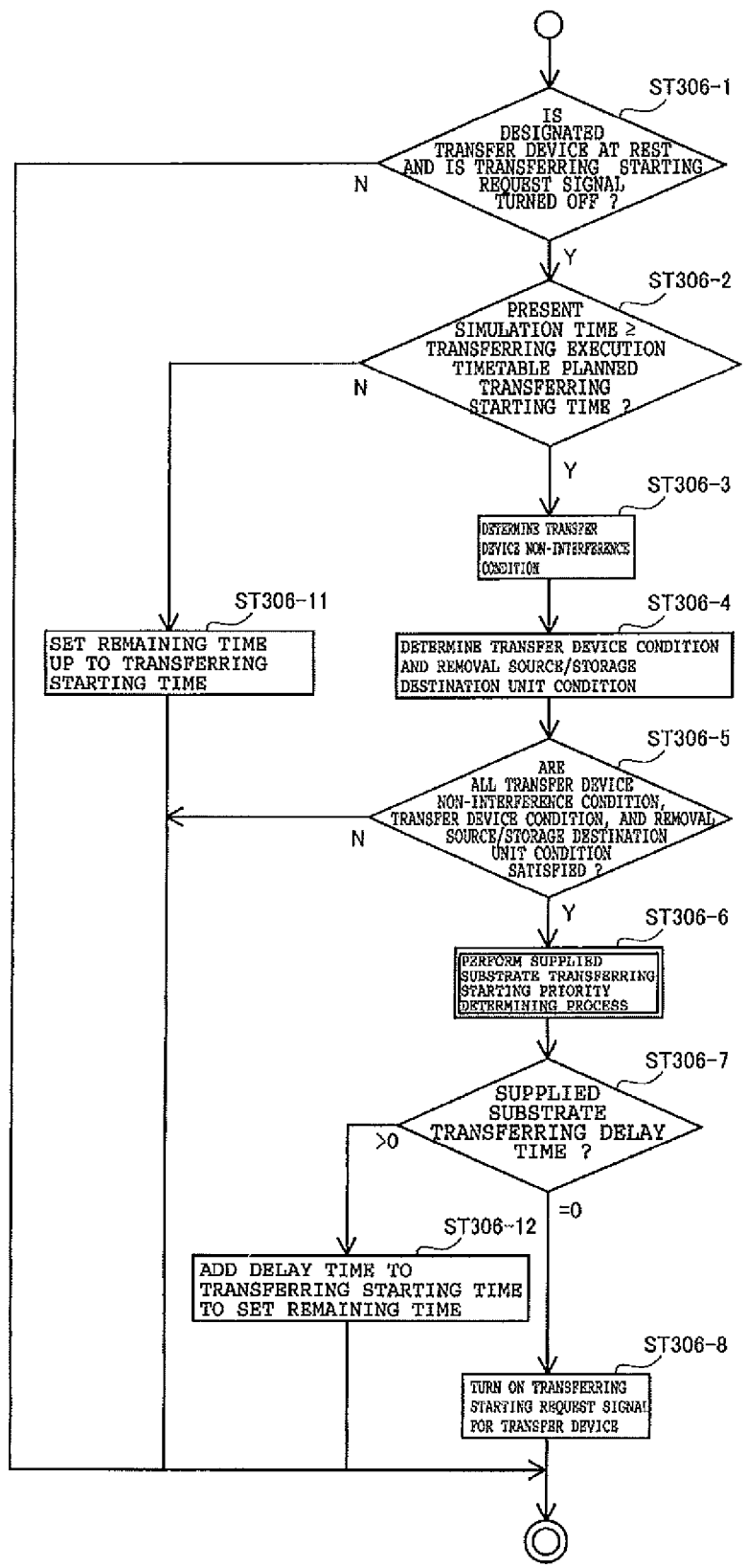
FIG. 28 is a flowchart of a processing sequence of a supplied substrate transferring starting determining process (step ST306 shown in FIG. 14 and step S406 shown in FIG. 15)

FIG. 28 is a flowchart of a processing sequence of the supplied substrate transferring starting determining process (step ST306 shown in FIG. 14 and step S406 shown in FIG. 15). In step ST306-1, the scheduler 40 determines whether the designated transfer device is at rest and a transferring starting request signal is turned off or not. If the designated transfer device is at rest and a transferring starting request signal is turned off (Y), then control goes to step ST306-2. In step ST306-2, the scheduler 40 determines whether the present simulation time has reached or exceeded a transferring execution timetable planned transferring starting time (present simulation time≥transferring execution timetable planned transferring starting time) or not. If the present simulation time has reached or exceeded a transferring execution timetable planned transferring starting time (Y), then control goes to step ST306-3. If the present simulation time has not reached or exceeded a transferring execution timetable planned transferring starting time (N), then control goes to step ST306-11. The planned transferring starting time refers to a time in a row which is referred to by a pointer of the substrate transferring schedule.

In step ST306-3, the scheduler 40 determines a transfer device non-interference condition. Then, control goes to step ST306-4. If the designated transfer device enters an area in interference with an adjacent transfer device, then the scheduler 40 determines whether the adjacent transfer device accesses the interference area or not, or if the adjacent transfer device is planning to access the interference area, then the scheduler 40 determines whether the designated transfer device has reserved the interference area or not. In step ST306-4, the scheduler 40 determines a transfer device condition and a removal source/storage destination unit condition. Then, control goes to step ST306-5. To determine the transfer device condition, the scheduler 40 determines whether a transfer device hand is not carrying a substrate or not to see if the transfer device condition represents substrate removal, and determines whether a transfer device hand is carrying a substrate or not to see if the transfer device condition represents substrate storage. To determine the removal source/storage destination unit condition, the scheduler 40 determines whether a substrate is present in a removal source and another substrate is not present in a removal source. In step ST306-11, the scheduler 40 sets a remaining time up to a planned transferring starting time.

In step ST306-5, the scheduler 40 determines whether all the transfer device non-interference condition, the transfer device condition, and the removal source/storage destination unit condition are satisfied or not. If all the transfer device non-interference condition, the transfer device condition, and the removal source/storage destination unit condition are satisfied (Y), then control goes to step ST306-6. In step ST306-6, the scheduler 40 performs a supplied substrate transferring starting priority determining process. Then, control goes to step ST306-7. In the supplied substrate transferring starting priority determining process, if a delay time beyond a planned transferring time for a new continuation designated or retrieval designated substrate exceeds a set allowable value providing a supplied substrate immediately starts being transferred, then the scheduler 40 determines whether the transferring of the supplied substrate has priority over the transferring of the new continuation designated or retrieval designated substrate or not, using a priority parameter.

In step ST306-7, the scheduler 40 determines whether a transferring delay time of the supplied substrate is equal to 0 (=0) or of a positive numerical value (>0). If the transferring delay time is equal to 0, then control goes to step ST306-8, in which the scheduler 40 turns on a transferring starting request signal for the transfer device. If the transferring delay time is of a positive numerical value, then control goes to step ST306-12 in which the scheduler 40 adds the delay time to the planned transferring starting time to set a remaining time. The remaining time is used to calculate an interval time for clocking the transferring simulation time.

Figure 29:
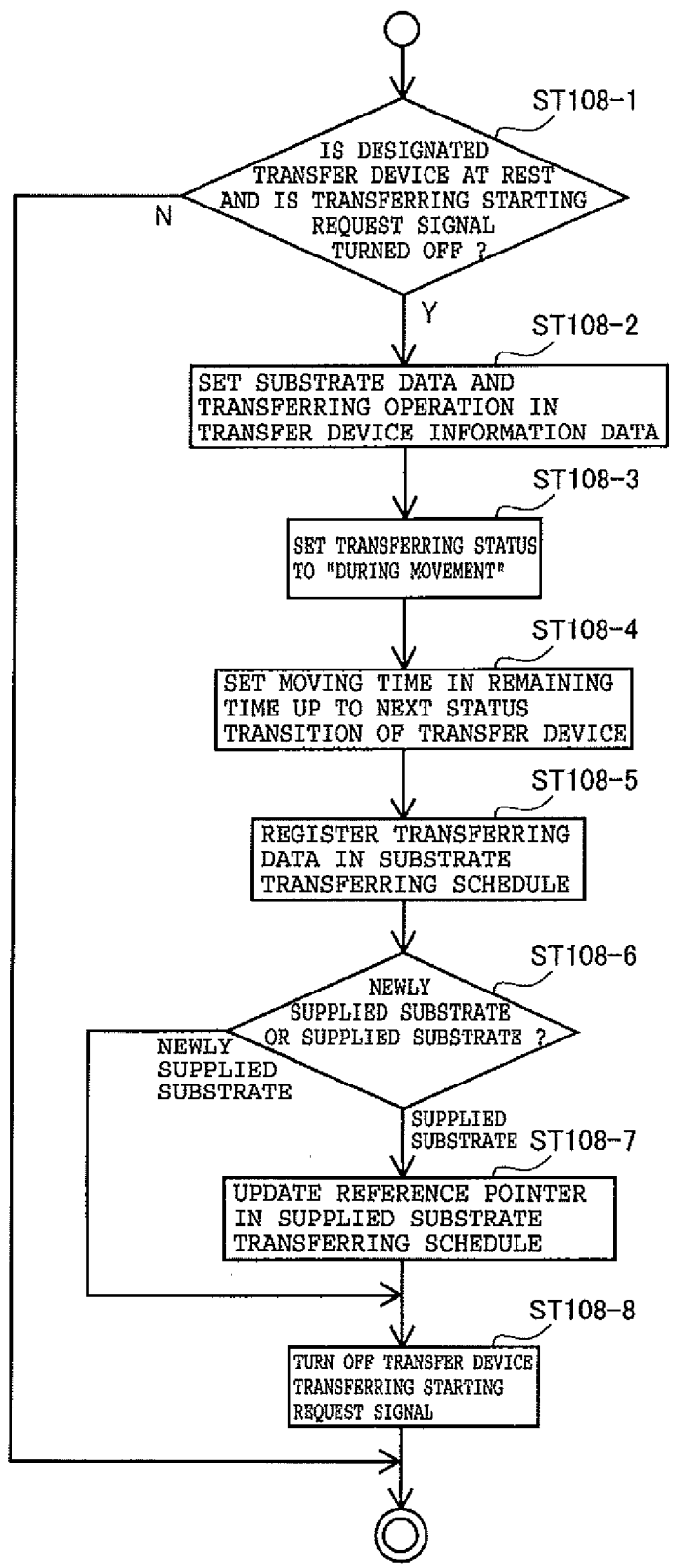
FIG. 29 is a flowchart of a processing sequence of a supplied substrate transferring starting determining process (step ST108 shown in FIG. 12, step ST207 shown in FIG. 13, step ST307 shown in FIG. 14, and step ST407 shown in FIG. 15)

FIG. 29 is a flowchart of a processing sequence of the newly supplied substrate or supplied substrate transferring starting determining process (step ST108 shown in FIG. 12, step ST207 shown in FIG. 13, step ST307 shown in FIG. 14, and step ST407 shown in FIG. 15). In step ST108-1, the scheduler 40 determines whether the designated transfer device is at rest and a transferring starting request signal is turned off or not. If the designated transfer device is at rest and a transferring starting request signal is turned off (Y), then control goes to step ST108-2. In step ST108-2, the scheduler 40 sets substrate transferring data and transferring operation in transfer device information data. Then, control goes to step ST108-3. In step ST108-3, the scheduler 40 sets a transferring status to "during movement". Then, control goes to step ST108-4. The transferring status is included as a property in the transfer device information data.

In step ST108-4, the scheduler 40 sets a moving time in a remaining time up to a next status transition of the transfer device. Then, control goes to step ST108-5. In step S108-5, the scheduler 40 registers the transferring data in the substrate transferring schedule. Then, control goes to step ST108-6. In step ST108-6, the scheduler 40 determines whether the substrate is a newly supplied substrate or a supplied substrate. If the substrate is a supplied substrate, then control goes to step ST108-7, in which the scheduler 40 updates a reference pointer in the supplied substrate transferring schedule. If the substrate is a newly supplied substrate, then control goes to step ST108-8, in which the scheduler 40 turns off a transfer device transferring starting request signal.

Figure 30:
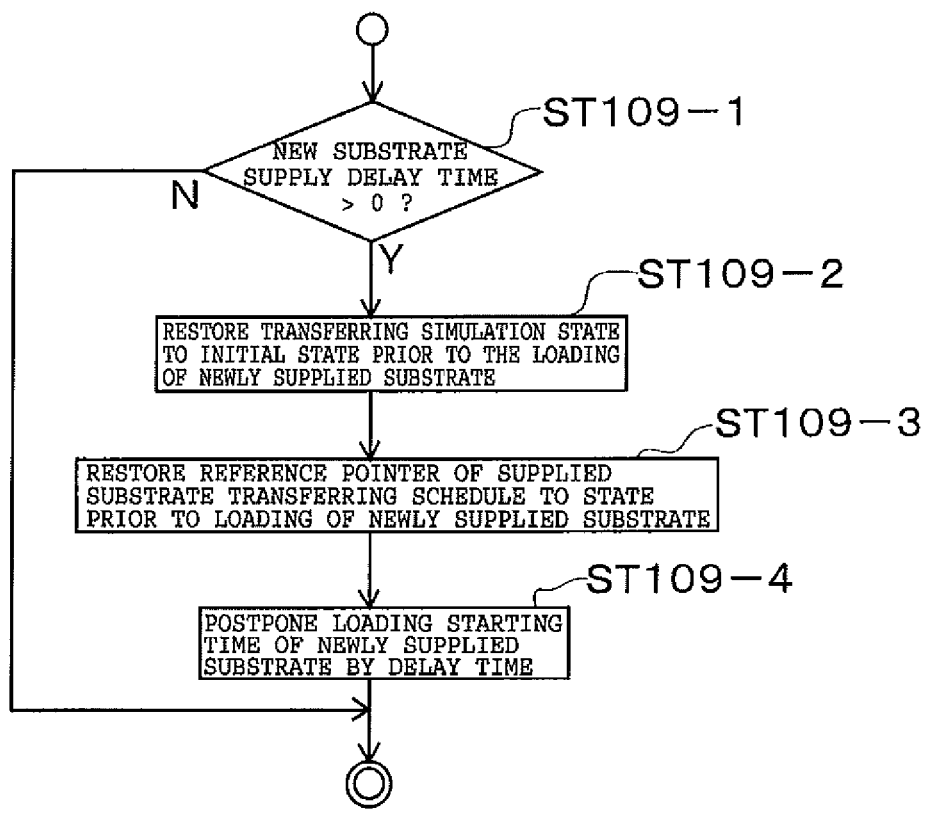
FIG. 30 is a flowchart of a processing sequence of a newly supplied substrate transferring error process (step ST109 shown in FIG. 12)

FIG. 30 is a flowchart of a processing sequence of the newly supplied substrate transferring error process (step ST109 shown in FIG. 12). In the transferring simulation, a process failure substrate that is present in a processing unit which is suffering a failure and all supplied substrates except substrates that remain in processing units when the substrate processing apparatus is stopped while not satisfying the process limiting condition or are jammed while they are being transferred, are detected as a transferring error by the transfer device status updating process in step ST105 (see FIG. 12). If a transferring error is detected by the transfer device status updating process in step ST105, then the scheduler 40 sets a new substrate supply delay time for delaying a process supply starting time at which a new substrate is supplied to the substrate processing apparatus. The process limiting condition includes upper limit and lower limit times for the times (a) through (c) shown below with respect to all processing units.

(a) a time from the end of a process until a transfer device hand grips a substrate;

(b) a process time interval from the end of a process until the start of a process in a next processing unit; and (c) a transfer device holding time from the end of removal of a substrate by a transfer device until the start of storage of the substrate into a next processing unit.

In step ST109-1 shown in FIG. 30, the scheduler 40 determines whether a new substrate supply delay time is of a positive numerical value (new substrate supply delay time>0) or not. If a new substrate supply delay time is of a positive numerical value (Y), then control goes to step ST109-2. In step ST109-2, the scheduler 40 restores the state of the transferring simulation to an initial state prior to the loading of a newly supplied substrate. In step ST109-3, the scheduler 40 restores the reference pointer of a supplied substrate transferring schedule to a state prior to the loading of a newly supplied substrate. Then, control goes to step ST109-4. In step ST109-4, the scheduler 40 postpones the loading starting time of a newly supplied substrate by a delay time, and retries the transferring simulation.

Figure 31:
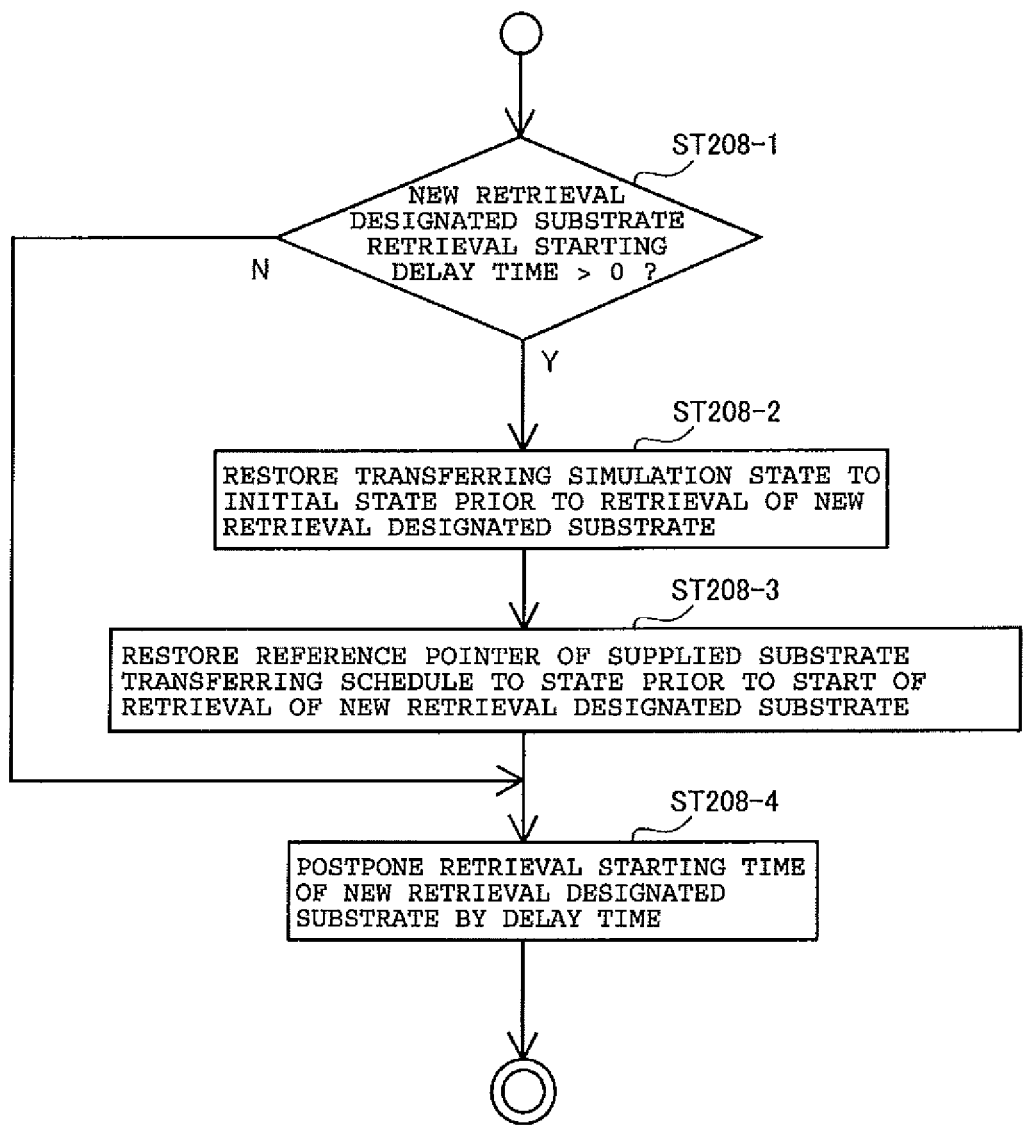
FIG. 31 is a flowchart of a processing sequence of a new retrieval designated substrate transferring error process (step ST208 shown in FIG. 13 and step ST408 shown in FIG. 15)

FIG. 31 is a flowchart of a processing sequence of the remaining substrate retrieval simulation transferring error process (step ST208 shown in FIG. 13 and step ST408 shown in FIG. 15). In step ST208-1, the scheduler 40 determines whether a new retrieval designated substrate retrieval starting delay time is of a positive numerical value (new retrieval designated substrate retrieval starting delay time>0) or not. If a new retrieval designated substrate retrieval starting delay time is of a positive numerical value (Y), then control goes to step ST208-2. If a new retrieval designated substrate retrieval starting delay time is not of a positive numerical value (N), then control goes to step ST208-4. In step ST208-2, the scheduler 40 restores the state of the transferring simulation to an initial state prior to the retrieval of a new retrieval designated substrate. Then, control goes to step ST208-3. The scheduler 40 restores the state of the transferring simulation by copying a data set, which has been copied to a storage area at the time when the transferring simulation for a previous retrieval designated substrate has started (step ST201-7 shown in FIG. 17), to a transferring simulation variable area in an overwrite mode.

In step ST208-3, the scheduler 40 restores the reference pointer of a supplied substrate transferring schedule to a state prior to the start of retrieval of a new retrieval designated substrate. Then, control goes to step ST208-4. In step ST208-

4, the scheduler 40 postpones the retrieval starting time of a new retrieval designated substrate by a delay time.

Figure 32:
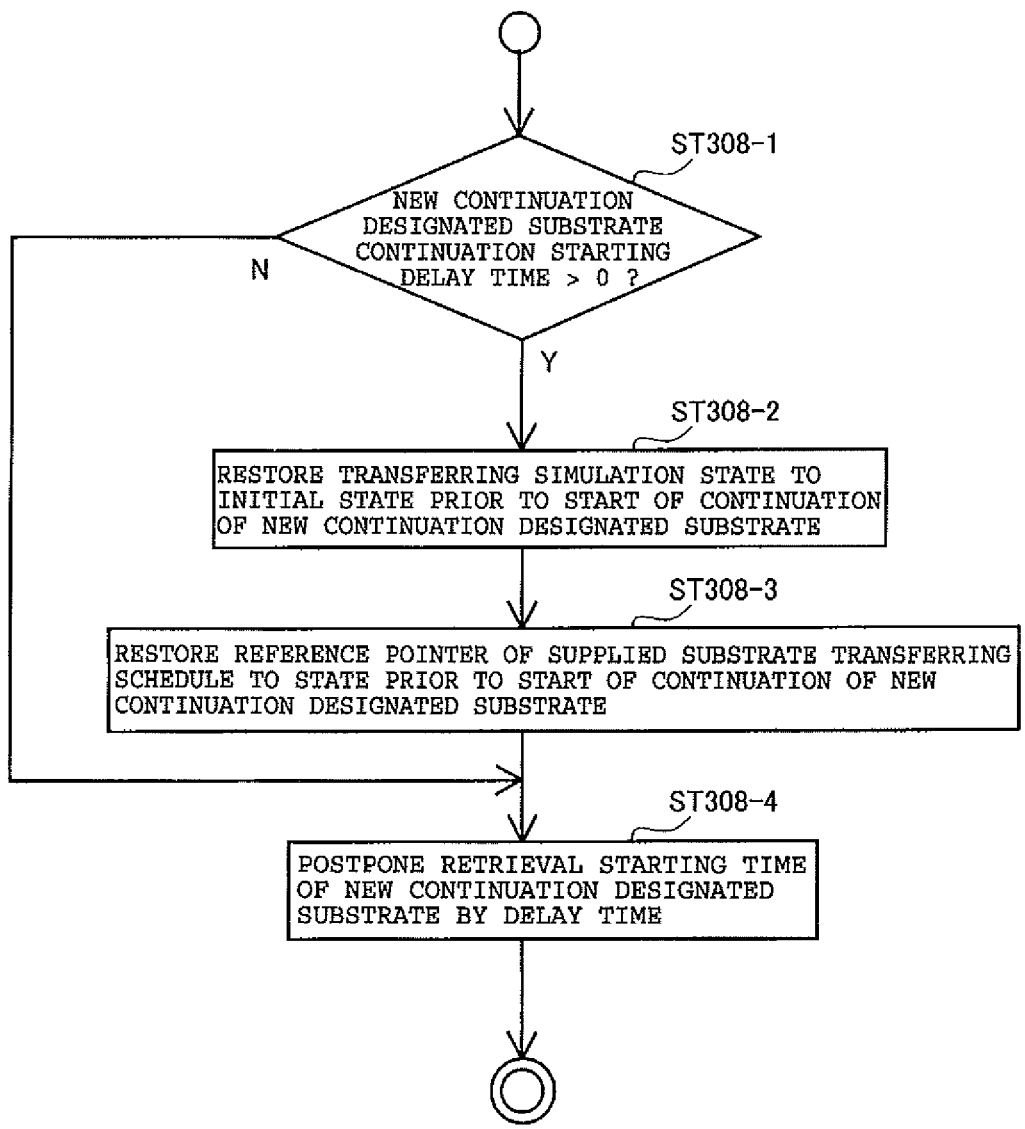
FIG. 32 is a flowchart of a processing sequence of a new continuation designated substrate transferring error process (step ST308 shown in FIG. 14)

FIG. 32 is a flowchart of a processing sequence of the new continuation designated substrate transferring error process (step ST308 shown in FIG. 14). In step ST308-1, the scheduler 40 determines whether a new continuation designated substrate continuation starting delay time is of a positive numerical value (>0) or not. If a new continuation designated substrate continuation starting delay time is of a positive numerical value (Y), then control goes to step ST308-2. If a new continuation designated substrate continuation starting delay time is not of a positive numerical value (N), then control goes to step ST308-4. In step ST308-2, the scheduler 40 restores the state of the transferring simulation to an initial state prior to the start of continuation of a new continuation designated substrate. Then, control goes to step ST308-3. The scheduler 40 restores the state of the transferring simulation by copying a data set, which has been copied to a storage area at the time when the transferring simulation for a new continuation designated substrate has started (step ST301-4 shown in FIG. 18), to a storage area in an overwrite mode. In step ST308-3, the scheduler 40 restores the reference pointer of a supplied substrate transferring schedule to a state prior to the start of continuation of a new continuation designated substrate. Then, control goes to step ST308-4. In step ST308-4, the scheduler 40 postpones the retrieval starting time of a new continuation designated substrate by a delay time.

Figure 33:
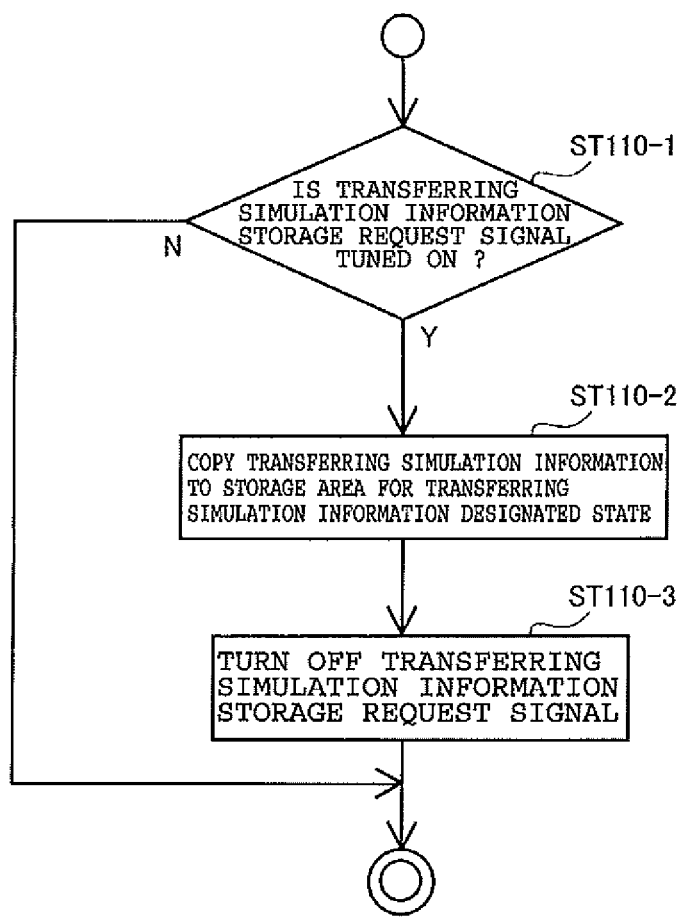
FIG. 33 is a flowchart of a processing sequence of a process of copying a transferring simulation information designated state to a designated area (step ST110 shown in FIG. 12)

FIG. 33 is a flowchart of a processing sequence of the process of copying a transferring simulation information designated state to a designated area (step ST110 shown in FIG. 12). In step ST110-1, the scheduler 40 determines whether a transferring simulation information storage request signal is tuned on or not. If a transferring simulation information storage request signal is tuned on (Y), then control goes to step ST110-2. In step ST110-2, the scheduler 40 copies transferring simulation information designated state to a storage area for a transferring simulation information designated state. Then, control goes to step ST110-3. In step ST110-3, the scheduler 40 turns off the transferring simulation information storage request signal.

Figure 34:
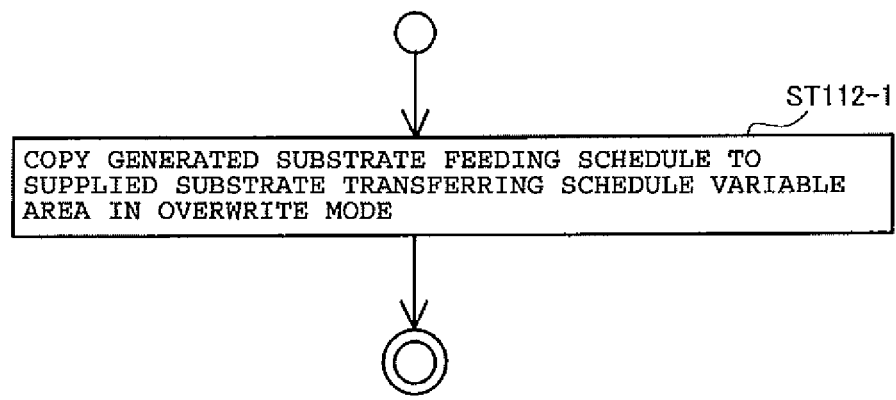
FIG. 34 is a flowchart of a processing sequence of a transferring simulation ending process (step ST112 shown in FIG. 12, step ST210 shown in FIG. 13, step ST310 shown in FIG. 14, and step ST410 shown in FIG. 15)

FIG. 34 is a flowchart of a processing sequence of the transferring simulation ending process (step ST112 shown in FIG. 12, step ST210 shown in FIG. 13, step ST310 shown in FIG. 14, and step ST410 shown in FIG. 15). In step ST112-1, the scheduler 40 copies a generated substrate transferring schedule to a supplied substrate transferring schedule variable area in an overwrite mode.

[Throughput Verification]

The scheduler 40 verifies a throughput in step ST21-5 shown in FIG. 8 as follows:

1) If a plurality of new substrates under the same process recipe conditions are simultaneously supplied, the scheduler 40 performs an initial new substrate supplying and transferring simulation when there is no substrate present in the substrate processing apparatus (step ST21-3 shown in FIG. 8), and thereafter verifies a throughput to select transferring control parameter settings for a maximum throughput (step ST21-5 shown in FIG. 8) before the scheduler 40 performs a subsequent new substrate supplying and transferring simulation (step ST21-6 shown in FIG. 8). The initial new substrate supplying and transferring simulation (step ST21-3 shown in FIG. 8) serves to supply an initial substrate into the substrate processing apparatus at first if the throughput verifying process (step ST21-5 shown in FIG. 8) takes time.

2) According to the throughput verifying process (step ST21-5 shown in FIG. 8) described above at 1), a plurality of parameter settings which are considered to be optimum are prepared, and as many new substrate supplying and transferring simulations as the number of substrates to be evaluated for a throughput are performed with respect to each of the parameter settings, so that evaluated throughput values are measured. A parameter for a maximum throughput value among the evaluated throughput values is selected and used in new substrate supplying and transferring simulations for the remaining substrates.

3) The parameter settings described above at 2) include allowable times for delays in the start of transferring of a newly supplied substrate and supplied substrates, a priority parameter, and a substrate supplying time lower limit interval.

4) The parameter settings which are considered to be optimum described above at 2) are prepared by searching for parameter settings for maximizing a throughput value with respect to process recipe conditions that are considered in advance at the time of designing.

5) The evaluated throughput values that are measured described above at 2) represent a selected one of a lot index value $WPH_{lot\ index}$ after an initial new substrate is supplied from a substrate storage container until a final substrate is returned to the substrate storage container, and a takt time base value $PH_{tact\ base}$ after an initial new substrate is returned to a substrate storage container until a final substrate is returned to the substrate storage container. The selection of either one of the lot index value $WPH_{lot\ index}$ and takt base value $PH_{tact\ base}$ differs from substrate processing apparatus to substrate processing apparatus. Takt time is a time required for making a part or product.

Lot index value $WPH_{lot\ index}$
=the number N of processed substrates/the total time $T_N$ required to process the substrates Takt time base value $PH_{tact\ base}$
=(the number N of processed substrates–1)/(the total time $T_N$ required to process the substrates–the time $T_1$ required to process the initial substrate)

[Production Resuming Function]

When the apparatus controller issues a production resumption request after the substrate processing apparatus has been manually serviced following an apparatus shutdown due to a fault, a scheduling sequence for retrieving a substrate remaining in the substrate processing apparatus into a designated substrate storage container and at the same time supplying a new substrate to the substrate processing apparatus is carried out as indicated by 1) through 3) below.

1) A transferring simulation process is used for a production resumption scheduling sequence.

2) A substrate that remains in the substrate processing apparatus is retrieved into a designated substrate storage container while satisfying the process limiting condition.

3) A scheduling sequence for retrieving a substrate remaining in the substrate processing apparatus is carried out, and a scheduling sequence for supplying a subsequent new substrate to the substrate processing apparatus is carried out.

FIG. 35A is a conceptual diagram showing a production resumption from an apparatus shutdown according to the related art, and FIG. 35B is a conceptual diagram showing a production resumption from an apparatus shutdown according to the present embodiment. According to the related art, as shown in FIG. 35A, substrates 1 through 4 that remain in the substrate processing apparatus are retrieved, after which preparations for a production resumption are made. After the preparations for a production resumption are finished, new substrates 5 through 8 are supplied to the substrate processing apparatus. According to the present embodiment, as shown in FIG. 35B, at the same time that substrates 1 through 4 that remain in the substrate processing apparatus are retrieved, new substrates 5 through 8 are supplied to the substrate processing apparatus for an increased production quantity.

[Retrieval Scheduling a Substrate Remaining in the Substrate Processing Apparatus]

A retrieval scheduling sequence for a substrate remaining in the substrate processing apparatus is summarized as indicated by 1) through 4) below.

1) A transferring simulation is carried out to designate a single substrate or a plurality of substrates (a set of two substrates in the present embodiment) remaining in the substrate processing apparatus, and retrieve the designated substrate or substrates into a substrate storage container.

2) A transferring simulation generates a hypothetical apparatus model in the controller 30 (see FIG. 5). The transferring simulation transfers a retrieval scheduled substrate according to a substrate transferring schedule that has been generated by a previous remaining substrate retrieval simulation. For a new retrieval designated substrate, the transferring simulation is carried out to satisfy unit processing ending conditions and transferring conditions to generate a new substrate transferring schedule.

3) A transferring simulation is based on the premise that a new retrieval designated substrate returns to a designated substrate storage container after the process on the substrate is ended.

4) A transferring simulation transfers each retrieved substrate according to process recipe conditions that have been set in advance by the apparatus controller. The transferring simulation also transfers a substrate so as to skip any unit whose recipe time setting is 0.

[Remaining Substrate Retrieving and Transferring Simulation]

The flow of a remaining substrate retrieving and transferring simulation is the same as the flow of the production resumption substrate retrieving and transferring simulation process (step ST22-6 shown in FIG. 9) shown in FIG. 13, and will not be illustrated and described in detail below.

[Remaining Substrate Retrieving Simulation]

The flow of a new retrieval designated substrate transferring starting determining process is the same as the new retrieval designated substrate transferring starting determining process (step ST205 shown in FIG. 13 and step ST405 shown in FIG. 15) shown in FIG. 24, and will not be illustrated and described in detail below.

The flow of a retrieval scheduled substrate transferring starting determining process is the same as the flow of the retrieval scheduled substrate transferring starting determining process (step ST206 shown in FIG. 13) shown in FIG. 27, and will not be illustrated and described in detail below.

[Transferring Error Process]

The flow of a transferring error process is the same as the flow of the new retrieval designated substrate transferring error process (step ST208 shown in FIG. 13 and step ST408 shown in FIG. 15) shown in FIG. 31, and will not be illustrated and described in detail below.

[Function of a Dynamic Switching Between the Use and Nonuse of a Unit]

In the event that a fault occurs while a substrate is being processed and a processing unit which has been processing the substrate can no longer be used (the unit unusability setting changing process in step ST23 shown in FIG. 7 if the apparatus command represents dynamic unit unusability switching in step ST5 shown in FIG. 7), the above transferring simulation is used for a scheduling sequence for setting the processing unit to unusability to allow subsequent substrates to be continuously processed.

The scheduling sequence for setting the processing unit to unusability is carried out according to the flow of the unit unusability setting changing process shown in FIG. 10 as indicated by 1) through 7) below.

1) If a substrate, which starts to be processed, is planning to use a processing unit whose setting has been changed to "nonuse" and is being processed upstream of the processing unit, then another processing unit, which can be used that is of the same type as the above processing unit and does not adversely affect other substrate processes, is searched for.

2) If another processing unit that can be used is found at 1), then the substrate transferring schedule is rewritten in order to use the other processing unit.

3) If another processing unit that can be used is not found at 1), then a scheduling sequence for retrieving the substrate into a substrate storage container from the time when the processing of the substrate in the processing unit is finished, or no scheduling sequence is carried out because the processing of the substrate in the processing unit is continued as planned.

4) According to the scheduling sequence for retrieving the substrate at 3), a retrieval scheduling sequence, to be described later, is performed on a substrate that is present in a processing unit immediately before the processing unit, the substrate being regarded as a process failure substrate.

5) The continuation of the processing of the substrate in the processing unit at 3) is judged by a parameter that is preset at the time of designing. The parameter is preset differently from substrate processing apparatus to substrate processing apparatus.

6) According to the above function, if substrates prior to starting to be processed include a substrate which is planning to use a processing unit whose setting has been changed to "nonuse", then the transferring of all substrates prior to starting to be processed subsequently to that substrate is deleted from the substrate transferring schedule of supplied substrates, and a transferring simulation for re-supplying those substrates prior to starting to be processed is carried out in the same manner as the supplying of new substrates.

7) According to the above function, if substrates prior to starting to be processed include a substrate which is planning to be processed by a processing unit whose setting has been changed to "use", then the transferring of all substrates prior to starting to be processed subsequently to that substrate is deleted from the substrate transferring schedule of supplied substrates, and a transferring simulation for re-supplying those substrates prior to starting to be processed is carried out in the same manner as the supplying of new substrates.

[Function to Retrieve a Process Failure Substrate]

A scheduling sequence for quickly moving a substrate, which has suffered a process malfunction in a processing unit, to another processing unit of the same type which is capable of continuing another process and continuously processing the substrate while continuously processing other normal substrates, or a scheduling sequence for retrieving the substrate which has suffered the process malfunction into a substrate storage container after the substrate is washed and dried, is carried out as indicated by 1) through 5) below.

1) The above transferring simulation is used for continuous processing or substrate retrieval scheduling.

2) A transferring simulation generates a hypothetical apparatus model in the controller. The transferring simulation transfers a supplied substrate according to a substrate transferring schedule that has been generated by a previous new supplying scheduling sequence. For a retrieval designated substrate, the transferring simulation is carried out to satisfy unit processing ending conditions and transferring conditions to generate a new substrate transferring schedule.

3) A transferring simulation is based on the premise that a retrieval designated substrate returns to a designated substrate storage container after the process on the substrate is ended.

4) A transferring simulation transfers each retrieved substrate according to process recipe conditions that have been set in advance by the apparatus controller. The transferring simulation also transfers a substrate so as to skip any unit whose recipe time setting is 0.

5) The flow of a transferring simulation is the same as the "remaining substrate retrieving and transferring simulation" described above.

Another embodiment of the present invention will be described below. The principles of this embodiment of the present invention are applied to the plating apparatus (substrate processing apparatus) 10 shown in FIG. 1, for realizing a high production quantity while at the same time satisfying a strict process limiting condition by switching between a linear programming process and a simulation process. This embodiment of the present invention reside in items (1) through (3) described below. Those features of the other embodiment, which are the same as those of the above embodiment, will not be described in detail below.

(1) As long as the substrate processing apparatus continues its operation after it has started operating, the substrate processing apparatus is controlled to operate for a maximum throughput, and a new substrate supplying scheduling sequence is carried out by a linear programming scheduler.

(2) At the time of a production resumption, a process failure, a unit failure, or a unit use and nonuse switching after an apparatus shutdown due to a fault in a processing tank, the linear programming scheduler switches to a simulation scheduler.

(3) When the substrate processing apparatus is in an unsteady state until a substrate to be recovered from the substrate processing apparatus returns to a substrate storage container, the substrate processing apparatus is controlled to operate according to the simulation scheduler, for various processes including the supplying of a subsequent new substrate. When the substrate processing apparatus operates back in a steady state with only new substrates being supplied to the substrate processing apparatus, the substrate processing apparatus is controlled to operate according to the linear programming scheduler.

According to this embodiment, the controller has functions to perform the "new substrate supplying process", the "production resuming process from apparatus shutdown", the "unit (substrate processing section) unusability setting changing process (dynamic unit unusability switching process)", and the "process failure substrate retrieving process", and generates substrate transferring schedules by switching between the linear programming process and the simulation process.

Figure 36:
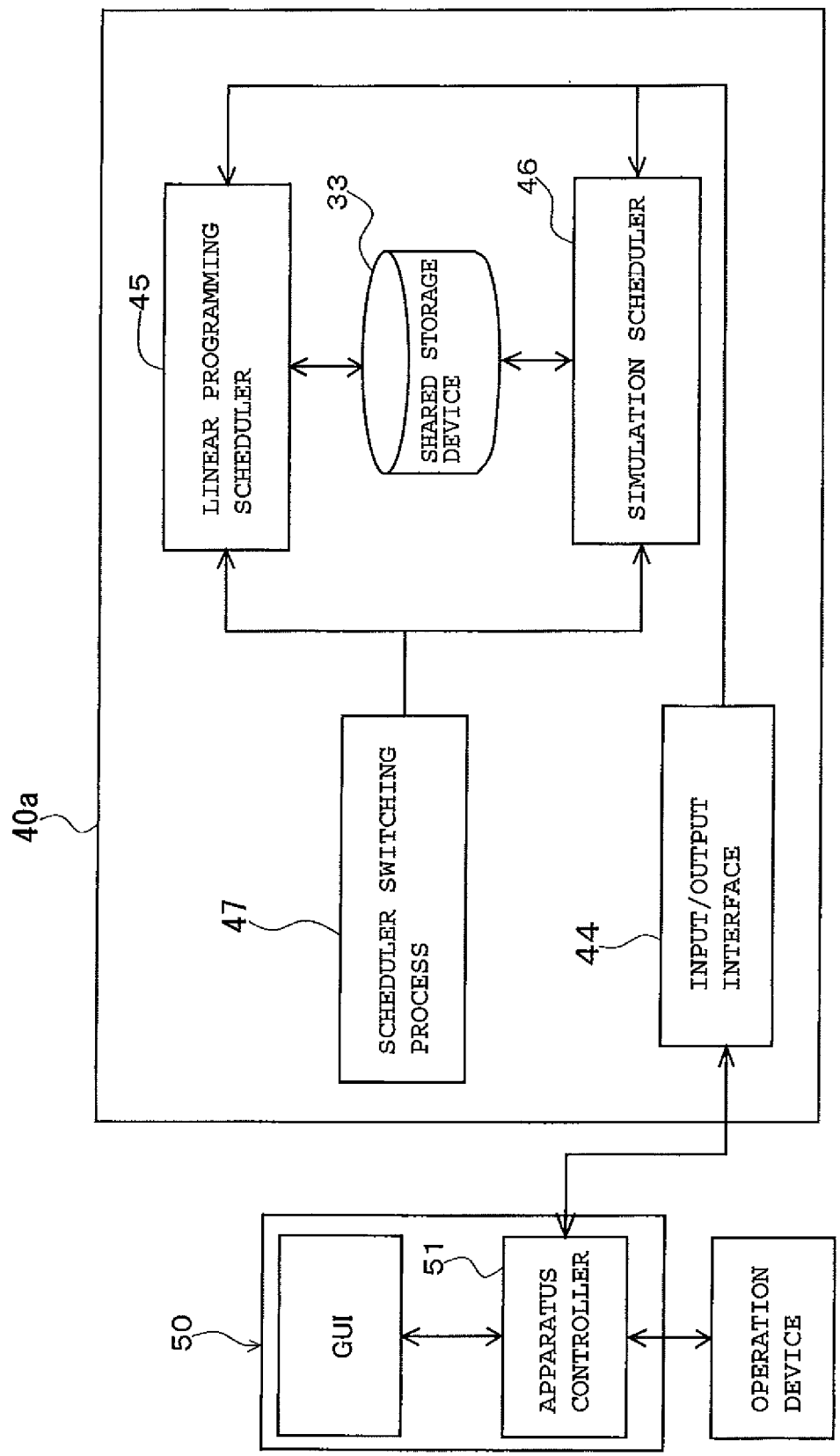
FIG. 36 is a block diagram showing a configuration of a scheduler according to another embodiment of the present invention.

FIG. 36 is a block diagram showing a configuration of a scheduler 40a according to this embodiment of the present invention. As shown in FIG. 36, the scheduler 40a comprises a scheduler switching process 47, a linear programming scheduler 45, a simulation scheduler 46, and an input/output interface 44. The scheduler switching process 47 switches between designated control processes according to the linear programming scheduler 45 and the simulation scheduler 46. Only the designated scheduler carries out a transferring control scheduling sequence and sends data to and receives data from an apparatus controller 51 of an apparatus control system 50. The linear programming scheduler 45 is used to control the supplying of a new substrate while the plating apparatus is operating in a steady state. The simulation scheduler 46 is used to retrieve substrates at the time it receives an unsteady event and also to perform a scheduling sequence for supplying subsequent new substrate until control is returned to the linear programming scheduler 45 or the plating apparatus is shut down.

Data that are transferred between the linear programming scheduler 45 and the simulation scheduler 46 via a shared storage device 33 mainly comprise data as to a scheduling sequence for transferring scheduled substrates and substrate process condition data. The input/output interface 44 transfers data between the apparatus controller 51 of the apparatus control system 50, the linear programming scheduler 45 and the simulation scheduler 46, and is shared by the linear programming scheduler 45 and the simulation scheduler 46. The input/output interface 44 communicates with the apparatus control system 50 including the apparatus controller 51, indicates events to the scheduler switching process 47, and sends and receives substrate transferring schedules. The shared storage device 33 sends and receives various data of parameter settings, recipe settings, and substrate transferring schedules to and from the input/output interface 44 and the scheduler switching process 47.

Figure 37:
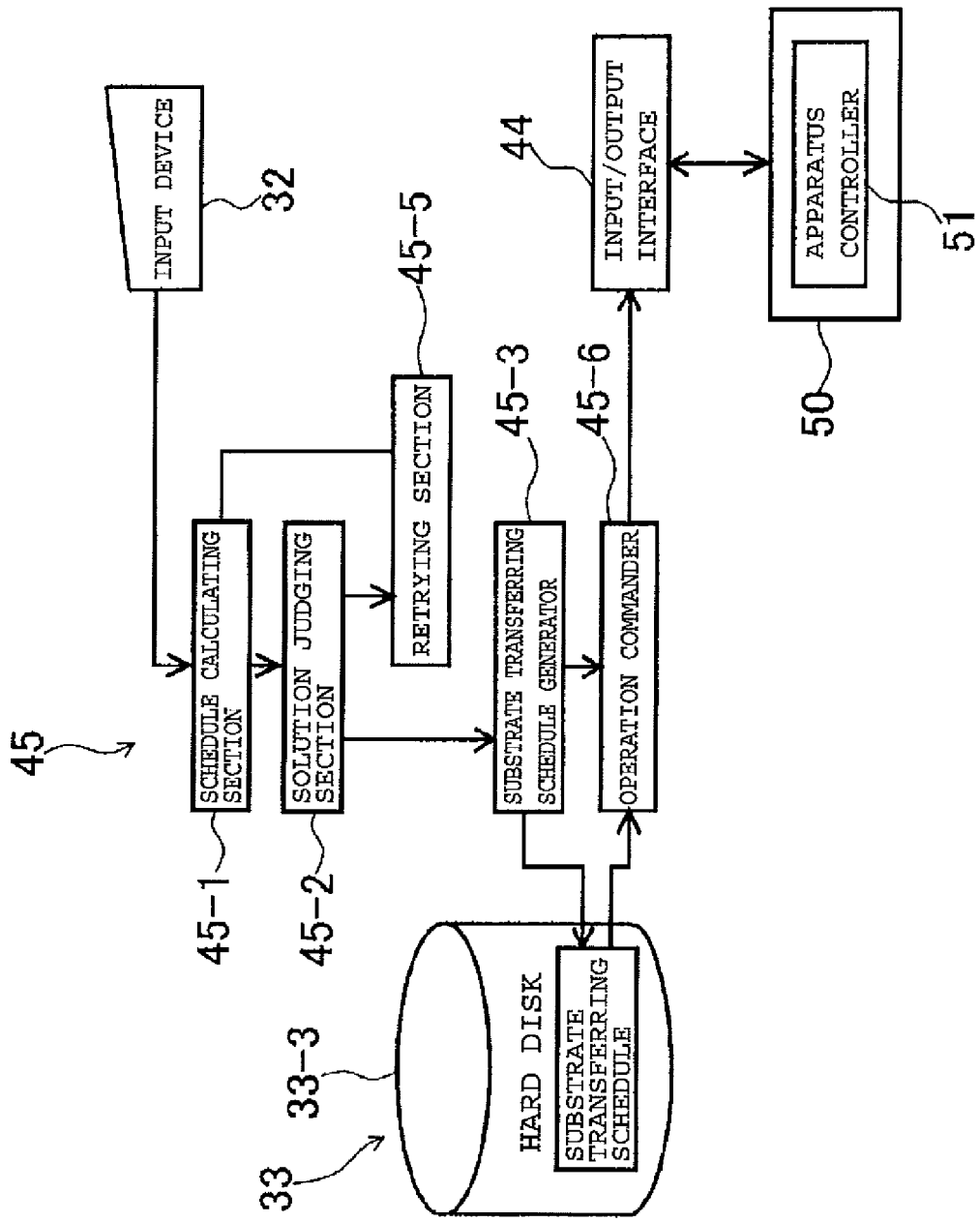
FIG. 37 is a block diagram showing a configuration of a linear programming scheduler.

FIG. 37 is a block diagram showing a configuration of the linear programming scheduler 45. As shown in FIG. 37, the linear programming scheduler 45 comprises a schedule calculating section 45-1, a solution judging section 45-2, a substrate transferring schedule generator 45-3, an operation commander 45-6, and a retrying section 45-5.

The schedule calculating section 45-1 of the linear programming scheduler 45 calculates times (hereinafter referred to as "execution times") to operate the transfer devices including the loading robot 12 and the transfer devices 23, 24 for maximally advancing the time to retrieve a final substrate from the plating apparatus 10 after it has been processed by all the processes. The schedule calculating section 45-1 calculates the execution times by calculating a solution that satisfies prescribed conditions, as described later.

A solution that satisfies the prescribed conditions may not necessarily be obtained. After the schedule calculating section 45-1 of the linear programming scheduler 45 has made calculations, the solution judging section 45-2 determines whether a solution that satisfies the prescribed conditions has been obtained or not. If the solution judging section 45-2 judges that a solution that satisfies the prescribed conditions has been obtained, then the substrate transferring schedule generator 45-3 generates (updates) a substrate transferring schedule, i.e., a table which associates the execution times and the operations of the loading robot 12 and the transfer devices 23, 24 which are performed at the execution times, and the generated substrate transferring schedule is stored in a hard disk 33-3 of the shared storage device 33.

When the plating apparatus 10 is in operation, the transfer devices including the loading robot 12 and the transfer devices 23, 24 are controlled by referring to the substrate transferring schedule stored in the hard disk 33-3. Specifically, when an execution time in the substrate transferring schedule stored in the hard disk 33-3 is reached, the operation of the corresponding transfer device is indicated to the apparatus controller 51 of the apparatus controller system 50 via the input/output interface 44. In this manner, the time to retrieve a final substrate from the plating apparatus 10 after it has been processed by all the processes is maximally advanced.

When the apparatus controller 51 is to command an operation to one of the transfer devices including the loading robot 12 and the transfer devices 23, 24, the apparatus controller 51 sends a command to the transfer device after it has confirmed that the transfer device is not in operation, the processing of a substrate in a processing unit from which the substrate is to be transferred is completed, and there is no prior substrate in a processing unit to which the substrate is to be transferred and the resetting of the processing unit is completed. If these conditions are not satisfied, then the operation commander 45-6 sends a command after having waited until the conditions are satisfied.

If the solution judging section 45-2 judges that a solution for satisfying the conditions is not obtained, then the average number of substrates that are simultaneously present in the transfer devices and the processing units of the plating apparatus 10 is reduced, i.e., the interval at which to supply substrates is adjusted, thereby to correct the conditions. Then, execution times are calculated based on the corrected conditions to derive a solution which satisfies the conditions. Specifically, the conditions are corrected by inserting a hypothetical substrate (hereinafter referred to as "dummy substrate"), for which the planned operating times of the transfer devices and the planned processing times of the processing units are 0, between substrates at appropriate intervals.

If the number of substrates that are simultaneously present in the plating apparatus 10 is reduced, then since the transfer devices operate less frequently and become more available, the probability that a solution will be obtained increases. If a solution is not obtained after a retry, the conditions are corrected in order to reduce the average number of substrates that are simultaneously present in the plating apparatus 10. In extreme cases, a next substrate is supplied to the plating apparatus 10 after all the processes on previous substrates are finished and they are retrieved into a substrate cassette.

A specific example of the setting of conditional formulas and the calculation of execution times in the schedule calculating section 45-1 of the linear programming scheduler 45 will be described below. The setting of conditional formulas and the calculation of execution times to be described below are given by way of example only, and may be carried out according to any of various other processes.

The numbers (operation numbers) of operations k of the transfer devices including the loading robot 12 and the transfer devices 23, 24 are defined successively as 1, 2, 3, ..., K along a path which a substrate follows after it is supplied to the plating apparatus 10 until it is retrieved into a substrate cassette. On the assumption that a sufficient time has elapsed after the plating apparatus 10 started to operate and the plating apparatus 10 is operating steadily with enough substrates being present therein, the operation of a transfer device following a transfer device which performs the operation k is denoted as kp (k). It is assumed that a suitable number of dummy substrates are present prior to a first substrate when the plating apparatus 10 starts to operate, and subsequent to a final substrate when the plating apparatus 10 finishes its operation. Substrate numbers n are assigned to substrates including such dummy substrates according to a sequence in which the substrates are supplied from a substrate cassette to the plating apparatus 10. The substrate number of a substrate as it goes from the operation k to the operation kp (k) increases by np (k). In the plating apparatus 10 shown in FIG. 1, the operations are defined as follows:

The operation of the loading robot 12 to remove an unprocessed substrate from a substrate cassette on the loading port 11 and transfer the removed unprocessed substrate to the substrate positioning table 13 is defined as k=1. The operation of the loading robot 12 to transfer a positioned substrate from the substrate positioning table 13 to the fastening stage 15a or 15b is defined as k=2. The operation of the loading robot 12 to remove a substrate holder from the substrate holder storage area 25 and transfer the removed substrate holder to the fastening stage 15a or 15b is defined as k=3. The operation of the transfer device 23 to transfer a substrate mounted on substrate holder to the pre-water-washing tank 17 is defined as k=4. The operation of the transfer device 23 to transfer a substrate from the pre-water-washing tank 17 to the pre-processing tank 18 is defined as k=5. The operation of the transfer device 23 to transfer a substrate from the pre-processing tank 18 to the water-washing tank 19 is defined as k=6. The operation of the transfer device 24 to transfer a washed substrate from the water-washing tank 19 to either one of the plating tanks 22 in the plating area 26 is defined as k=7. The operation of the transfer device 24 to transfer a substrate from the plating tank 22 to the water-washing tank 21 is defined as k=8. The operation of the transfer device 24 to transfer a washed substrate from the water-washing tank 21 to the crude drying tank (blowing tank) 20 is defined as k=9. The operation of the loading robot 12 to transfer a dried substrate from the crude drying tank 20 to the fastening stage 15a or 15b is defined as k=10.

On the assumption that a sufficient time has elapsed after the plating apparatus 10 started to operate and the plating apparatus 10 is operating steadily with enough substrates being present therein, operation sequences of the transfer devices including the loading robot 12 and the transfer devices 23, 24 are determined. For example, the operation sequence of the transfer device 24 is periodically defined such that the operation numbers are expressed as 3→5→4→6→7→3 .... In this case, the operations are represented as:

Kp (3)=5
Kp (4)=6
Kp (5)=4
Kp (6)=7
Kp (7)=3

The increase np in the substrate number of a substrate as it goes from operation k to next operation kp (k) is determined as described below. The np is determined in view of the number of processing units for each of the types thereof, which include the substrate positioning table 13, the spin drier 14, the fastening stages 15a, 15b, the stockers 16, the pre-water-washing tank 17, the pre-processing tank 18, the water-washing tank 19, the crude drying tank 20, the water-washing tank 21, and the plating tanks 22.

np (3)=−2
np (4)=−2
np (5)=+2
np (6)=−3
np (7)+6

If substrates are periodically assigned to the processing units in the same type, i.e., the plating tanks 22 in the plating area 26, according to the sequence in which they are supplied to the plating apparatus 10, then planned operation times, shown below, are uniquely determined. The planned operation times are entered from the input device 32 or determined by calculations in view of the positions and paths of the transfer devices based on values entered from the input device 32.

M1 (k, n): the time at which the transfer device moves before receiving the substrate n from a position immediately before the operation k;

G1 (k, n): the time at which the transfer device receives the substrate n from a processing unit in the operation k;

M (k, n): the time at which the transfer device holds the substrate n and moves in the operation k;

G2 (k, n): the time at which the transfer device transfers the substrate n to a processing unit in the operation k; and M2 (k, n): the time at which the transfer device transfers the substrate n and moves in the operation k.

In some situations, these planned operation times become 0.

The total of the planned operation times is defined as Tg (k, n):

$$Tg(k,n)=M1(k,n)+G1(k,n)+M(k,n)+G2(k,n)+M2(k,n)$$

Nonnegative variables are defined as shown below.

xr (k, n): the downtime of a transfer device immediately prior to the operation k on the substrate n;

xw (k, n): the wait time in a processing unit immediately prior to the operation k on the substrate n; and xf (k, n): the idle time of a processing unit immediately before a substrate is transferred to the processing unit by the operation k on the substrate n.

The xw (k, n) is defined only for an operation including the reception of a substrate from a processing unit. The xf (k, n) is defined only for an operation including the transfer of a substrate to a processing unit. Practically, however, it may be limited to an operation to transfer a substrate to a relaying device which is used to transfer substrates between transfer devices.

If the time at which the operation k starts to be performed on the substrate n is indicated by t (k, n), then the following three equations are satisfied:

$$t(kp(k),n+np(k))=t(k,n)+Tg(k,n)+xr(kp(k),n+np(k)) \quad (1)$$

$$t(k+1,n)=t(k,n)+Tg(k,n)-M2(k,n)+P(k,n)-M1(k+1,n)+xw(k+1,n)+xw(k+1,n) \quad (2)$$

$$t(k,n)=t(k+1,n-U(k))+M1(k+1,n-U(k))+G1(k+1,n-U(k))-M1(k,n)-G1(k,n)-M(k,n)+xf(k,n) \quad (3)$$

In the equation (2), P (k, n) represents a planned processing time for the substrate n after the operation k, and is entered from the input device 32 or calculated based on a value entered from the input device 32. The planned processing time includes, in addition to a planned processing time such as for plating, washing, etc. normally designated per substrate, a time required to perform a pre-operation such as shutter closing, liquid filling, etc. performed prior to a process carried out by a processing unit, and a time required to perform a post-operation such as liquid draining, shutter opening, etc. performed subsequently to the process carried out by the processing unit. In the equation (3), U (k) represents the number of devices of a type with respect to a processing unit for transferring a substrate in the operation k.

The equation (1) expresses the time at which the operation performed by the same transfer device starts following the operation k on the substrate n. The equation (2) expresses the time at which the operation k+1 starts after the processing on the substrate n by a processing unit is finished. The equation (3) expresses the time at which the operation to transfer the next substrate n starts after a transfer device has received a processed substrate from a processing unit.

The equations (1) through (3) can be modified as follows:

$$T=RmXr+Rv \quad (1a)$$

$$Xw=WmXr+Wv \quad (2a)$$

$$Xf=FmXr+Fv \quad (3a)$$

where T, Xr, Xw, Xf represent respective column vectors which require t (k, n), xr (k, n), xw (k, n), xf (k, n), respectively, Rm, Wm, Fm represent appropriate matrixes, and Rv, Wv, Fv appropriate column vectors.

In the equation (1a), the vector T on the left side includes an element corresponding to t (k, n) representative of the time to start retrieving a final substrate Nn (except a dummy substrate). If an element in the vector RmX on the right side which corresponds to the element in the vector T is minimized, it is possible to maximally advance the time to retrieve the final substrate from the plating apparatus 10 after it has been processed by all the processes. A condition for advancing the retrieval time can be expressed as follows:

$$cXr \to \text{minimum} \quad (4)$$

Conditions for making the transferring operation expressed by the equations (1a) through (3a) physically possible are normally represented by Xr≥0, Xw≥0, Xf≥0. From these inequalities and the equations (1a) through (3a), the following inequalities are derived:

$$Xr \geq 0 \quad (1b)$$

$$WmXr \geq -Wv \quad (2b)$$

$$FmXr \geq -Fv \quad (3b)$$

If a certain time is required for a transfer device to receive a preceding substrate from a certain processing unit and start to transfer a next substrate to the certain processing unit, then this time is added to the corresponding element on the right side of the equation (3b). For example, on the fastening stages 15a, 15b, after the loading robot 12 has received a substrate removed from a substrate holder, the substrate holder is returned to the substrate holder storage area 25, and thereafter the transfer device 23 transfers a next substrate. In this case, the time required to return the substrate holder is added to the corresponding element on the right side of the equation (3b).

Since all the operation starting times are expressed by a linear expression with respect to Xr as indicated by the equation (1a), a linear limiting condition with respect to any operation time can be expressed by a linear inequality with respect to Xr. For example, if a limiting condition is that a substrate after its preceding process is finished is immediately received by an operation k 0, i.e., xw (k0, n)=0, then a line corresponding to k 0 in the equation (2a) is removed and expressed by the following linear inequality:

$$-Wm0Xr0 \geq Wv0 \quad (5)$$

If a limiting condition for an upper limit is posed on the time after a substrate n 0 is received from a preceding processing unit by the operation k 0 until it is transferred to a next processing unit by an operation k 0+1, then an inequality of the similar format can be derived. Similarly, a limiting condition for a lower limit can be posed between the times to start two operations. In this manner, a schedule can be established to make transfer devices available to a certain extent. Furthermore, a waiting time prior to a process after a substrate n is transferred to a processing unit by an operation k until the substrate n actually starts to be processed can be defined as xww (k, n), and can be formulated so as to be included in the above variable vector Xr. In this case, the probability to satisfy the limiting condition for an upper limit with respect to xw (k+1, n) can be increased.

The inequalities (1b) through (3b) and the inequality (5) can be expressed by the following inequality:

$$Axr \geq b \quad (6)$$

where A represents an appropriate matrix and b an appropriate column vector.

Therefore, for maximally advancing the time to retrieve a final substrate, it is necessary to determine a minimum value of the expression (4) under the inequality (6). A solution of such Xr can be obtained as a solution to a problem according to a linear programming process. If the solution Xr is obtained, then the execution time of each of the operations for maximally advancing the time to retrieve a final substrate can be determined by the equation (1a), and the above substrate transferring schedule can be generated (updated) based on the execution time thus determined.

Figure 38:
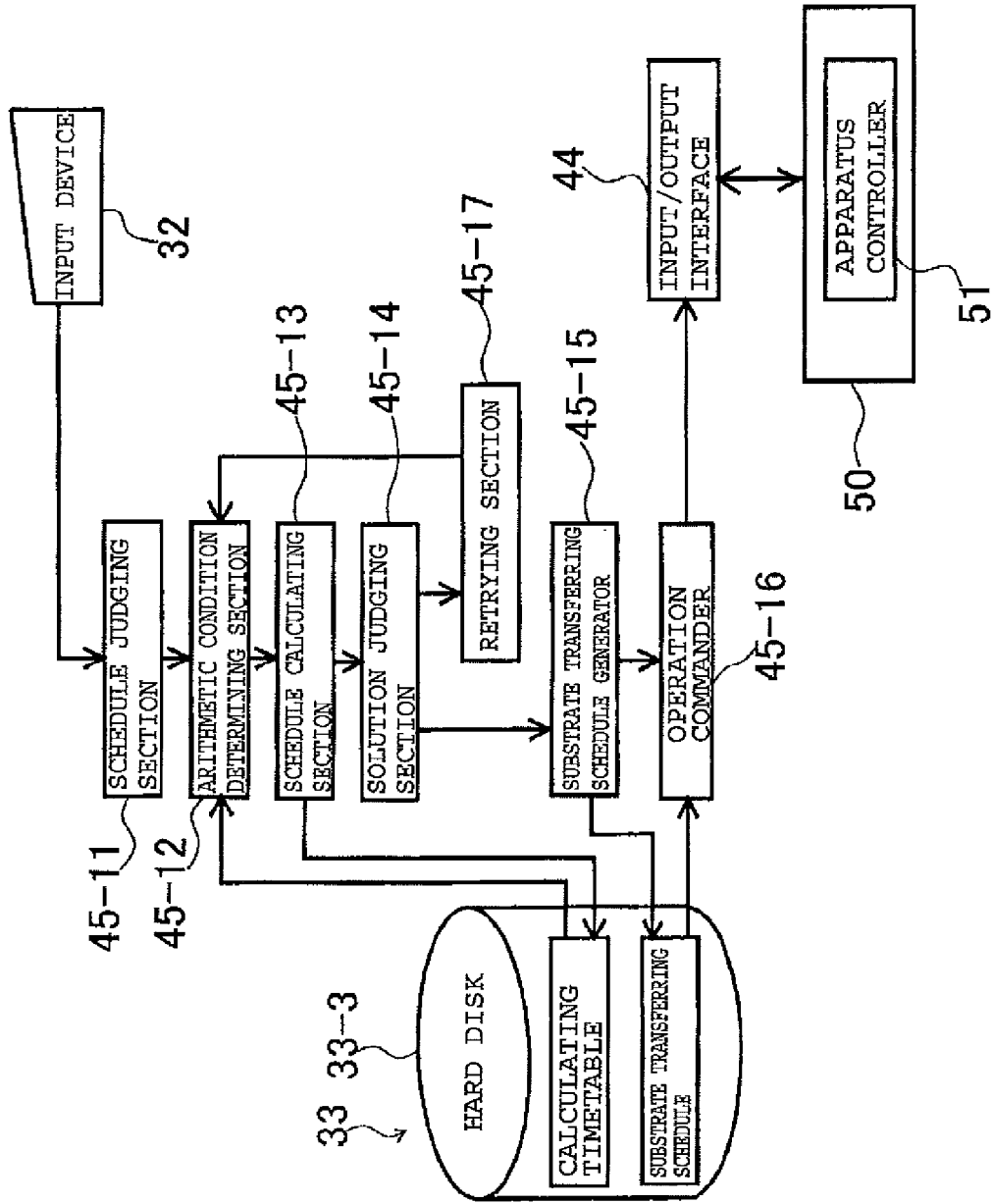
FIG. 38 is a block diagram showing another configuration of a linear programming scheduler.

FIG. 38 is a block diagram showing another configuration of a linear programming scheduler 45. If the plating apparatus 10 is in continuous operation for a long period of time, then planned processing times may not necessarily been given with respect to respective substrates, but each time a new substrate cassette is placed (set) on the loading port, a planned processing time may be given with respect to an unprocessed substrate in the substrate cassette. The linear programming scheduler 45 shown in FIG. 38 is applicable to such a case.

The linear programming scheduler 45 shown in FIG. 38 repeats a scheduling sequence sequentially while moving a time zone to be scheduled behind during operation of the plating apparatus 10, and joins the results of the schedules consistently. In this embodiment, as shown in FIG. 38, a computer program stored in the hard disk 33-3 of the shared storage device 33 and the CPU 31 (see FIG. 2) jointly make up a schedule judging section 45-11, an arithmetic condition determining section 45-12, a schedule calculating section 45-13, a solution judging section 45-14, a substrate transferring schedule generator 45-15, an operation commander 45-16, and a retrying section 45-17.

As with the configuration shown in FIG. 37, a planned operation time is entered from the input device 32, and a planned processing time is entered from the input device 32. When the planned operation time and the planned processing time are entered, the schedule judging section 45-11 determines whether a new scheduling sequence is necessary or not, i.e., checks if there is a substrate not yet scheduled though the planned processing time has been entered. If the schedule judging section 45-11 judges that there is not a substrate not yet scheduled, i.e., that no new scheduling sequence is necessary, then the arithmetic condition determining section 45-12 determines an assumed time after the present time and a final substrate (except a dummy substrate) to be subject to scheduling calculations. The final substrate is a substrate added as an object to be subject to scheduling calculations in addition to substrates which have already been scheduled, and is not a dummy substrate.

The time at which a substrate, which may be a dummy substrate, is initially retrieved into a substrate cassette after a final non-dummy substrate, i.e., a substrate, which is not a dummy substrate, has been supplied to the plating apparatus 10, is determined as the assumed time from the scheduling results derived in the past. The final substrate is determined by estimating the number of added substrates within a range wherein scheduling calculations can be completed with a sufficient margin between the present time and the assumed time. The number of added substrates is estimated within the number of substrates which have not yet been scheduled, but whose planned processing times have been entered. If the positive number of added substrates is not obtained, then it is attempted to determine the number of added substrates while shifting the assumed time to the time to retrieve a scheduled substrate. Thus, the interval from the assumed time to the time to retrieve the final substrate serves generally as a time zone to be scheduled.

The average time required to perform scheduling calculations for the number of added substrates is stored as a calculating time table in the hard disk 33-3 of the shared storage device 33. The arithmetic condition determining section 45-12 estimates the number of appropriate substrates in view of the time required to perform scheduling calculations which is stored in the calculating time table. The time to retrieve the final substrate based on the new scheduling is normally later than a true fastest value (fastest time) which is realized if the planned processing times of all the substrates are given in advance. However, the time to retrieve the final substrate based on the new scheduling can be approximately close to the true fastest value if the number of substrates added in each scheduling sequence is relatively large.

After the arithmetic condition determining section 45-12 determines the assumed time and the final substrate to be subject to scheduling calculations, the schedule calculating section 45-13 calculates an execution time of each of the operations of the transfer devices within the time zone to be scheduled, based on the conditional equations after the substrates have been added.

In this case, a lower limit of the substrate number focused with respect to each operation k is determined by referring to a set of an operation number whose execution time is later than the assumed time and a substrate number, from the scheduling results derived in the past. Alternatively, a lower limit of the substrate number may be determined by determining an operation which could happen later than the assumed time based on the planned processing times and the planned operation times according to the sequence of operations of the transfer devices. In this manner, an operation with no assumed time being held may occur in the scheduling results derived in the past. An upper limit of the substrate number is determined by determining an operation which could happen earlier than the time to start retrieving a final substrate to be subject to scheduling calculations into a substrate cassette. With respect to substrates subsequent to the final substrate, it is assumed that there exist dummy substrates whose operation times and processing times are 0.

Based on the upper and lower limits thus determined of the substrate number, the above unknown column vectors T, Xr, etc. are established, and scheduling calculations are carried out. In each cycle of scheduling calculations, the average time required for calculations, which is stored in the calculating timetable, is updated based on the time actually required for calculations.

When the plating apparatus 10 starts its continuous operation, emphasis is particularly placed on the quick response of scheduling. Consequently, operation times are determined in the order of k=1, 2, ..., K as minimum values satisfying the equations (1) through (3) with respect to the initial first substrate. If a single substrate is processed in the plating apparatus 10, then the time to retrieve the substrate is maximally advanced by the above determined operation times. Unless the planned processing times and the planned operation times take extreme values, the substrate is processed by each processing unit and is immediately thereafter transferred to a next processing unit by the transfer devices including the loading robot 12 and the transfer devices 23, 24. Accordingly, an optimum solution, which satisfies the given limiting condition, is determined.

After the processing of the schedule calculating section 45-13, as with the configuration shown in FIG. 37, the solution judging section 45-14 determines whether a solution of an execution time is obtained or not. If a solution of an execution time is obtained, then the substrate transferring schedule generator 45-15 generates (updates) a substrate transferring schedule. After a substrate transferring schedule is generated (updated), the above processing sequence is repeated. As with the configuration shown in FIG. 37, the operation commander 45-16 refers to the substrate transferring schedule stored in the hard disk 33-3 to control the transfer devices including the loading robot 12 and the transfer devices 23, 24.

If the solution judging section 45-14 judges that a solution of an execution time is not obtained, on the other hand, then as with the configuration shown in FIG. 37, the retrying section 45-17 inserts a dummy substrate between substrates. In view of the inserted dummy substrate, in this case, the arithmetic condition determining section 45-12 determines an assumed time and a final substrate to be subject to scheduling calculations such that an added non-dummy substrate is present.

According to this embodiment, since the execution times of the operations of the transfer devices including the loading robot 12 and the transfer devices 23, 24, which are determined by the new scheduling sequence, may be earlier than the assumed tune, it is necessary that the safety factor be set to a large value in the estimation of the number of added substrates, and scheduling calculations be finished earlier than the assumed time for the operation commander 45-16 to apply operation commands to the transfer devices including the loading robot 12 and the transfer devices 23, 24.

Figure 39:
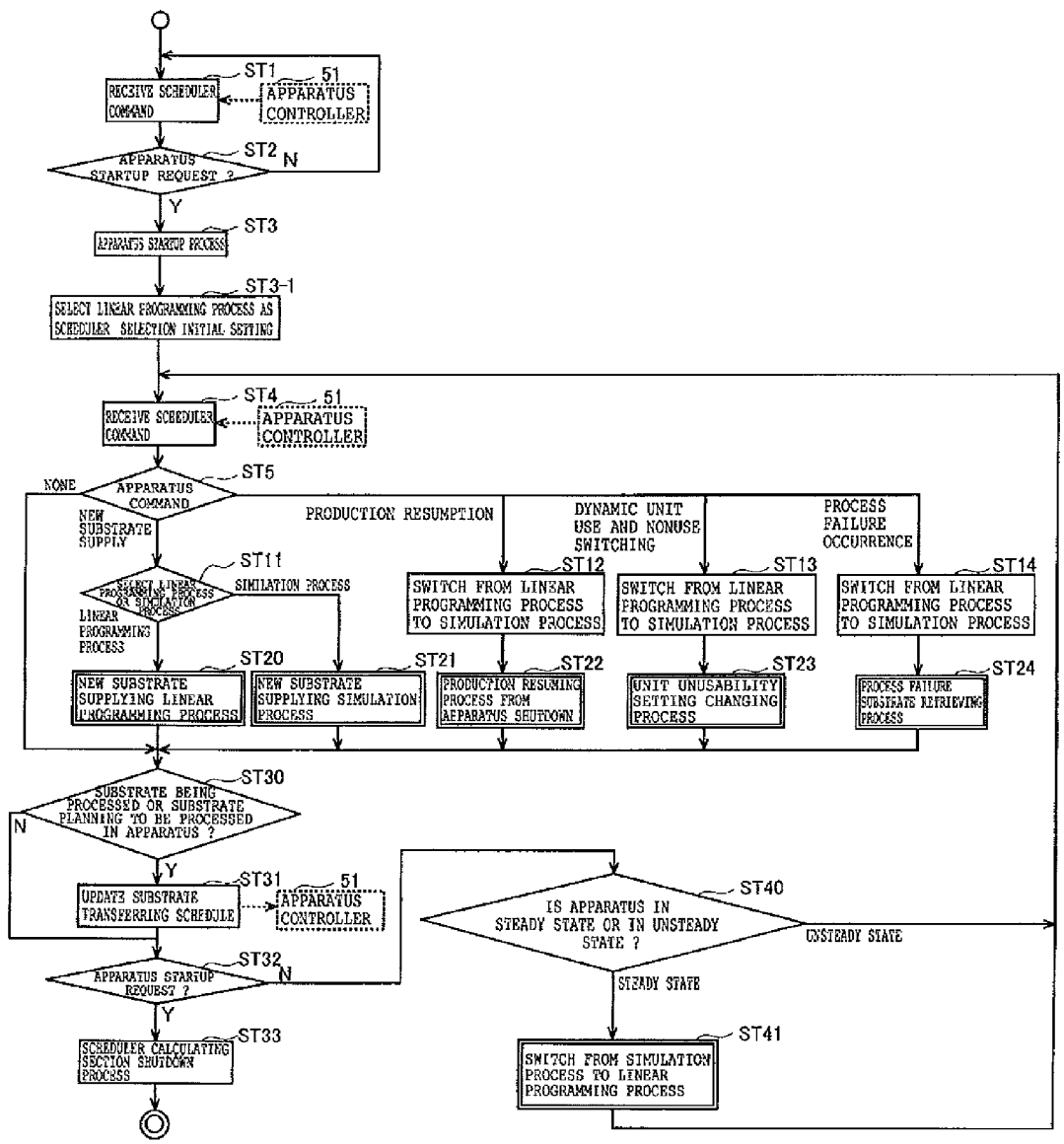
FIG. 39 is a flowchart of a main processing sequence of a scheduling process of the scheduler according to the other embodiment of the present invention.

FIG. 39 is a flowchart of a main processing sequence of a scheduling process of the scheduler according to the other embodiment of the present invention. The main processing sequence shown in FIG. 39 is different from the main processing sequence shown in FIG. 7 as follows:

In step ST3, the scheduler performs an apparatus startup process to enter a planned operation time, a unit use and nonuse setting, and a process limiting time. In step ST3-1, the scheduler selects a linear programming process as a scheduler selection initial setting. Then, control goes to step ST4. In step ST5, the scheduler ascertains the type of an apparatus command. If the apparatus command represents "new substrate supply", "apparatus production resumption", "dynamic unit use and nonuse switching", or "process failure occurrence", then control goes to step ST11, step ST12, step ST13, or step ST14.

In step ST11, it is determined whether the scheduler selects a linear programming process or a simulation process. If the scheduler selects a linear programming process, then control goes to step ST20, in which the scheduler performs a new substrate supplying linear programming process. If the scheduler selects a simulation process, then control goes to step ST21, in which the scheduler performs a new substrate supplying simulation process. In step ST12, the scheduler switches from a linear programming process to a simulation process. Then, control goes to step ST22. In step ST22, the scheduler carries out a production resuming process from an apparatus shutdown. Then, control goes to step ST30.

In step ST13, the scheduler switches from a linear programming process to a simulation process. Then, control goes to step ST23. In step ST23, the scheduler carries out a unit unusability setting changing process (dynamic unit nonuse switching process). Then, control goes to step ST30. In step ST14, the scheduler switches from a linear programming process to a simulation process. Then, control goes to step ST24. In step ST24, the scheduler carries out a process failure substrate retrieving process. Then, control goes to step ST30.

In step ST32, the scheduler determines whether there is an apparatus shutdown request or not. If there is an apparatus shutdown request (Y), then control goes to step ST33, in which the scheduler performs a scheduler calculating section shutdown process. If there is no apparatus startup request (N), then control goes to step ST40. In step ST40, the scheduler determines whether the plating apparatus 10 is in a steady state or in an unsteady state. If the plating apparatus 10 is in a steady state, then control goes to step ST41, in which the scheduler switches from a simulation process to a linear programming process. Then, control goes back to step ST4. If the plating apparatus 10 is in an unsteady state, then control goes back to step ST4. Thus, depending on a state of the plating apparatus, the scheduler determines whether a substrate transferring schedule is switched from a simulation process to a linear programming process.

The linear programming scheduler is a technology developed for mainly achieving a maximum throughput at all times for normal apparatus operation control. In this embodiment, the linear programming scheduler is used as a control means for controlling steady apparatus operation in view of its advantages.

On the other hand, the simulation scheduler is not a technology for guaranteeing a maximum throughput. However, the simulation process is advantageous in that it can flexibly generate a substrate transferring schedule for substrate retrieval, etc. while satisfying a process limiting condition with respect to events such as a production resumption, a dynamic unit use and nonuse switching process failure, etc. In the present embodiment, therefore, the simulation scheduler is used as a control means for controlling unsteady apparatus operation in view of its advantages.

After a substrate transferring schedule has been generated by the simulation process, if the control means for controlling apparatus operation is taken over by the linear programming scheduler while the substrate transferring schedule is including an unsteady transferring schedule such as substrate retrieval is being included, then a scheduling sequence requires very complex calculations. According to this embodiment, therefore, the control means for controlling apparatus operation switches from the simulation process back to the linear programming process after the plating apparatus 10 goes back to a steady state wherein it contains newly supplied substrates only.

Figure 40:
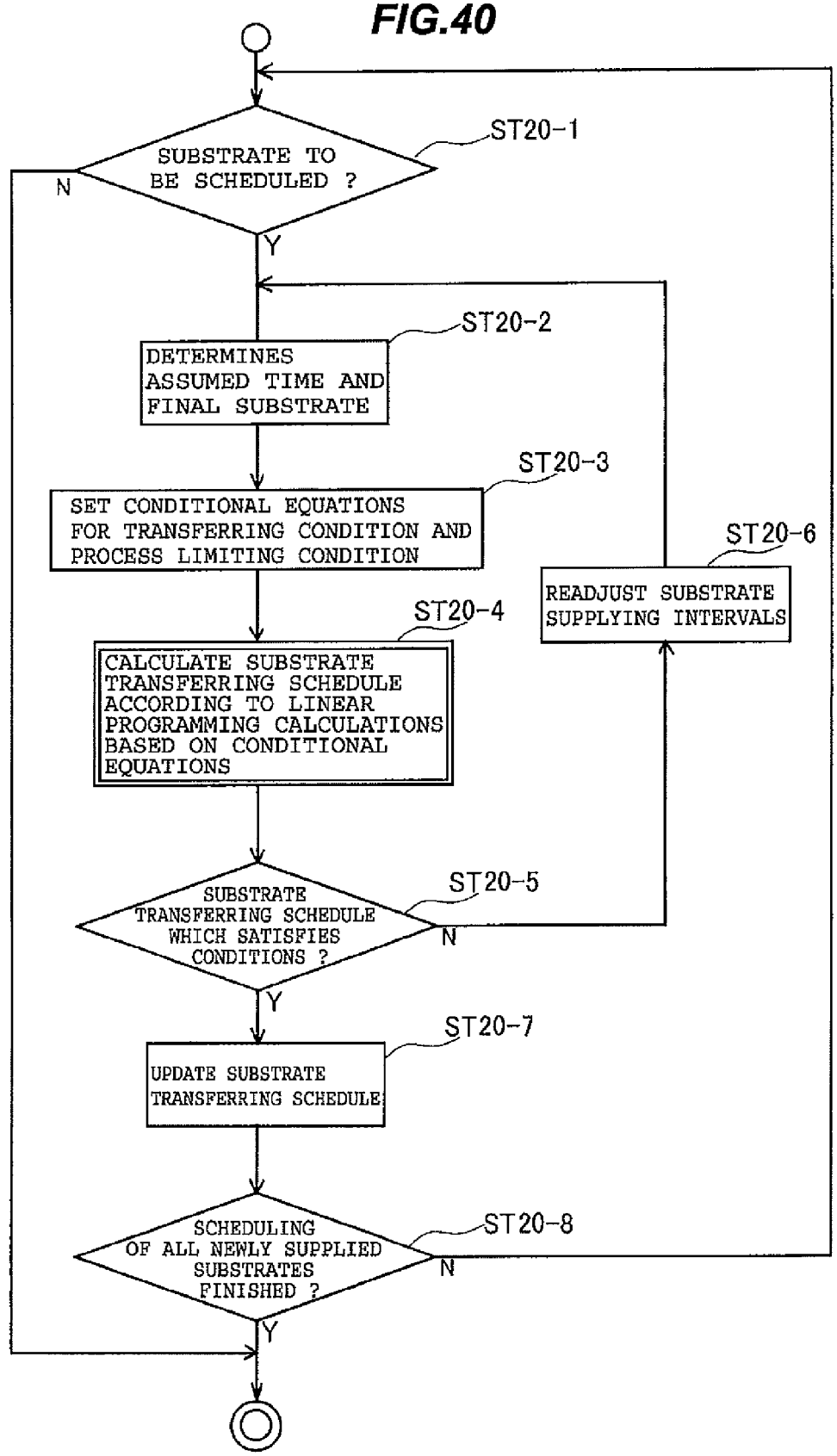
FIG. 40 is a flowchart of a processing sequence of a new substrate supplying linear programming process (step ST20 shown in FIG. 39)

FIG. 40 is a flowchart of a processing sequence of the new substrate supplying linear programming process (step ST20 shown in FIG. 39). In step ST20-1, the scheduler checks if there is a substrate to be scheduled or not. If there is a substrate to be scheduled (Y), then control goes to step ST20-2. In step ST20-2, the scheduler determines an assumed time and a final substrate. Then, control goes to step ST20-3. In step ST20-3, the scheduler sets conditional equations for a transferring condition and a process limiting condition. Then, control goes to step ST20-4. In step ST20-4, the scheduler calculates a substrate transferring schedule according to linear programming calculations based on the conditional equations. Then, control goes to step ST20-5.

In step ST20-5, the scheduler checks if there is a substrate transferring schedule which satisfies the conditions or not. If there is not a substrate transferring schedule which satisfies the conditions (N), then control goes to step ST20-6, in which the scheduler readjusts substrate supplying intervals. Then, control goes back to step ST20-2. If there is a substrate transferring schedule which satisfies the conditions (Y), then control goes to step ST20-7, in which the scheduler updates the substrate transferring schedule. Then, control goes to step ST20-8. In step ST20-8, the scheduler checks if the scheduling of all the newly supplied substrates has been finished or not. If the scheduling of all the newly supplied substrates has not been finished (N), control goes back to step ST20-1 to repeat the above processing sequence.

Figure 41:
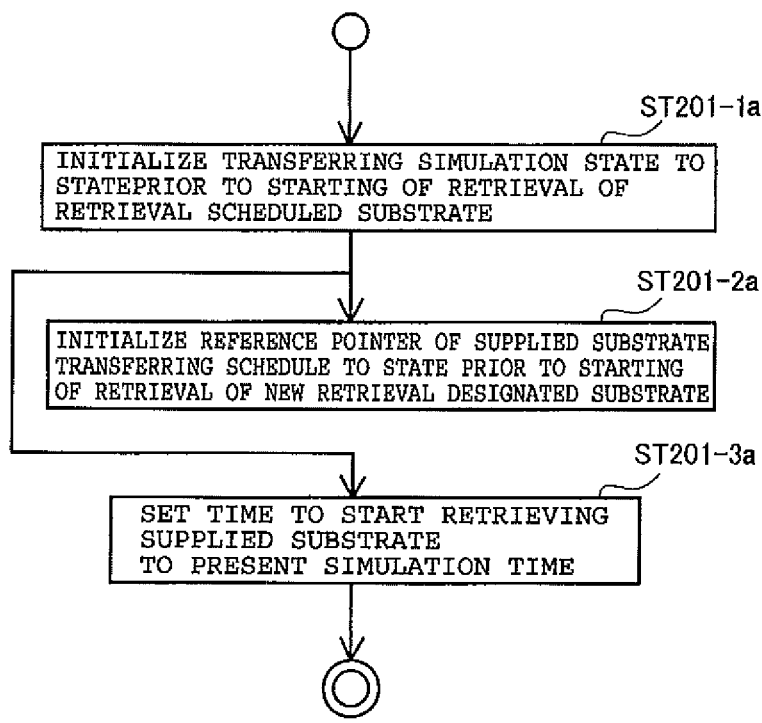
FIG. 41 is a flowchart of a processing sequence of a transferring simulation initializing process (step S201 shown in FIG. 13)

FIG. 41 is a flowchart of a processing sequence of the transferring simulation initializing process (step S201 shown in FIG. 13). In step ST201-1a, the scheduler initializes the transferring simulation state to a state prior to the starting of retrieval of a retrieval scheduled substrate. Then, control goes to step ST201-2a or step ST201-3a. The transferring simulation state includes all unit information data, transfer device information data, and data required for the transferring simulation. Specifically, the scheduler initializes the transferring simulation state by copying a data set, which has been copied to a storage area at the time when the transferring simulation for a previous retrieval scheduled substrate has started, to a transferring simulation variable area in an overwrite mode. In step ST201-2a, the scheduler initializes a reference pointer of the supplied substrate transferring schedule to a state prior to the starting of retrieval of a new retrieval designated substrate. In step ST201-3a, the scheduler sets the time to start retrieving a supplied substrate to a present simulation time. The reference pointer is used to refer successively to the existing substrate transferring schedule in order to start transferring a supplied substrate according to a sequence of the existing substrate transferring schedule.

Figure 42:
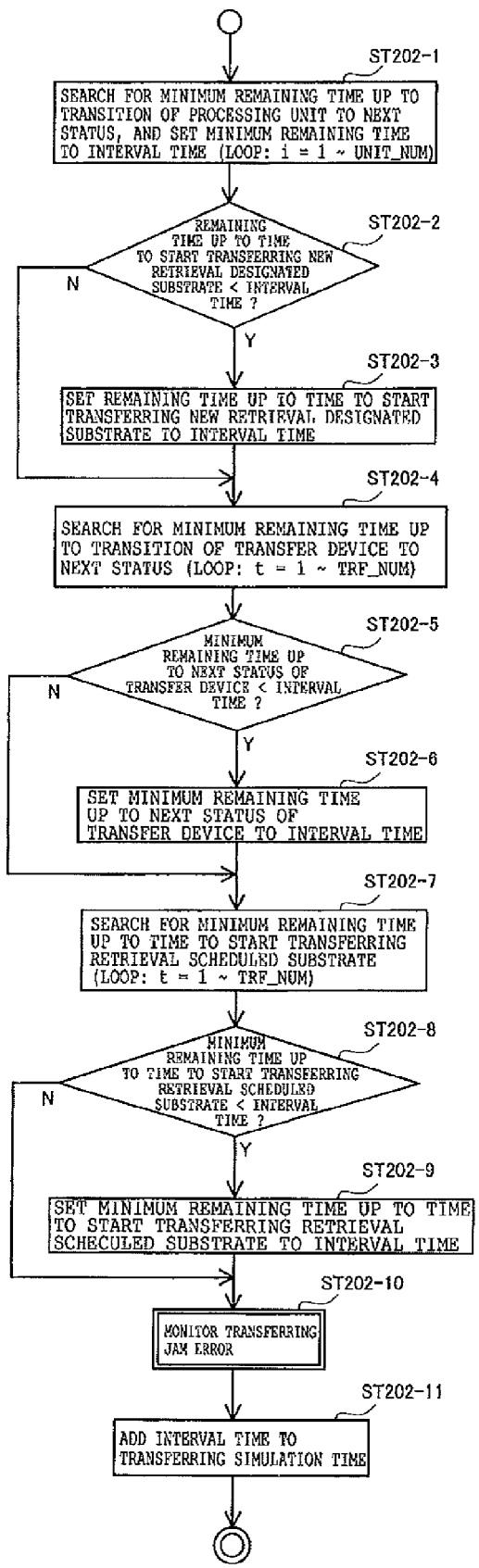
FIG. 42 is a flowchart of a processing sequence of a transferring simulation time clocking process (step ST202 shown in FIG. 13)

FIG. 42 is a flowchart of a processing sequence of the transferring simulation time clocking process (step ST202 shown in FIG. 13). In step ST202-1, the scheduler searches for a minimum remaining time up to the transition of a processing unit to a next status, and sets the minimum remaining time to an interval time. Then, control goes to step ST202-2. In step ST202-2, the scheduler determines whether the remaining time up to a time to start transferring a new retrieval designated substrate is smaller than the interval time (remaining time<interval time) or not. If the remaining time is smaller than the interval time (Y), then control goes to step ST202-3. If the remaining time is not smaller than the interval time (N), then control goes to step ST202-4. In step ST202-3, the scheduler sets the remaining time up to a time to start transferring a new retrieval designated substrate to the interval time. Then, control goes to step ST202-4. In step ST202-4, the scheduler searches for a minimum remaining time up to the transition of a transfer device to a next status. Then, control goes to step ST202-5.

In step ST202-5, the scheduler determines whether the minimum remaining time up to a next status of the transfer device is smaller than the interval time (minimum remaining time<interval time or not. If the minimum remaining time is smaller than the interval time (Y), then control goes to step ST202-6. If the minimum remaining time is not smaller than the interval time (N), then control goes to step ST202-7. In step ST202-6, the scheduler sets the minimum remaining time up to a next status of the transfer device to the interval time. Then, control goes to step ST202-7. In step ST202-7, the scheduler searches for a minimum remaining time up to a time to start transferring a retrieval scheduled substrate. Then, control goes to step ST202-8. In step ST102-8, the scheduler determines whether the minimum remaining time up to a time to start transferring a retrieval scheduled substrate is smaller than the interval time (minimum remaining time<interval time) or not. If the minimum remaining time is smaller than the interval time (Y), then control goes to step ST202-9. If the minimum remaining time is not smaller than the interval time (N), then control goes to step ST202-10.

In step ST102-9, the scheduler sets the minimum remaining time up to a time to start transferring a retrieval scheduled substrate to the interval time. In step ST202-10, the scheduler monitors a transferring jam error. Then, control goes to step ST202-11. In step ST202-11 the scheduler adds the interval time to the transferring simulation time. The scheduler monitors a transferring jam error by detecting a situation wherein the interval time becomes zero a certain number of times or more. If the scheduler detects such a situation, then the scheduler sets a retrieval delay time for a new retrieval designated substrate to a constant value as representing a transferring error.

Figure 43:
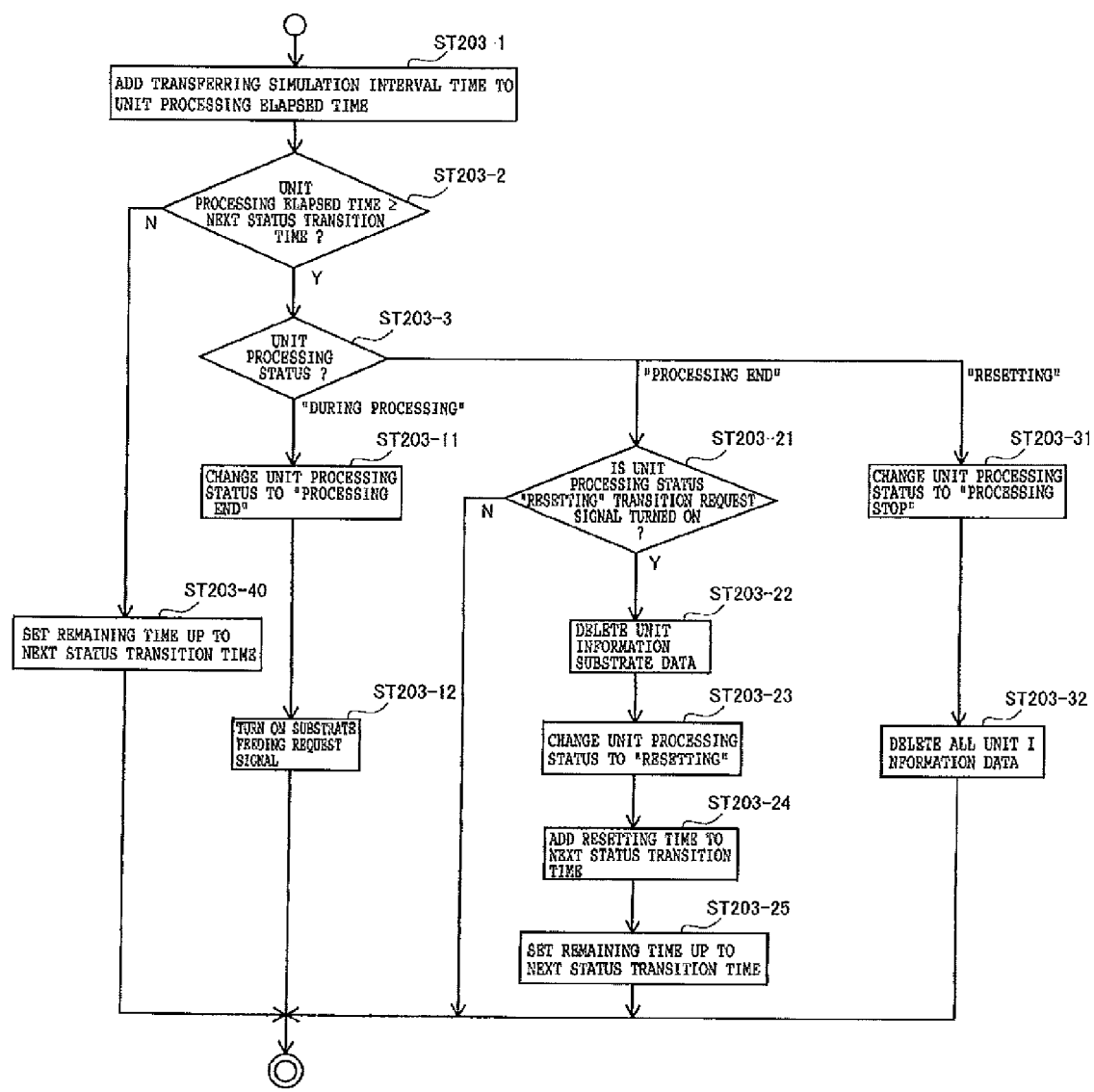
FIG. 43 is a flowchart of a processing sequence of a process unit status updating process (step ST203 shown in FIG. 13)

FIG. 43 is a flowchart of a processing sequence of the process unit status updating process (step ST203 shown in FIG. 13). In step ST203-1, the scheduler adds a transferring simulation interval time to a unit processing elapsed time. Then, control goes to step ST203-2. In step ST203-2, the scheduler determines whether the unit processing elapsed time has reached or exceeded a next status transition time (unit processing elapsed time≥next status transition time or not. If the unit processing elapsed time has reached or exceeded a next status transition time (Y), then control goes to step ST203-3. If the unit processing elapsed time has not reached or exceeded a next status transition time (N), then control goes to step ST203-40. In step ST203-3, the scheduler checks a unit processing status. If the unit processing status represents "during processing", then control goes to step ST203-11. If the unit processing status represents "processing end", then control goes to step ST203-21. If the unit processing status represents "resetting", then control goes to step ST203-31.

In step ST203-11, the scheduler changes the unit processing status to "processing end". In step ST203-12, the scheduler turns on a substrate transferring request signal. In step ST203-21, the scheduler determines whether a unit processing status "resetting" and the transition request signal is turned on or not. If a unit processing status "resetting" and the transition request signal is turned on (Y), then control goes to step ST203-22. In step ST203-22, the scheduler deletes unit information substrate data. Then, control goes to step ST203-23. In step ST203-23, the scheduler changes the unit processing status to "resetting". Then, control goes to step ST203-24. In step ST203-24, the scheduler adds a resetting time to the next status transition time. Then, control goes to step ST203-25. In step ST203-25, the scheduler sets a remaining time up to the next status transition time. In step ST203-31, the scheduler changes the unit processing status to "processing stop". Then, control goes to step ST203-32. In step ST203-32, the scheduler deletes all unit information data. In step ST203-40, the scheduler sets a remaining time up to the next status transition time.

Figure 44:
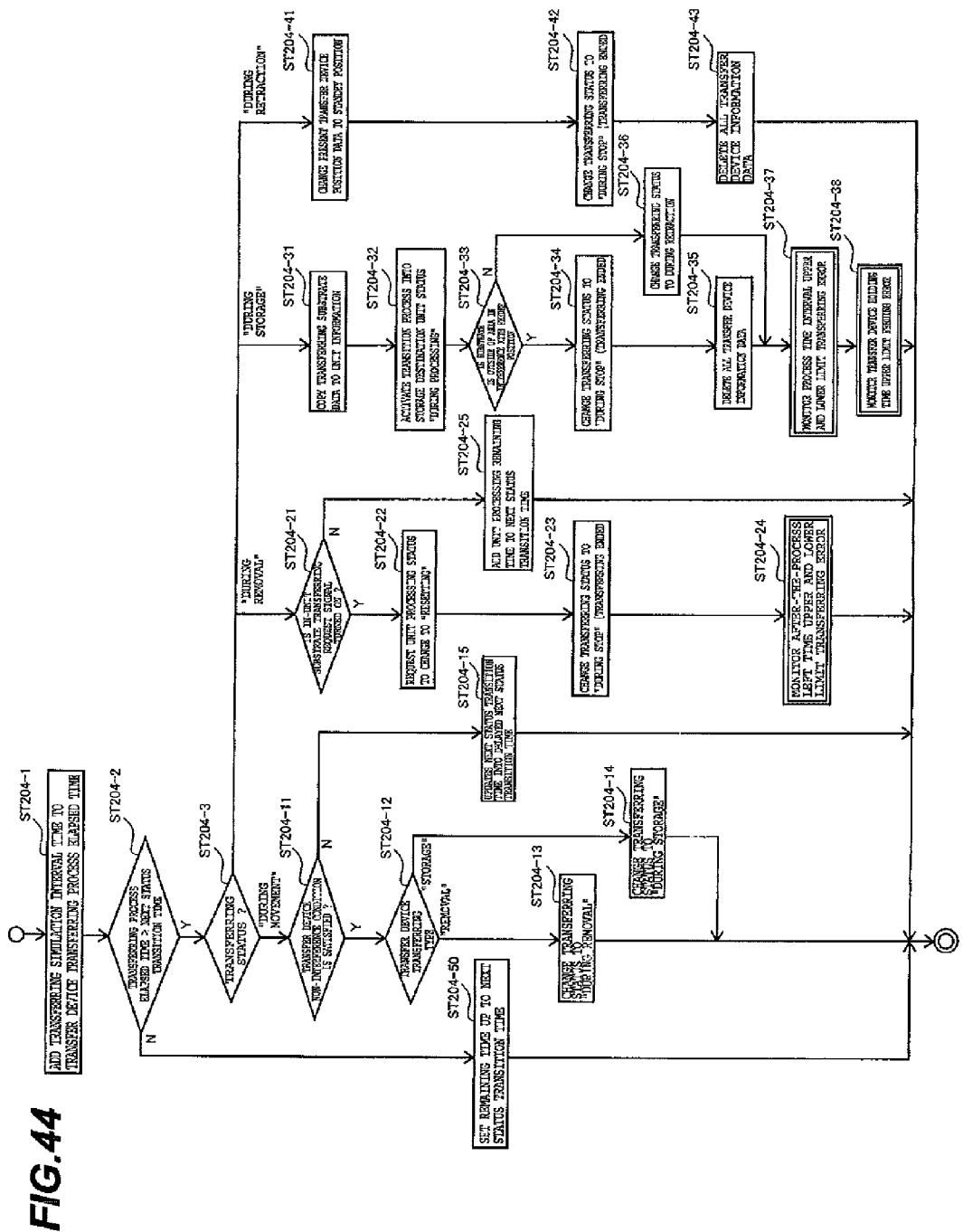
FIG. 44 is a flowchart of a processing sequence of a transfer device status updating process (step ST204 shown in FIG. 13)

FIG. 44 is a flowchart of a processing sequence of the transfer device status updating process (step ST204 shown in FIG. 13). In step ST204-1, the scheduler adds a transferring simulation interval time to a transfer device transferring process elapsed time. Then, control goes to step ST204-2, in which the scheduler determines whether the transferring process elapsed time has reached or exceeded a next status transition time (transferring process elapsed time≥next status transition time or not. If the transferring process elapsed time has reached or exceeded a next status transition time (Y), then control goes to step ST204-3. If the transferring process elapsed time has not reached or exceeded a next status transition time (N), then control goes to step ST204-50. In step ST204-3, the scheduler checks a transferring status. If the transferring status represents "during movement", "during removal", "during storage" or "during retraction", then control goes to step ST204-11, ST204-21, ST204-31 or ST204-41. In step ST204-50, the scheduler sets a remaining time up to the next status transition time.

In step ST204-11, the scheduler determines whether a transfer device non-interference condition is satisfied or not. If a transfer device non-interference condition is satisfied (Y), then control goes to step ST204-12. If a transfer device non-interference condition is not satisfied (N), then control goes to step ST204-15. In step ST204-12, the scheduler checks a transfer device transferring type. If the transfer device transferring type represents "removal", then control goes to step ST204-13, in which the scheduler changes the transferring status to "during removal". If the transfer device transferring type represents "storage", then control goes to step ST204-14, in which the scheduler changes the transferring status to "during storage". In step ST204-15, the scheduler updates the next status transition time into a delayed next status transition time. In step ST204-21, the scheduler determines whether an in-unit substrate transferring request signal is turned on or not. If an in-unit substrate transferring request signal is turned on (Y), then control goes to step ST204-22. If an in-unit substrate transferring request signal is not turned on (N), then control goes to step ST204-25. In step ST204-22, the scheduler requests the unit processing status to change to "resetting". Then, control goes to step ST204-23. In step ST204-23, the scheduler changes the transferring status to "during stop" (transferring ended). In step ST204-24, the scheduler monitors an after-the-process left time upper and lower limit transferring error. In step ST204-25, the scheduler adds a unit processing remaining time to the next status transition time.

In step ST204-31, the scheduler copies the transferring substrate data to unit information. In step ST204-32, the scheduler activates a transition process into a storage destination unit status "during processing". Then, control goes to step ST204-33. In step ST204-33, the scheduler determines whether the substrate is outside of an area in interference with the transfer device position or not. If the substrate is outside of an area in interference with the transfer device position (Y), then control goes to step ST204-34. If the substrate is not outside of an area in interference with the transfer device position (N), then control goes to step ST204-36. In step ST204-34, the scheduler changes the transferring status to "during stop" (transferring ended). In step ST204-35, the scheduler deletes all transfer device information data. Then, control goes to step ST204-37. In step ST204-36, the scheduler changes the transferring status to "during retraction". Then, control goes to step ST204-37. In step ST204-37, the scheduler monitors a process time interval upper and lower limit transferring error. In step ST204-38, the scheduler monitors a transfer device holding time upper limit transferring error. In step ST204-41, the scheduler changes present transfer device position data to a standby position. Then, control goes to step ST204-42. In step ST204-42, the scheduler changes the transferring status to "during stop" (transferring ended). Then, control goes to step ST204-43. In step ST204-43, the scheduler deletes all transfer device information data.

Figure 45:
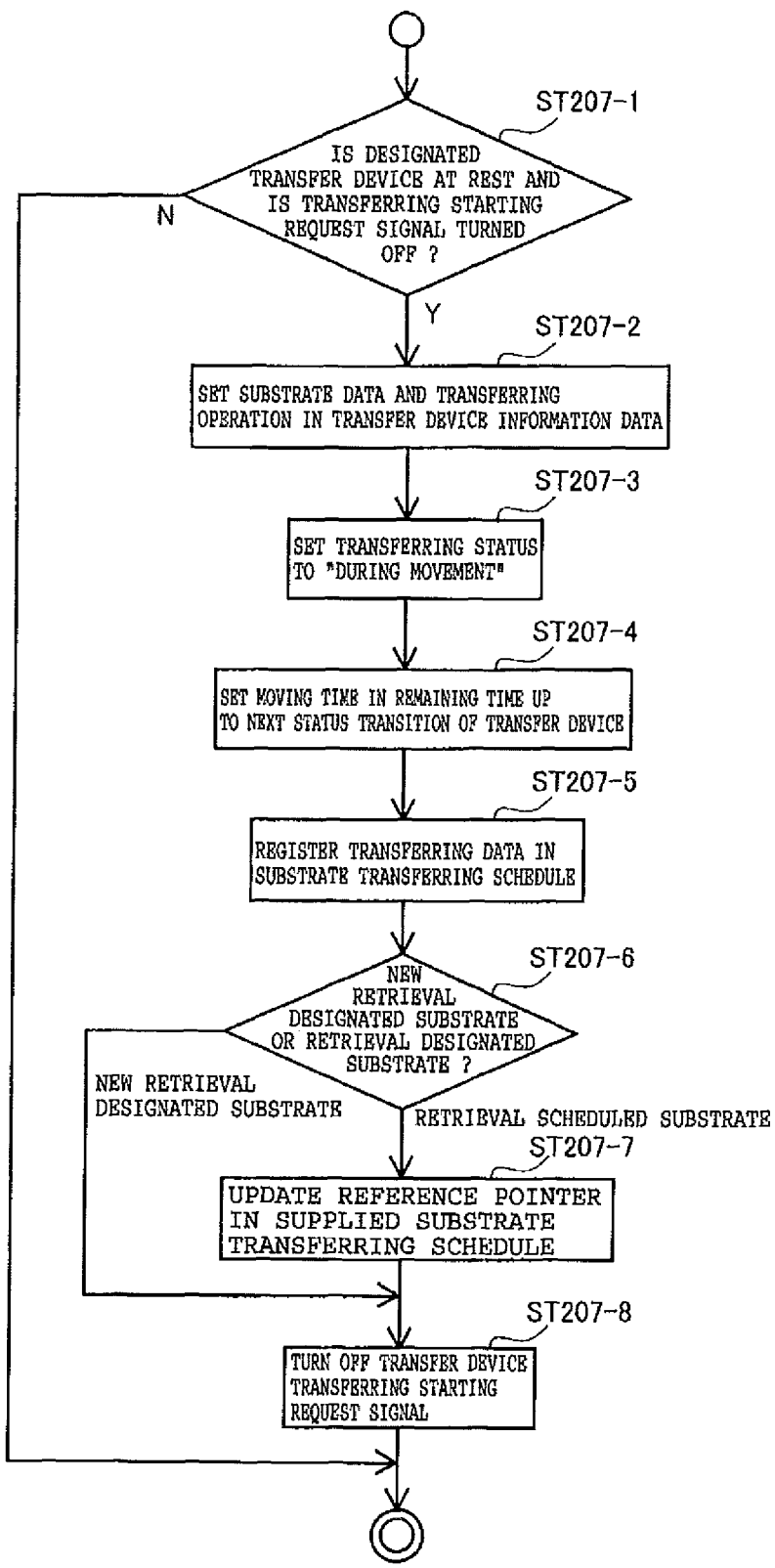
FIG. 45 is a flowchart of a processing sequence of a new retrieval designated substrate or retrieval scheduled substrate transferring starting process (step S207 shown in FIG. 13)

FIG. 45 is a flowchart of a processing sequence of the new retrieval designated substrate or retrieval scheduled substrate transferring starting determining process (step S207 shown in FIG. 13). In step ST207-1, the scheduler determines whether the designated transfer device is at rest and a transferring starting request signal is turned off or not. If the designated transfer device is at rest and a transferring starting request signal is turned off (Y), then control goes to step ST207-2. In step ST207-2, the scheduler sets substrate transferring data and transferring operation in transfer device information data. Then, control goes to step ST207-3. In step ST207-3, the scheduler sets a transferring status to "during movement". The transferring status is included as a property in the transfer device information data. In step ST207-4, the scheduler sets a moving time in a remaining time up to a next status transition of the transfer device. In step S207-5, the scheduler registers the transferring data in the substrate transferring schedule. Then, control goes to step ST207-6. In step ST207-6, the scheduler determines whether the substrate is a new retrieval designated substrate or a retrieval scheduled substrate. If the substrate is a retrieval scheduled substrate, then control goes to step ST207-7, in which the scheduler updates a reference pointer in the supplied substrate transferring schedule. If the substrate is a new retrieval designated substrate, then control goes to step ST207-8, in which the scheduler turns off a transfer device transferring starting request signal.

Figure 46:
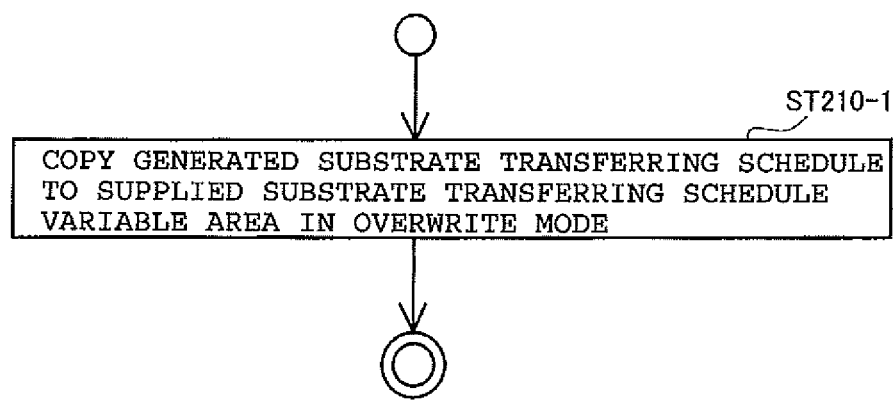
FIG. 46 is a flowchart of a processing sequence of a transferring simulation ending process (step ST210 shown in FIG. 13.

FIG. 46 is a flowchart of a processing sequence of the transferring simulation ending process (step ST210 shown in FIG. 13. In step ST210-1, the scheduler copies a generated substrate transferring schedule to a supplied substrate transferring schedule variable area in an overwrite mode.

Although certain preferred embodiments of the present invention have been shown and described in detail, it should be understood that various changes and modifications may be made therein without departing from the scope of the appended claims, the detailed description, and the drawings. In the illustrated embodiments, the principles of the present invention are applied to the plating apparatus in which metal films such as bump electrodes, etc. are deposited on semiconductor substrates in the plating tanks 22. However, the principles of the present invention are also applicable to other substrate processing apparatus which require more strict management of substrate transferring schedules. For example, electroplating apparatus are capable of stopping a plating process by switching off a power supply which supplies a plating current and hence do not require substrate transferring scheduling under as strict limiting conditions as electroless plating apparatus. However, it is preferable to apply the principles of the present invention to electroless plating apparatus as they allow a plating process to progress necessarily on its own and hence require more strict management of substrate transferring schedules.

What is claimed is:

1. A scheduler for use in a substrate processing apparatus including a plurality of substrate processing sections for processing substrates, a transfer section for transferring the substrates, and a controller for controlling the substrate processing sections to process the substrates and controlling the transfer section to transfer the substrates, the scheduler being adapted to be incorporated in the controller for calculating a substrate transferring schedule, the scheduler comprising:
   a function to successively calculate substrate transferring schedules for substrates which are newly supplied to the substrate processing apparatus;
   a function, in an event of a fault occurring in the substrate processing apparatus and a state of the fault being taken as an initial state, to calculate the substrate transferring schedules which remove a substrate from one of the substrate processing sections which suffers the fault, and transfers the removed substrate to another one of the processing sections which is normal to continuously process the removed substrate, or retrieve the removed substrate and place it into a substrate cassette after the removed substrate is washed with water and dried; and
   a function to recalculate the substrate transferring schedules which makes the one of the substrate processing sections which suffers the fault unusable and supply new substrates to the substrate processing apparatus.

2. A scheduler according to claim 1, wherein in the event of the fault, the substrate transferring schedules are calculated by a transferring simulation process.

3. A scheduler according to claim 2, wherein the transferring simulation process generates a substrate transferring schedules to achieve a target throughput by using setting values optimized when the substrate processing apparatus has been designed, with respect to parameters representing priority of the substrate transferring schedules of the newly supplied substrates over supplied substrates which are transferred according to substrate transferring schedules generated by a previous transferring scheduling sequence, and also representing allowable delay times for delays caused in the transferring of supplied substrates by interrupts caused by the newly supplied substrates.

4. A scheduler according to claim 1, wherein the substrate transferring schedules are calculated to carry out a process under conditions set respectively for the substrates to achieve at least a target processing throughput while satisfying a prescribed process limiting condition when the substrates are applied to the substrate processing apparatus.

5. A scheduler according to claim 1, wherein the substrate transferring schedules are scheduled to satisfy a process limiting condition with respect to all processes on the substrates newly supplied to the substrate processing apparatus, processes downstream of one of the substrate processing sections which start retrieving the substrate to be retrieved, and all processes on substrates whose substrate transferring schedules have been generated by a previous or earlier substrate supplying scheduling sequence.

6. A scheduler according to claim 1, wherein a substrate transferring schedule for supplying a new substrate is generated by the linear programming process, and a substrate transferring schedule for retrieving a substrate to be retrieved is generated by the transferring simulation process when malfunctions of substrate processing apparatus or continuing a process on a substrate.

7. A scheduler according to claim 6, wherein the malfunctions of substrate processing apparatus include a production resumption after the substrate processing apparatus has shut down, a dynamic switching process of unit use and nonuse, or process failure occurrence.

8. A scheduler according to claim 6, wherein a substrate is transferred by a substrate transferring schedule generated by the transferring simulation process after the substrate processing apparatus suffers a malfunction, and thereafter when the substrate processing apparatus recovers a normal state from the malfunction, a substrate is transferred again by a substrate transferring schedule generated by the linear programming process.

9. A scheduler according to claim 6, wherein when a transferring simulation process switches from a linear programming process or a linear programming process switches from a transferring simulation process, a substrate transferring schedule which has been scheduled and substrate process condition data at the time of switching are transferred to a scheduler in which the transferring simulation process or the linear programming process has switched.

10. A substrate processing apparatus comprising:
a plurality of substrate processing sections for processing substrates;
a transfer section for transferring the substrates;
a controller for controlling the substrate processing sections to process the substrates and controlling the transfer section to transfer the substrates; and
a scheduler according to claim 1, the scheduler being incorporated in the controller.

11. A substrate transferring method for a substrate processing apparatus including a plurality of substrate processing sections for processing substrates, a transfer section for transferring the substrates, and a controller for controlling the substrate processing sections to process the substrates and controlling the transfer section to transfer the substrates, the method comprising:
successively calculating substrate transferring schedules for substrates which are newly supplied to the substrate processing apparatus;
in an event of a fault occurring in the substrate processing apparatus, the state of the fault being taken as an initial state, calculating the substrate transferring schedules which remove a substrate from one of the substrate processing sections which suffers the fault, and transfer the removed substrate to another one of the processing sections which is normal to continuously process the removed substrate, or retrieve the removed substrate and place into a substrate cassette after the removed substrate is washed with water and dried; and
recalculating the substrate transferring schedules which makes the one of the substrate processing sections which suffers the fault unusable and supplies new substrates to the substrate processing apparatus.

12. A substrate transferring method according to claim 11, wherein the substrate transferring schedules are calculated by a transferring simulation process which has switched from a linear programming process or a linear programming process which has switched from a transferring simulation process.

13. A substrate transferring method according to claim 11, wherein a substrate transferring schedule for supplying a new substrate is generated by the linear programming process and a substrate is transferred by the generated substrate transferring schedule, and wherein when a malfunction of the substrate processing apparatus is detected, the generated substrate transferring schedule switches to a substrate transferring schedule generated by the transferring simulation process, and a substrate transferring schedule for retrieving a substrate to be retrieved or continuing a process on a substrate and transferring a supplied substrate is generated, and a substrate is transferred by the generated substrate transferring schedule.

14. A substrate transferring method according to claim 11, wherein after a malfunction of the substrate processing apparatus is detected, a substrate is transferred by a substrate transferring schedule generated by the transferring simulation process, and when the substrate processing apparatus recovers a normal state from the malfunction, a substrate is transferred again by a substrate transferring schedule generated by the linear programming process.

* * * * *